United States Patent
Kanzaki et al.

(10) Patent No.: US 11,459,504 B2
(45) Date of Patent: Oct. 4, 2022

(54) COLOR CONVERSION COMPOSITION AND COLOR CONVERSION FILM, AND LIGHT SOURCE UNIT, DISPLAY, AND LIGHTING INCLUDING SAME

(71) Applicant: Toray Industries, Inc., Tokyo (JP)

(72) Inventors: Tatsuya Kanzaki, Otsu (JP); Kana Kawahara, Otsu (JP)

(73) Assignee: TORAY INDUSTRIES, INC., Tokyo (JP)

( * ) Notice: Subject to any disclaimer, the term of this patent is extended or adjusted under 35 U.S.C. 154(b) by 452 days.

(21) Appl. No.: 16/630,210

(22) PCT Filed: Jul. 10, 2018

(86) PCT No.: PCT/JP2018/026035
§ 371 (c)(1),
(2) Date: Jan. 10, 2020

(87) PCT Pub. No.: WO2019/021813
PCT Pub. Date: Jan. 31, 2019

(65) Prior Publication Data
US 2020/0165515 A1    May 28, 2020

(30) Foreign Application Priority Data
Jul. 28, 2017   (JP) .............................. JP2017-146289

(51) Int. Cl.
*C09K 11/06*  (2006.01)
*G02F 1/13357*  (2006.01)
(Continued)

(52) U.S. Cl.
CPC .......... *C09K 11/06* (2013.01); *B29D 11/0073* (2013.01); *G02F 1/133621* (2013.01);
(Continued)

(58) Field of Classification Search
CPC ............ C09K 11/06; C09K 2211/1022; G02F 1/133621; H01L 33/50; H01L 33/501; H01L 33/502
(Continued)

(56) References Cited

U.S. PATENT DOCUMENTS 5,446,157 A    8/1995  Morgan et al.
9,356,250 B2 *  5/2016  Ohsawa ............... H01L 51/5016
(Continued)

FOREIGN PATENT DOCUMENTS

JP    08509471 A    10/1996
JP    2000208262 A    7/2000
(Continued)

OTHER PUBLICATIONS

Burghart et al., "3,5-Diaryl-4,4-difluoro-4-bora-3a,4a-diaza-s-indacene (BODIPY) Dyes: Synthesis, Spectroscopic, Electrochemical, and Structural Properties", J. Org. Chem., 1999, vol. 64, pp. 7813-7819.
(Continued)

Primary Examiner — Christopher M Raabe
(74) Attorney, Agent, or Firm — RatnerPrestia

(57) ABSTRACT

The present invention provides a color conversion composition which contains the following components (A) and (B):
Component (A): at least one light-emitting material
Component (B): a resin having a partial structure represented by general formula (1) and a partial structure represented by general formula (2) in a molecular structure.

[Formula 1]

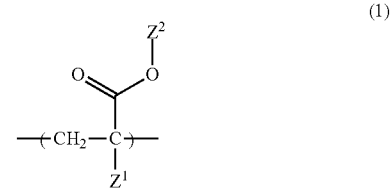

(1)

where $Z^1$ and $Z^2$ may be the same or different, and are hydrogen atom, or an organic group having 1 to 20 carbon atoms.

(Continued)

[Formula 2]

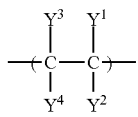

(2)

where $Y^1$ to $Y^4$ may be the same or different, and are hydrogen atom, or an organic group having 1 to 20 carbon atoms, and at least one of $Y^1$ to $Y^4$ is a group including an alicyclic hydrocarbon structure.

19 Claims, 1 Drawing Sheet

(51) Int. Cl.
  *H01L 51/50* (2006.01)
  *B29D 11/00* (2006.01)
  *H01L 33/50* (2010.01)
(52) U.S. Cl.
  CPC .............. *H01L 33/50* (2013.01); *H01L 51/50* (2013.01); *C09K 2211/1022* (2013.01); *G02F 2202/022* (2013.01)
(58) Field of Classification Search
  USPC .................................................... 252/301.16
  See application file for complete search history.

(56) References Cited

U.S. PATENT DOCUMENTS 11,158,832 B2 * 10/2021 Ishisone .............. H01L 51/5044

| | | | |
|---|---|---|---|
| 2017/0123120 | A1 | 5/2017 | Shirouchi et al. |
| 2017/0137540 | A1 | 5/2017 | Shin et al. |

FOREIGN PATENT DOCUMENTS

| | | | |
|---|---|---|---|
| JP | 2001164245 | A | 6/2001 |
| JP | 2002317175 | A | 10/2002 |
| JP | 2002348568 | A | 12/2002 |
| JP | 2007273440 | A | 10/2007 |
| JP | 2008224982 | A | 9/2008 |
| JP | 2011149028 | A | 8/2011 |
| JP | 2011241160 | A | 12/2011 |
| JP | 2012022028 | A | 2/2012 |
| JP | 2013087243 | A | 5/2013 |
| JP | 2014136771 | A | 7/2014 |
| JP | 2016130848 | A | 7/2016 |
| KR | 20160087315 | A | 7/2016 |
| WO | 2015147312 | A1 | 10/2015 |
| WO | 2016021883 | A1 | 2/2016 |
| WO | 2017018392 | A1 | 2/2017 |

OTHER PUBLICATIONS

International Search Report and Written Opinion for International Application PCT/JP2018/026035, dated Oct. 16, 2018, 9 pages.
Kollmannsberger et al., "Electrogenerated Chemiluminescence and Proton-Dependent Switching of Fluorescence: Functionalized Difluoroboradiaza-s-indacenes", Angew Chem. Int. Ed. Engl., 1997, vol. 36, No. 12, pp. 1333-1335.
Korean Notification of Reason for Refusal for Korean Application No. 10-2020-7001092, dated Aug. 24, 2021, with translation, 9 pages.

* cited by examiner

[Fig. 1]
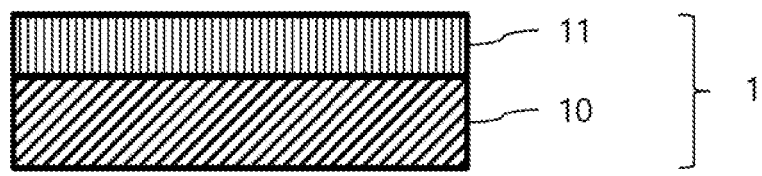
[Fig. 2]
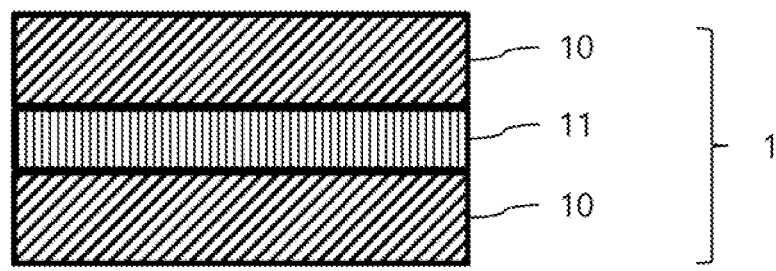
[Fig. 3]
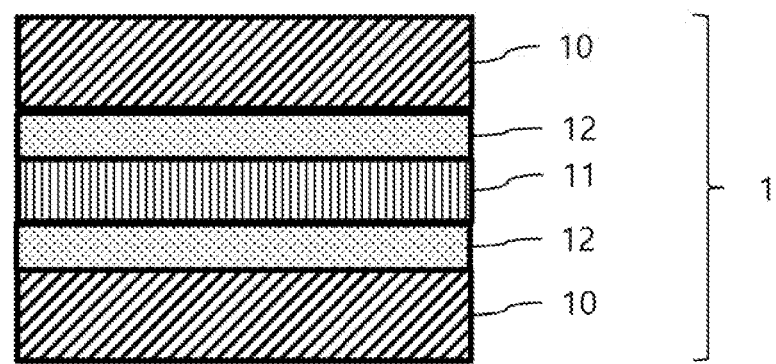

COLOR CONVERSION COMPOSITION AND COLOR CONVERSION FILM, AND LIGHT SOURCE UNIT, DISPLAY, AND LIGHTING INCLUDING SAME

CROSS REFERENCE TO RELATED APPLICATIONS

This is the U.S. National Phase application of PCT/JP2018/026035, filed Jul. 10, 2018, which claims priority to Japanese Patent Application No. 2017-146289, filed Jul. 28, 2017, the disclosures of these applications being incorporated herein by reference in their entireties for all purposes.

FIELD OF THE INVENTION

The present invention relates to a color conversion composition and a color conversion film, and a light source unit, a display and a lighting which include the composition and the film.

BACKGROUND OF THE INVENTION

There are more and more studies about application of multi-coloring technique based on color conversion method to liquid crystal displays, organic EL displays, lightings, and the like. The color conversion refers to converting a light emitted from an illuminant into a light having a longer wavelength, e.g. converting a blue light into a green or red light.

A composition having this color converting function is formed into a film, which is combined with e.g. a blue light source, so that three primary colors, blue, green, and red, i.e. a white light can be obtained from the blue light source. The white light source obtained by combining such a blue light source with the film having the color converting function is used as a backlight unit, and a liquid crystal driving portion and a color filter are combined to produce a full color display. Furthermore, without the liquid crystal driving portion, the white light source can be used as a white light source as it is, and can be applied as a white light source e.g. for an LED lighting or the like.

Problems of the liquid crystal display using the color conversion method includes an improvement of color reproducibility. For improving color reproducibility, it is effective to narrow a half-value width of each emission spectrum of blue, green and red of the backlight unit to increase a color purity of each color, blue, green and red. As a means for solving this problem, a technique using quantum dots based on inorganic semiconductor fine particles as a component of a color conversion composition has been proposed (e.g. see Patent Document 1). Although the technique using quantum dots undeniably narrows the half-value width of each emission spectrum of green and red and improves the color reproducibility, on the other hand, quantum dots are weak to heat, moisture and oxygen in air, and insufficient in durability. Also, there are problems such as inclusion of cadmium.

Techniques using an organic light-emitting material as a component of a color conversion composition instead of quantum dots have also been proposed. As examples of techniques using the organic light-emitting material as the component of the color conversion composition, a technique using a pyridine-phthalimide condensate (e.g. see Patent Document 2), a technique using a coumarin derivative (e.g. see Patent Document 3), a technique using a perylene derivative as a red light-emitting material all the time (e.g. see Patent Document 4), a technique using a rhodamine derivative (e.g. see Patent Document 5), and a technique using a pyromethene derivative (e.g. Patent Documents 6 and 7) have been disclosed.

Also, a technique of adding a light stabilizer for preventing deterioration of an organic light-emitting material and improving durability has been disclosed (e.g. see Patent Document 8).

PATENT DOCUMENTS

Patent Document 1: Japanese Patent Laid-open Publication No. 2012-22028
Patent Document 2: Japanese Patent Laid-open Publication No. 2002-348568
Patent Document 3: Japanese Patent Laid-open Publication No. 2007-273440
Patent Document 4: Japanese Patent Laid-open Publication No. 2002-317175
Patent Document 5: Japanese Patent Laid-open Publication No. 2001-164245
Patent Document 6: Japanese Patent Laid-open Publication No. 2011-241160
Patent Document 7: Japanese Patent Laid-open Publication No. 2014-136771
Patent Document 8: Japanese Patent Laid-open Publication No. 2011-149028

SUMMARY OF THE INVENTION

However, although the stabilizer described in Patent Document 8 had an effect of improving durability, the effect was insufficient. Furthermore, there was a problem that these stabilizers had a relatively strong absorbability in a visible range, and therefore absorbed the light emitted from the light-emitting material, and a light-emitting efficiency decreased. As described above, a technique using an organic light-emitting material capable of achieving both a high color purity and a high durability as a component of a color conversion composition was still insufficient.

The problem to be solved by the present invention is how to achieve both improvement of color reproducibility and durability, particularly to achieve both high color purity light emission and durability, in a color conversion composition used for a liquid crystal display or a LED lighting.

That means, the present invention is a color conversion composition for converting an incident light into a light having a wavelength longer than of the incident light, which characteristically contains the following components (A) and (B).

Component (A): at least one light-emitting material
Component (B): a resin having a partial structure represented by general formula (1) and a partial structure represented by general formula (2) in a molecular structure.

[Formula 1]

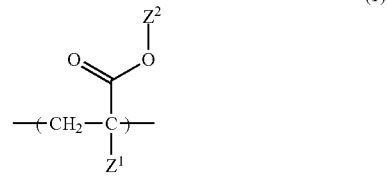

where $Z^1$ and $Z^2$ may be the same or different, and are hydrogen atom, or an organic group having 1 to 20 carbon atoms.

[Formula 2]

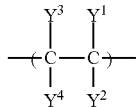
(2)

where $Y^1$ to $Y^4$ may be the same or different, and are hydrogen atom, or an organic group having 1 to 20 carbon atoms, and at least one of $Y^1$ to $Y^4$ is a group including an alicyclic hydrocarbon structure.)

The color conversion composition according to the present invention and the color conversion film using the color conversion composition achieve both high color purity and durability, and therefore can achieve both color reproducibility and durability.

BRIEF DESCRIPTION OF THE DRAWINGS

FIG. 1 shows a schematic sectional drawing illustrating an example of a color conversion film according to the present invention.

FIG. 2 shows a schematic sectional drawing illustrating an example of the color conversion film according to the present invention.

FIG. 3 shows a schematic sectional drawing illustrating an example of the color conversion film according to the present invention.

DETAILED DESCRIPTION OF EMBODIMENTS OF THE INVENTION

Hereinafter, embodiments of the present invention will be specifically explained. However, the present invention is not limited to the following embodiments, and various modifications can be made depending on purposes and applications.

<(A) Light-Emitting Material>

The color conversion composition according to the present invention contains at least one light-emitting material. Herein, the light-emitting material according to the present invention refers to a material which, when irradiated with a certain light, emits a light having a wavelength different from that of the certain light.

For achieving high-efficiency color conversion, a material exhibiting a luminescent property with a high quantum yield is preferable. Examples of the material include known light-emitting materials such as an inorganic fluorophore, a fluorescent pigment, a fluorescent dye, and quantum dots, and above all, an organic light-emitting material is preferable.

Preferable examples of the organic light-emitting material include, but are not limited to:

a compound or its derivative having a condensed aryl ring, such as naphthalene, anthracene, phenanthrene, pyrene, chrysene, naphthacene, triphenylene, perylene, fluoranthene, fluorene, and indene;

a compound or its derivative having a heteroaryl ring, such as furan, pyrrole, thiophene, silole, 9-silafluorene, 9,9'-spirobisilafluorene, benzothiophene, benzofuran, indole, dibenzothiophene, dibenzofuran, imidazopyridine, phenanthroline, pyridine, pyrazine, naphthyridine, quinoxaline, and pyrrolopyridine;

boran derivative;

a stilbene derivative such as 1,4-distyrylbenzene, 4,4'-bis(2-(4-diphenylaminophenyl)ethenyl)biphenyl, and 4,4'-bis(N-(stilbene-4-yl)-N-phenylamino)stilbene;

an aromatic acetylene derivative, a tetraphenylbutadiene derivative, an aldazine derivative, a pyromethene derivative, and a diketopyrrolo[3,4-c]pyrrole derivative;

a coumarin derivative such as coumarin 6, coumarin 7, and coumarin 153;

an azole derivative and its metal complex, such as imidazole, thiazole, thiadiazole, carbazole, oxazole, oxadiazole, and triazole;

a cyanine-based compound such as indocyanine green;

a xanthene-based compound such as fluorescein, eosin, and rhodamine, and a thioxanthene-based compound;

a polyphenylene-based compound, a naphthalimide derivative, a phthalocyanine derivative and its metal complex, a porphyrin derivative and its metal complex;

an oxazine-based compound such as Nile red and Nile blue;

a helicene-based compound;

an aromatic amine derivative such as N,N'-diphenyl-N,N'-di(3-methylphenyl)-4,4'-diphenyl-1,1'-diamine; and an organometallic complex compound such as iridium (Ir), ruthenium (Ru), rhodium (Rh), palladium (Pd), platinum (Pt), osmium (Os), and rhenium (Re); and the like.

The organic light-emitting material may be a fluorescent light-emitting material or a phosphorescent light-emitting material, but the fluorescent light-emitting material is preferable for achieving a high color purity.

Above all, a compound or its derivative having a condensed aryl ring can be suitably used from the viewpoint of high thermal stability and light stability.

Furthermore, a compound having a coordinate bond is preferable from the viewpoint of solubility and diversity of molecular structures. Also, a compound containing boron, such as a boron fluoride complex is preferable from the viewpoint of a small half-value width and capability of a high-efficiency light emission.

Above all, the pyromethene derivative can be suitably used from the viewpoint of a high fluorescent quantum yield and good durability. A compound represented by general formula (3) is more preferable.

[Formula 3]

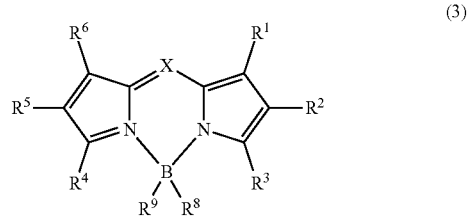
(3)

X is C—$R^7$ or N. $R^1$ to $R^9$ may be the same or different, and are selected from hydrogen, an alkyl group, a cycloalkyl group, a heterocyclic group, an alkenyl group, a cycloalkenyl group, an alkynyl group, a hydroxyl group, a thiol group, an alkoxy group, an alkylthio group, an aryl ether group, an aryl thioether group, an aryl group, a heteroaryl group, a halogen, a cyano group, an aldehyde group, a carbonyl group, a carboxyl group, an oxycarbonyl group, a carbamoyl group, an amino group, a nitro group, a silyl group, a siloxanyl group, a boryl group, a phosphine oxide group, and a condensed ring and an aliphatic ring formed between an adjacent substituents.

In all the groups described above, hydrogen may be deuterium. The same applies to compounds or their partial structures described below.

Also, in the following description, for example, a substituted or unsubstituted aryl group having 6 to 40 carbon atoms includes another substituent having a defined number of carbon atoms in which the number of carbon atoms including carbon atoms contained in a substituent substituted with an aryl group is 6 to 40.

Furthermore, in the case of substitution, for all the groups described above, the substituent is preferably an alkyl group, a cycloalkyl group, a heterocyclic group, an alkenyl group, a cycloalkenyl group, an alkynyl group, a hydroxyl group, a thiol group, an alkoxy group, an alkylthio group, an aryl ether group, an aryl thioether group, an aryl group, a heteroaryl group, a halogen, a cyano group, an aldehyde group, a carbonyl group, a carboxyl group, an oxycarbonyl group, a carbamoyl group, an amino group, a nitro group, a silyl group, a siloxanyl group, a boryl group, a phosphine oxide group, more preferably concrete substituents which will be described as preferable in the following explanation for each substituent. In addition, these substituents may be further substituted with the aforementioned substituents.

The term "unsubstituted" in the case of "substituted or unsubstituted" means that a hydrogen atom or a deuterium atom is substituted.

The same applies to the term "unsubstituted" in the case of "substituted or unsubstituted" in a compound or its partial structure described below.

The alkyl group refers to e.g. a saturated aliphatic hydrocarbon group such as a methyl group, an ethyl group, an n-propyl group, an isopropyl group, an n-butyl group, a sec-butyl group, and a tert-butyl group, which may or may not have a substituent. In the substituted case, additional substituents are not particularly limited, examples of the additional substituents may include an alkyl group, a halogen, an aryl group, a heteroaryl group, and the like, and the same applies to the following description. The number of carbon atoms in the alkyl group is not particularly limited, but is preferably in a range of 1 to 20, more preferably 1 to 8 from the view point of availability and cost.

The cycloalkyl group refers to e.g. a saturated alicyclic hydrocarbon group such as a cyclopropyl group, a cyclohexyl group, a norbornyl group, and an adamantyl group, which may or may not have a substituent. The number of carbon atoms in the alkyl group moiety is not particularly limited, but is preferably in a range of 3 to 20.

The heterocyclic group refers to e.g. an aliphatic ring having atoms other than carbon in its own ring, such as a pyran ring, a piperidine ring, and a cyclic amide, which may or may not have a substituent. The number of carbon atoms in the heterocyclic group is not particularly limited, but is preferably in a range of 2 to 20.

The alkenyl group refers to e.g. an unsaturated aliphatic hydrocarbon group having a double bond, such as a vinyl group, an allyl group, and a butadienyl group, which may or may not have a substituent. The number of carbon atoms in the alkenyl group moiety is not particularly limited, but is preferably in a range of 2 to 20.

The cycloalkenyl group refers to e.g. an unsaturated alicyclic hydrocarbon group having a double bond, such as a cyclopentenyl group, a cyclopentadienyl group, and a cyclohexenyl group, which may or may not have a substituent.

The alkynyl group refers to an unsaturated aliphatic hydrocarbon group having a triple bond, such as an ethynyl group, which may or may not have a substituent. The number of carbon atoms in the alkynyl group is not particularly limited, but is preferably in a range of 2 to 20.

The alkoxy group refers to e.g. a functional group to which an aliphatic hydrocarbon group is bonded via an ether bond, such as a methoxy group, an ethoxy group, and a propoxy group, and this aliphatic hydrocarbon group may or may not have a substituent. The number of carbon atoms in the alkoxy group is not particularly limited, but is preferably in a range of 1 to 20.

The alkylthio group refers to a group in which an oxygen atom of an ether bond in an alkoxy group is substituted with a sulfur atom. The hydrocarbon group in the alkylthio group may or may not have a substituent. The number of carbon atoms in the alkylthio group is not particularly limited, but is preferably in a range of 1 to 20.

An aryl ether group refers to e.g. a functional group to which an aromatic hydrocarbon group is bonded via an ether bond, such as a phenoxy group, and the aromatic hydrocarbon group may or may not have a substituent. The number of carbon atoms in the aryl ether group is not particularly limited, but is preferably in a range of 6 to 40.

The aryl thioether group refers to a group in which an oxygen atom of an ether bond in an aryl ether group is substituted with a sulfur atom. The aromatic hydrocarbon group in the aryl ether group may or may not have a substituent. The number of carbon atoms in the aryl ether group is not particularly limited, but is preferably in a range of 6 to 40.

The aryl group refers to e.g. an aromatic hydrocarbon group such as a phenyl group, a biphenyl group, a terphenyl group, a naphthyl group, a fluorenyl group, a benzofluorenyl group, a dibenzofluorenyl group, a phenanthryl group, an anthracenyl group, a benzophenanthryl group, a benzoanthracenyl group, a chrycenyl group, a pyrenyl group, a fluoranthenyl group, a triphenylenyl group, a benzofluoranthenyl group, a dibenzoanthracenyl group, a perylenyl group, and a helicenyl group.

Above all, the phenyl group, the biphenyl group, the terphenyl group, the naphthyl group, the fluorenyl group, the phenanthryl group, the anthracenyl group, the pyrenyl group, the fluoranthenyl group, and the triphenylenyl group are preferable. The aryl group may or may not have a substituent. The number of carbon atoms in the aryl group is not particularly limited, but is preferably in a range of 6 to 40, more preferably 6 to 30.

When $R^1$ to $R^9$ are a substituted or unsubstituted aryl group, the aryl group is preferably the phenyl group, the biphenyl group, the terphenyl group, the naphthyl group, the fluorenyl group, the phenanthryl group, or the anthracenyl group, more preferably the phenyl group, the biphenyl group, the terphenyl group, or the naphthyl group. The phenyl group, the biphenyl group, and the terphenyl group are more preferable, and the phenyl group is particularly preferable.

When each substituent is further substituted with an aryl group, the aryl group is preferably the phenyl group, the biphenyl group, the terphenyl group, the naphthyl group, the fluorenyl group, the phenanthryl group, or the anthracenyl group, more preferably the phenyl group, the biphenyl group, the terphenyl group, or the naphthyl group. The phenyl group is particularly preferable.

The heteroaryl group refers to e.g. a cyclic aromatic group having one or plural atoms other than carbon in its own ring, such as a pyridyl group, a furanyl group, a thiophenyl group, a quinolinyl group, an isoquinolinyl group, a pyrazinyl group, a pyrimidyl group, a pyridazinyl group, a triazinyl group, a naphthyridinyl group, a cinnolinyl group, a phthalazinyl group, a quinoxalinyl group, a quinazolinyl group, a benzofuranyl group, a benzothiophenyl group, an indolyl group, a dibenzofuranyl group, a dibenzothiophenyl group, a carbazolyl group, a benzocarbazolyl group, a carbolinyl group, an indolocarbazolyl group, a benzofurocarbazolyl group, a benzothienocarbazolyl group, a dihydroindenocarbazolyl group, a benzoquinolinyl group, an acridinyl group, a dibenzoacridinyl group, a benzimidazolyl group, an imidazopyridyl group, a benzoxazolyl group, a benzothiazolyl group, and a phenanthrolinyl group. However, the naphthyridinyl group refers to any of a 1,5-naphthyridinyl group, a 1,6-naphthyridinyl group, a 1,7-naphthyridinyl group, a 1,8-naphthyridinyl group, a 2,6-naphthyridinyl group, and a 2,7-naphthyridinyl group. The heteroaryl group may or may not have a substituent. The number of carbon atoms in the heteroaryl group is not particularly limited, but is preferably in a range of 2 to 40, more preferably 2 to 30.

When $R^1$ to $R^9$ are a substituted or unsubstituted heteroaryl group, the heteroaryl group is preferably the pyridyl group, the furanyl group, the thiophenyl group, the quinolinyl group, the pyrimidyl group, the triazinyl group, the benzofuranyl group, the benzothiophenyl group, the indolyl group, the dibenzofuranyl group, the dibenzothiophenyl group, the carbazolyl group, the benzimidazolyl group, the imidazopyridyl group, the benzoxazolyl group, the benzothiazolyl group, and the phenanthrolinyl group, more preferably the pyridyl group, the furanyl group, the thiophenyl group, and the quinolinyl group. The pyridyl group is particularly preferable.

When each substituent is further substituted with a heteroaryl group, the heteroaryl group is preferably the pyridyl group, the furanyl group, the thiophenyl group, the quinolinyl group, the pyrimidyl group, the triazinyl group, the benzofuranyl group, the benzothiophenyl group, the indolyl group, the dibenzofuranyl group, the dibenzothiophenyl group, the carbazolyl group, the benzimidazolyl group, the imidazopyridyl group, the benzoxazolyl group, the benzothiazolyl group, and the phenanthrolinyl group, more preferably the pyridyl group, the furanyl group, the thiophenyl group, and the quinolinyl group. The pyridyl group is particularly preferable.

The halogen refers to an atom selected from fluorine, chlorine, bromine and iodine.

The carbonyl group, the carboxyl group, the oxycarbonyl group, and the carbamoyl group may or may not have a substituent. Herein, examples of the substituent include an alkyl group, a cycloalkyl group, an aryl group, and a heteroaryl group, and the like, and these substituents may be further substituted.

The amino group refers to a substituted or unsubstituted amino group. In the case of substitution, examples of the substituent include an aryl group, a heteroaryl group, a linear alkyl group, and a branched alkyl group. The aryl group and the heteroaryl group are preferably a phenyl group, a naphthyl group, a pyridyl group, or a quinolinyl group. These substituents may be further substituted. The number of carbon atoms is not particularly limited, but is preferably in a range of 2 to 50, more preferably 6 to 40, particularly preferably 6 to 30.

Examples of the silyl group include an alkylsilyl group such as a trimethylsilyl group, a triethylsilyl group, a tert-butyldimethylsilyl group, a propyldimethylsilyl group and a vinyldimethylsilyl group, an arylsilyl group such as a phenyldimethylsilyl group, a tert-butyldiphenylsilyl group, a triphenylsilyl group and a trinaphthylsilyl group. The substituent on silicon may be further substituted. The number of carbon atoms in the silyl group is not particularly limited, but is preferably in a range of 1 to 30.

A siloxanyl group refers to a silicon compound group via an ether bond, such as a trimethylsiloxanyl group. The substituent on silicon may be further substituted.

The boryl group refers to a substituted or unsubstituted boryl group. In the case of substitution, examples of the substituent include an aryl group, a heteroaryl group, a linear alkyl group, a branched alkyl group, an aryl ether group, an alkoxy group, and a hydroxyl group, and above all, the aryl group and the aryl ether group are preferable.

The phosphine oxide group refers to a group represented by $—P(=O)R^{10}R^{11}$. $R^{10}$ and $R^{11}$ are selected from the same group as for $R^1$ to $R^9$.

Furthermore, any two adjacent substituents (e.g. $R^1$ and $R^2$ in general formula (3)) may bind to each other to form a conjugated or unconjugated condensed ring. Constituent elements of the condensed ring include, besides carbon, elements selected from nitrogen, oxygen, sulfur, phosphorus and silicon. Furthermore, the condensed ring may be further condensed with another ring.

Since the compound represented by general formula (3) exhibits a high fluorescent quantum yield and has a small peak half-value width of the emission spectrum, and therefore an efficient color conversion and a high color purity can be achieved.

Furthermore, in the compound represented by general formula (3), various properties and physical properties such as light-emitting efficiency, color purity, thermal stability, light stability and dispersibility can be adjusted by introducing an appropriate substituent to an appropriate position.

For example, in a case that at least one of $R^1$, $R^3$, $R^4$ and $R^6$ is a substituted or unsubstituted alkyl group, a substituted or unsubstituted aryl group, a substituted or unsubstituted heteroaryl group, better thermal stability and light stability are exhibited, compared to a case that $R^1$, $R^3$, $R^4$ and $R^6$ are all hydrogen.

When at least one of $R^1$, $R^3$, $R^4$ and $R^6$ is a substituted or unsubstituted alkyl group, the alkyl group is preferably an alkyl group having 1 to 6 carbon atoms such as a methyl group, an ethyl group, an n-propyl group, an isopropyl group, an n-butyl group, a sec-butyl group, a tert-butyl group, a pentyl group, and a hexyl group, and above all, the methyl group, the ethyl group, the n-propyl group, the isopropyl group, the n-butyl group, the sec-butyl group, and the tert-butyl group are more preferable because of excellent thermal stability. Furthermore, a sterically bulky tert-butyl group is more preferable from the viewpoint of preventing concentration quenching and improving a luminescent quantum yield. Also, a methyl group is preferably used from the viewpoint of easy synthesis and availability of raw materials.

When at least one of $R^1$, $R^3$, $R^4$ and $R^6$ is a substituted or unsubstituted aryl group, the aryl group is preferably a phenyl group, a biphenyl group, a terphenyl group, or a naphthyl group, more preferably the phenyl group or the biphenyl group, particularly preferably the phenyl group.

When at least one of $R^1$, $R^3$, $R^4$ and $R^6$ is a substituted or unsubstituted heteroaryl group, the heteroaryl group is preferably a pyridyl group, a quinolinyl group or a thiophenyl group, more preferably the pyridyl group or the quinolinyl group. The pyridyl group is particularly preferable.

$R^1$, $R^3$, $R^4$ and $R^6$ may all be the same or different, and are preferably a substituted or unsubstituted alkyl group because of good solubility in a binder resin and a solvent. The alkyl group is preferably a methyl group from the viewpoint of easy synthesis and availability of raw materials.

$R^1$, $R^3$, $R^4$ and $R^6$ may all be the same or different, and are preferably a substituted or unsubstituted aryl group or a substituted or unsubstituted heteroaryl group because of better thermal stability and light stability. $R^1$, $R^3$, $R^4$ and $R^6$ may all be the same or different, and are more preferably the substituted or unsubstituted aryl group.

Although some substituents improve a plurality of properties, substituents exhibiting sufficient performance for all properties are limited. In particular, it is difficult to achieve both a high light-emitting efficiency and a high color purity. Thus, when plural types of substituents are introduced, a compound balanced in a luminescent property, a color purity, and the like can be obtained.

In particular, $R^1$, $R^3$, $R^4$ and $R^6$ may all be the same or different, and when $R^1$, $R^3$, $R^4$ and $R^6$ are a substituted or unsubstituted aryl group, it is preferable to introduce plural types of substituents e.g. in a case of $R^1 \neq R^4$, $R^3 \neq R^6$, $R^1 \neq R^3$, $R^4 \neq R^6$, or the like. Herein, the "≠" indicates that the groups have different structures. Since an aryl group that affects the color purity and an aryl group that affects the efficiency can be simultaneously introduced, fine regulation can be achieved.

Among them, a case of $R^1 \neq R^3$ or $R^4 \neq R^6$ is preferable in terms of improving the light-emitting efficiency and the color purity in good balance. One or more aryl groups that affect the color purity can be introduced into each pyrrole ring on both sides, and aryl groups that affect the efficiency can be introduced at other positions, and therefore both properties can be maximally enhanced. In the case of $R^1 \neq R^3$ or $R^4 \neq R^6$, it is preferable to satisfy $R^1 = R^4$ and $R^3 = R^6$ from the viewpoint of the heat resistance and the color purity.

The aryl group that mainly affects the color purity is preferably an aryl group substituted with an electron-donating group. The electron-donating group refers to an atomic group that donates electrons to a substituted atomic group by an inductive effect or a resonance effect in the organic electronic theory. The electron-donating group can be exemplified by a group having a negative value as a Hammett's substituent constant (σp (para)). The Hammett's substituent constant (σp (para)) can be cited from the Chemical Handbook, Basic Edition, the fifth revised version (Chapter II, p. 380).

Specific examples of the electron-donating group include an alkyl group (σp of methyl group: −0.17), an alkoxy group (σp of methoxy group: −0.27), an amino group (σp of −NH₂: −0.66), and the like. In particular, an alkyl group having 1 to 8 carbon atoms or an alkoxy group having 1 to 8 carbon atoms is preferable, and a methyl group, an ethyl group, a tert-butyl group, or a methoxy group is more preferable. From the viewpoint of dispersibility, the tert-butyl group and the methoxy group are particularly preferable, which prevent quenching due to aggregation of molecules. Although the substitution position of the substituent is not particularly limited, it is preferable to bond the substituent to a meta position or a para position with respect to a bond position with a pyromethene skeleton because twist of the bond should be suppressed for improving the light stability.

The aryl group that mainly affects the efficiency is preferably an aryl group having a bulky substituent such as a tert-butyl group, an adamantyl group, and a methoxy group.

$R^1$, $R^3$, $R^4$ and $R^6$ may all be the same or different. In a case of a substituted or unsubstituted aryl group, each of $R^1$, $R^3$, $R^4$ and $R^6$ is preferably selected from the following Ar-1 to Ar-6. In this case, preferable combinations of $R^1$, $R^3$, $R^4$ and $R^6$ may include, but are not limited to, combinations as presented in Table 1-1 to Table 1-11.

[Formula 4]

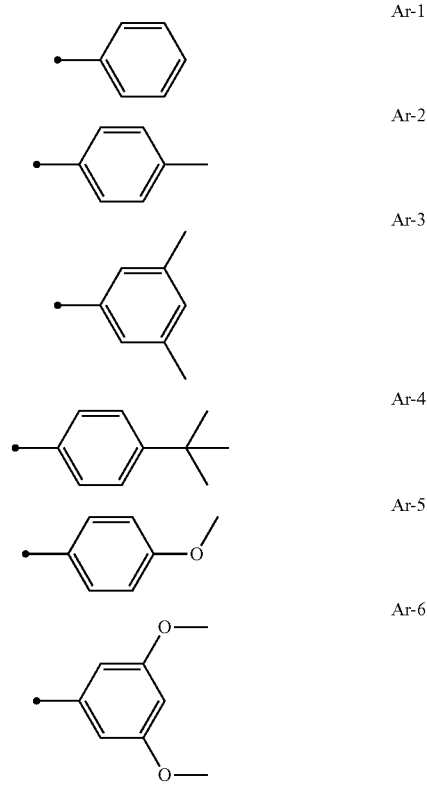

TABLE 1-1

| R1 | R3 | R4 | R6 |
|----|----|----|----|
| Ar-1 | Ar-1 | Ar-1 | Ar-1 |
| Ar-1 | Ar-1 | Ar-1 | Ar-2 |
| Ar-1 | Ar-1 | Ar-1 | Ar-3 |
| Ar-1 | Ar-1 | Ar-1 | Ar-4 |
| Ar-1 | Ar-1 | Ar-1 | Ar-5 |
| Ar-1 | Ar-1 | Ar-1 | Ar-6 |
| Ar-1 | Ar-1 | Ar-2 | Ar-1 |
| Ar-1 | Ar-1 | Ar-2 | Ar-2 |
| Ar-1 | Ar-1 | Ar-2 | Ar-3 |
| Ar-1 | Ar-1 | Ar-2 | Ar-4 |
| Ar-1 | Ar-1 | Ar-2 | Ar-5 |
| Ar-1 | Ar-1 | Ar-2 | Ar-6 |
| Ar-1 | Ar-1 | Ar-3 | Ar-1 |
| Ar-1 | Ar-1 | Ar-3 | Ar-2 |
| Ar-1 | Ar-1 | Ar-3 | Ar-3 |
| Ar-1 | Ar-1 | Ar-3 | Ar-4 |
| Ar-1 | Ar-1 | Ar-3 | Ar-5 |
| Ar-1 | Ar-1 | Ar-3 | Ar-6 |
| Ar-1 | Ar-1 | Ar-4 | Ar-1 |
| Ar-1 | Ar-1 | Ar-4 | Ar-2 |
| Ar-1 | Ar-1 | Ar-4 | Ar-3 |
| Ar-1 | Ar-1 | Ar-4 | Ar-4 |
| Ar-1 | Ar-1 | Ar-4 | Ar-5 |
| Ar-1 | Ar-1 | Ar-4 | Ar-6 |
| Ar-1 | Ar-1 | Ar-5 | Ar-1 |
| Ar-1 | Ar-1 | Ar-5 | Ar-2 |
| Ar-1 | Ar-1 | Ar-5 | Ar-3 |
| Ar-1 | Ar-1 | Ar-5 | Ar-4 |
| Ar-1 | Ar-1 | Ar-5 | Ar-5 |

TABLE 1-1-continued

| R1 | R3 | R4 | R6 |
|---|---|---|---|
| Ar-1 | Ar-1 | Ar-5 | Ar-6 |
| Ar-1 | Ar-1 | Ar-6 | Ar-1 |
| Ar-1 | Ar-1 | Ar-6 | Ar-2 |
| Ar-1 | Ar-1 | Ar-6 | Ar-3 |
| Ar-1 | Ar-1 | Ar-6 | Ar-4 |
| Ar-1 | Ar-1 | Ar-6 | Ar-5 |
| Ar-1 | Ar-1 | Ar-6 | Ar-6 |
| Ar-1 | Ar-2 | Ar-1 | Ar-2 |
| Ar-1 | Ar-2 | Ar-1 | Ar-3 |
| Ar-1 | Ar-2 | Ar-1 | Ar-4 |
| Ar-1 | Ar-2 | Ar-1 | Ar-5 |
| Ar-1 | Ar-2 | Ar-1 | Ar-6 |
| Ar-1 | Ar-2 | Ar-2 | Ar-1 |
| Ar-1 | Ar-2 | Ar-2 | Ar-2 |
| Ar-1 | Ar-2 | Ar-2 | Ar-3 |
| Ar-1 | Ar-2 | Ar-2 | Ar-4 |
| Ar-1 | Ar-2 | Ar-2 | Ar-5 |
| Ar-1 | Ar-2 | Ar-2 | Ar-6 |
| Ar-1 | Ar-2 | Ar-3 | Ar-1 |
| Ar-1 | Ar-2 | Ar-3 | Ar-2 |
| Ar-1 | Ar-2 | Ar-3 | Ar-3 |
| Ar-1 | Ar-2 | Ar-3 | Ar-4 |
| Ar-1 | Ar-2 | Ar-3 | Ar-5 |
| Ar-1 | Ar-2 | Ar-3 | Ar-6 |
| Ar-1 | Ar-2 | Ar-4 | Ar-1 |
| Ar-1 | Ar-2 | Ar-4 | Ar-2 |
| Ar-1 | Ar-2 | Ar-4 | Ar-3 |
| Ar-1 | Ar-2 | Ar-4 | Ar-4 |
| Ar-1 | Ar-2 | Ar-4 | Ar-5 |
| Ar-1 | Ar-2 | Ar-4 | Ar-6 |

TABLE 1-2

| R1 | R3 | R4 | R6 |
|---|---|---|---|
| Ar-1 | Ar-2 | Ar-5 | Ar-1 |
| Ar-1 | Ar-2 | Ar-5 | Ar-2 |
| Ar-1 | Ar-2 | Ar-5 | Ar-3 |
| Ar-1 | Ar-2 | Ar-5 | Ar-4 |
| Ar-1 | Ar-2 | Ar-5 | Ar-5 |
| Ar-1 | Ar-2 | Ar-5 | Ar-6 |
| Ar-1 | Ar-2 | Ar-6 | Ar-1 |
| Ar-1 | Ar-2 | Ar-6 | Ar-2 |
| Ar-1 | Ar-2 | Ar-6 | Ar-3 |
| Ar-1 | Ar-2 | Ar-6 | Ar-4 |
| Ar-1 | Ar-2 | Ar-6 | Ar-5 |
| Ar-1 | Ar-2 | Ar-6 | Ar-6 |
| Ar-1 | Ar-3 | Ar-1 | Ar-2 |
| Ar-1 | Ar-3 | Ar-1 | Ar-3 |
| Ar-1 | Ar-3 | Ar-1 | Ar-4 |
| Ar-1 | Ar-3 | Ar-1 | Ar-5 |
| Ar-1 | Ar-3 | Ar-1 | Ar-6 |
| Ar-1 | Ar-3 | Ar-2 | Ar-2 |
| Ar-1 | Ar-3 | Ar-2 | Ar-3 |
| Ar-1 | Ar-3 | Ar-2 | Ar-4 |
| Ar-1 | Ar-3 | Ar-2 | Ar-5 |
| Ar-1 | Ar-3 | Ar-2 | Ar-6 |
| Ar-1 | Ar-3 | Ar-3 | Ar-1 |
| Ar-1 | Ar-3 | Ar-3 | Ar-2 |
| Ar-1 | Ar-3 | Ar-3 | Ar-3 |
| Ar-1 | Ar-3 | Ar-3 | Ar-4 |
| Ar-1 | Ar-3 | Ar-3 | Ar-5 |
| Ar-1 | Ar-3 | Ar-3 | Ar-6 |
| Ar-1 | Ar-3 | Ar-4 | Ar-1 |
| Ar-1 | Ar-3 | Ar-4 | Ar-2 |
| Ar-1 | Ar-3 | Ar-4 | Ar-3 |
| Ar-1 | Ar-3 | Ar-4 | Ar-4 |
| Ar-1 | Ar-3 | Ar-4 | Ar-5 |
| Ar-1 | Ar-3 | Ar-4 | Ar-6 |
| Ar-1 | Ar-3 | Ar-5 | Ar-1 |
| Ar-1 | Ar-3 | Ar-5 | Ar-2 |
| Ar-1 | Ar-3 | Ar-5 | Ar-3 |
| Ar-1 | Ar-3 | Ar-5 | Ar-4 |
| Ar-1 | Ar-3 | Ar-5 | Ar-5 |
| Ar-1 | Ar-3 | Ar-5 | Ar-6 |

TABLE 1-2-continued

| R1 | R3 | R4 | R6 |
|---|---|---|---|
| Ar-1 | Ar-3 | Ar-6 | Ar-1 |
| Ar-1 | Ar-3 | Ar-6 | Ar-2 |
| Ar-1 | Ar-3 | Ar-6 | Ar-3 |
| Ar-1 | Ar-3 | Ar-6 | Ar-4 |
| Ar-1 | Ar-3 | Ar-6 | Ar-5 |
| Ar-1 | Ar-3 | Ar-6 | Ar-6 |
| Ar-1 | Ar-4 | Ar-1 | Ar-2 |
| Ar-1 | Ar-4 | Ar-1 | Ar-3 |
| Ar-1 | Ar-4 | Ar-1 | Ar-4 |
| Ar-1 | Ar-4 | Ar-1 | Ar-5 |
| Ar-1 | Ar-4 | Ar-1 | Ar-6 |
| Ar-1 | Ar-4 | Ar-2 | Ar-2 |
| Ar-1 | Ar-4 | Ar-2 | Ar-3 |
| Ar-1 | Ar-4 | Ar-2 | Ar-4 |
| Ar-1 | Ar-4 | Ar-2 | Ar-5 |
| Ar-1 | Ar-4 | Ar-2 | Ar-6 |
| Ar-1 | Ar-4 | Ar-3 | Ar-2 |
| Ar-1 | Ar-4 | Ar-3 | Ar-3 |
| Ar-1 | Ar-4 | Ar-3 | Ar-4 |
| Ar-1 | Ar-4 | Ar-3 | Ar-5 |
| Ar-1 | Ar-4 | Ar-3 | Ar-6 |

TABLE 1-3

| R1 | R3 | R4 | R6 |
|---|---|---|---|
| Ar-1 | Ar-4 | Ar-4 | Ar-1 |
| Ar-1 | Ar-4 | Ar-4 | Ar-2 |
| Ar-1 | Ar-4 | Ar-4 | Ar-3 |
| Ar-1 | Ar-4 | Ar-4 | Ar-4 |
| Ar-1 | Ar-4 | Ar-4 | Ar-5 |
| Ar-1 | Ar-4 | Ar-4 | Ar-6 |
| Ar-1 | Ar-4 | Ar-5 | Ar-1 |
| Ar-1 | Ar-4 | Ar-5 | Ar-2 |
| Ar-1 | Ar-4 | Ar-5 | Ar-3 |
| Ar-1 | Ar-4 | Ar-5 | Ar-4 |
| Ar-1 | Ar-4 | Ar-5 | Ar-5 |
| Ar-1 | Ar-4 | Ar-5 | Ar-6 |
| Ar-1 | Ar-4 | Ar-6 | Ar-1 |
| Ar-1 | Ar-4 | Ar-6 | Ar-2 |
| Ar-1 | Ar-4 | Ar-6 | Ar-3 |
| Ar-1 | Ar-4 | Ar-6 | Ar-4 |
| Ar-1 | Ar-4 | Ar-6 | Ar-5 |
| Ar-1 | Ar-4 | Ar-6 | Ar-6 |
| Ar-1 | Ar-5 | Ar-1 | Ar-2 |
| Ar-1 | Ar-5 | Ar-1 | Ar-3 |
| Ar-1 | Ar-5 | Ar-1 | Ar-4 |
| Ar-1 | Ar-5 | Ar-1 | Ar-5 |
| Ar-1 | Ar-5 | Ar-1 | Ar-6 |
| Ar-1 | Ar-5 | Ar-2 | Ar-2 |
| Ar-1 | Ar-5 | Ar-2 | Ar-3 |
| Ar-1 | Ar-5 | Ar-2 | Ar-4 |
| Ar-1 | Ar-5 | Ar-2 | Ar-5 |
| Ar-1 | Ar-5 | Ar-2 | Ar-6 |
| Ar-1 | Ar-5 | Ar-3 | Ar-2 |
| Ar-1 | Ar-5 | Ar-3 | Ar-3 |
| Ar-1 | Ar-5 | Ar-3 | Ar-4 |
| Ar-1 | Ar-5 | Ar-3 | Ar-5 |
| Ar-1 | Ar-5 | Ar-3 | Ar-6 |
| Ar-1 | Ar-5 | Ar-4 | Ar-2 |
| Ar-1 | Ar-5 | Ar-4 | Ar-3 |
| Ar-1 | Ar-5 | Ar-4 | Ar-4 |
| Ar-1 | Ar-5 | Ar-4 | Ar-5 |
| Ar-1 | Ar-5 | Ar-4 | Ar-6 |
| Ar-1 | Ar-5 | Ar-5 | Ar-1 |
| Ar-1 | Ar-5 | Ar-5 | Ar-2 |
| Ar-1 | Ar-5 | Ar-5 | Ar-3 |
| Ar-1 | Ar-5 | Ar-5 | Ar-4 |
| Ar-1 | Ar-5 | Ar-5 | Ar-5 |
| Ar-1 | Ar-5 | Ar-5 | Ar-6 |
| Ar-1 | Ar-5 | Ar-6 | Ar-1 |
| Ar-1 | Ar-5 | Ar-6 | Ar-2 |
| Ar-1 | Ar-5 | Ar-6 | Ar-3 |
| Ar-1 | Ar-5 | Ar-6 | Ar-4 |
| Ar-1 | Ar-5 | Ar-6 | Ar-5 |

TABLE 1-3-continued

| R1 | R3 | R4 | R6 |
|---|---|---|---|
| Ar-1 | Ar-5 | Ar-6 | Ar-6 |
| Ar-1 | Ar-6 | Ar-1 | Ar-2 |
| Ar-1 | Ar-6 | Ar-1 | Ar-3 |
| Ar-1 | Ar-6 | Ar-1 | Ar-4 |
| Ar-1 | Ar-6 | Ar-1 | Ar-5 |
| Ar-1 | Ar-6 | Ar-1 | Ar-6 |
| Ar-1 | Ar-6 | Ar-2 | Ar-2 |
| Ar-1 | Ar-6 | Ar-2 | Ar-3 |
| Ar-1 | Ar-6 | Ar-2 | Ar-4 |
| Ar-1 | Ar-6 | Ar-2 | Ar-5 |
| Ar-1 | Ar-6 | Ar-2 | Ar-6 |

TABLE 1-4

| R1 | R3 | R4 | R6 |
|---|---|---|---|
| Ar-1 | Ar-6 | Ar-3 | Ar-2 |
| Ar-1 | Ar-6 | Ar-3 | Ar-3 |
| Ar-1 | Ar-6 | Ar-3 | Ar-4 |
| Ar-1 | Ar-6 | Ar-3 | Ar-5 |
| Ar-1 | Ar-6 | Ar-3 | Ar-6 |
| Ar-1 | Ar-6 | Ar-4 | Ar-2 |
| Ar-1 | Ar-6 | Ar-4 | Ar-3 |
| Ar-1 | Ar-6 | Ar-4 | Ar-4 |
| Ar-1 | Ar-6 | Ar-4 | Ar-5 |
| Ar-1 | Ar-6 | Ar-4 | Ar-6 |
| Ar-1 | Ar-6 | Ar-5 | Ar-2 |
| Ar-1 | Ar-6 | Ar-5 | Ar-3 |
| Ar-1 | Ar-6 | Ar-5 | Ar-4 |
| Ar-1 | Ar-6 | Ar-5 | Ar-5 |
| Ar-1 | Ar-6 | Ar-5 | Ar-6 |
| Ar-1 | Ar-6 | Ar-6 | Ar-1 |
| Ar-1 | Ar-6 | Ar-6 | Ar-2 |
| Ar-1 | Ar-6 | Ar-6 | Ar-3 |
| Ar-1 | Ar-6 | Ar-6 | Ar-4 |
| Ar-1 | Ar-6 | Ar-6 | Ar-5 |
| Ar-1 | Ar-6 | Ar-6 | Ar-6 |
| Ar-2 | Ar-1 | Ar-1 | Ar-2 |
| Ar-2 | Ar-1 | Ar-1 | Ar-3 |
| Ar-2 | Ar-1 | Ar-1 | Ar-4 |
| Ar-2 | Ar-1 | Ar-1 | Ar-5 |
| Ar-2 | Ar-1 | Ar-1 | Ar-6 |
| Ar-2 | Ar-1 | Ar-2 | Ar-2 |
| Ar-2 | Ar-1 | Ar-2 | Ar-3 |
| Ar-2 | Ar-1 | Ar-2 | Ar-4 |
| Ar-2 | Ar-1 | Ar-2 | Ar-5 |
| Ar-2 | Ar-1 | Ar-2 | Ar-6 |
| Ar-2 | Ar-1 | Ar-3 | Ar-2 |
| Ar-2 | Ar-1 | Ar-3 | Ar-3 |
| Ar-2 | Ar-1 | Ar-3 | Ar-4 |
| Ar-2 | Ar-1 | Ar-3 | Ar-5 |
| Ar-2 | Ar-1 | Ar-3 | Ar-6 |
| Ar-2 | Ar-1 | Ar-4 | Ar-2 |
| Ar-2 | Ar-1 | Ar-4 | Ar-3 |
| Ar-2 | Ar-1 | Ar-4 | Ar-4 |
| Ar-2 | Ar-1 | Ar-4 | Ar-5 |
| Ar-2 | Ar-1 | Ar-4 | Ar-6 |
| Ar-2 | Ar-1 | Ar-5 | Ar-2 |
| Ar-2 | Ar-1 | Ar-5 | Ar-3 |
| Ar-2 | Ar-1 | Ar-5 | Ar-4 |
| Ar-2 | Ar-1 | Ar-5 | Ar-5 |
| Ar-2 | Ar-1 | Ar-5 | Ar-6 |
| Ar-2 | Ar-1 | Ar-6 | Ar-2 |
| Ar-2 | Ar-1 | Ar-6 | Ar-3 |
| Ar-2 | Ar-1 | Ar-6 | Ar-4 |
| Ar-2 | Ar-1 | Ar-6 | Ar-5 |
| Ar-2 | Ar-1 | Ar-6 | Ar-6 |
| Ar-2 | Ar-2 | Ar-1 | Ar-3 |
| Ar-2 | Ar-2 | Ar-1 | Ar-4 |
| Ar-2 | Ar-2 | Ar-1 | Ar-5 |
| Ar-2 | Ar-2 | Ar-1 | Ar-6 |

TABLE 1-4-continued

| R1 | R3 | R4 | R6 |
|---|---|---|---|
| Ar-2 | Ar-2 | Ar-2 | Ar-2 |
| Ar-2 | Ar-2 | Ar-2 | Ar-3 |
| Ar-2 | Ar-2 | Ar-2 | Ar-4 |
| Ar-2 | Ar-2 | Ar-2 | Ar-5 |
| Ar-2 | Ar-2 | Ar-2 | Ar-6 |

TABLE 1-5

| R1 | R3 | R4 | R6 |
|---|---|---|---|
| Ar-2 | Ar-2 | Ar-3 | Ar-2 |
| Ar-2 | Ar-2 | Ar-3 | Ar-3 |
| Ar-2 | Ar-2 | Ar-3 | Ar-4 |
| Ar-2 | Ar-2 | Ar-3 | Ar-5 |
| Ar-2 | Ar-2 | Ar-3 | Ar-6 |
| Ar-2 | Ar-2 | Ar-4 | Ar-2 |
| Ar-2 | Ar-2 | Ar-4 | Ar-3 |
| Ar-2 | Ar-2 | Ar-4 | Ar-4 |
| Ar-2 | Ar-2 | Ar-4 | Ar-5 |
| Ar-2 | Ar-2 | Ar-4 | Ar-6 |
| Ar-2 | Ar-2 | Ar-5 | Ar-2 |
| Ar-2 | Ar-2 | Ar-5 | Ar-3 |
| Ar-2 | Ar-2 | Ar-5 | Ar-4 |
| Ar-2 | Ar-2 | Ar-5 | Ar-5 |
| Ar-2 | Ar-2 | Ar-5 | Ar-6 |
| Ar-2 | Ar-2 | Ar-6 | Ar-2 |
| Ar-2 | Ar-2 | Ar-6 | Ar-3 |
| Ar-2 | Ar-2 | Ar-6 | Ar-4 |
| Ar-2 | Ar-2 | Ar-6 | Ar-5 |
| Ar-2 | Ar-2 | Ar-6 | Ar-6 |
| Ar-2 | Ar-3 | Ar-1 | Ar-3 |
| Ar-2 | Ar-3 | Ar-1 | Ar-4 |
| Ar-2 | Ar-3 | Ar-1 | Ar-5 |
| Ar-2 | Ar-3 | Ar-1 | Ar-6 |
| Ar-2 | Ar-3 | Ar-2 | Ar-3 |
| Ar-2 | Ar-3 | Ar-2 | Ar-4 |
| Ar-2 | Ar-3 | Ar-2 | Ar-5 |
| Ar-2 | Ar-3 | Ar-2 | Ar-6 |
| Ar-2 | Ar-3 | Ar-3 | Ar-2 |
| Ar-2 | Ar-3 | Ar-3 | Ar-3 |
| Ar-2 | Ar-3 | Ar-3 | Ar-4 |
| Ar-2 | Ar-3 | Ar-3 | Ar-5 |
| Ar-2 | Ar-3 | Ar-3 | Ar-6 |
| Ar-2 | Ar-3 | Ar-4 | Ar-2 |
| Ar-2 | Ar-3 | Ar-4 | Ar-3 |
| Ar-2 | Ar-3 | Ar-4 | Ar-4 |
| Ar-2 | Ar-3 | Ar-4 | Ar-5 |
| Ar-2 | Ar-3 | Ar-4 | Ar-6 |
| Ar-2 | Ar-3 | Ar-5 | Ar-2 |
| Ar-2 | Ar-3 | Ar-5 | Ar-3 |
| Ar-2 | Ar-3 | Ar-5 | Ar-4 |
| Ar-2 | Ar-3 | Ar-5 | Ar-5 |
| Ar-2 | Ar-3 | Ar-5 | Ar-6 |
| Ar-2 | Ar-3 | Ar-6 | Ar-2 |
| Ar-2 | Ar-3 | Ar-6 | Ar-3 |
| Ar-2 | Ar-3 | Ar-6 | Ar-4 |
| Ar-2 | Ar-3 | Ar-6 | Ar-5 |
| Ar-2 | Ar-3 | Ar-6 | Ar-6 |
| Ar-2 | Ar-4 | Ar-1 | Ar-3 |
| Ar-2 | Ar-4 | Ar-1 | Ar-4 |
| Ar-2 | Ar-4 | Ar-1 | Ar-5 |
| Ar-2 | Ar-4 | Ar-1 | Ar-6 |
| Ar-2 | Ar-4 | Ar-2 | Ar-3 |
| Ar-2 | Ar-4 | Ar-2 | Ar-4 |
| Ar-2 | Ar-4 | Ar-2 | Ar-5 |
| Ar-2 | Ar-4 | Ar-2 | Ar-6 |
| Ar-2 | Ar-4 | Ar-3 | Ar-3 |
| Ar-2 | Ar-4 | Ar-3 | Ar-4 |
| Ar-2 | Ar-4 | Ar-3 | Ar-5 |
| Ar-2 | Ar-4 | Ar-3 | Ar-6 |

TABLE 1-6

| R1 | R3 | R4 | R6 |
|---|---|---|---|
| Ar-2 | Ar-4 | Ar-4 | Ar-2 |
| Ar-2 | Ar-4 | Ar-4 | Ar-3 |
| Ar-2 | Ar-4 | Ar-4 | Ar-4 |
| Ar-2 | Ar-4 | Ar-4 | Ar-5 |
| Ar-2 | Ar-4 | Ar-4 | Ar-6 |
| Ar-2 | Ar-4 | Ar-5 | Ar-2 |
| Ar-2 | Ar-4 | Ar-5 | Ar-3 |
| Ar-2 | Ar-4 | Ar-5 | Ar-4 |
| Ar-2 | Ar-4 | Ar-5 | Ar-5 |
| Ar-2 | Ar-4 | Ar-5 | Ar-6 |
| Ar-2 | Ar-4 | Ar-6 | Ar-2 |
| Ar-2 | Ar-4 | Ar-6 | Ar-3 |
| Ar-2 | Ar-4 | Ar-6 | Ar-4 |
| Ar-2 | Ar-4 | Ar-6 | Ar-5 |
| Ar-2 | Ar-4 | Ar-6 | Ar-6 |
| Ar-2 | Ar-5 | Ar-1 | Ar-3 |
| Ar-2 | Ar-5 | Ar-1 | Ar-4 |
| Ar-2 | Ar-5 | Ar-1 | Ar-5 |
| Ar-2 | Ar-5 | Ar-1 | Ar-6 |
| Ar-2 | Ar-5 | Ar-2 | Ar-3 |
| Ar-2 | Ar-5 | Ar-2 | Ar-4 |
| Ar-2 | Ar-5 | Ar-2 | Ar-5 |
| Ar-2 | Ar-5 | Ar-2 | Ar-6 |
| Ar-2 | Ar-5 | Ar-3 | Ar-3 |
| Ar-2 | Ar-5 | Ar-3 | Ar-4 |
| Ar-2 | Ar-5 | Ar-3 | Ar-5 |
| Ar-2 | Ar-5 | Ar-3 | Ar-6 |
| Ar-2 | Ar-5 | Ar-4 | Ar-3 |
| Ar-2 | Ar-5 | Ar-4 | Ar-4 |
| Ar-2 | Ar-5 | Ar-4 | Ar-5 |
| Ar-2 | Ar-5 | Ar-4 | Ar-6 |
| Ar-2 | Ar-5 | Ar-5 | Ar-2 |
| Ar-2 | Ar-5 | Ar-5 | Ar-3 |
| Ar-2 | Ar-5 | Ar-5 | Ar-4 |
| Ar-2 | Ar-5 | Ar-5 | Ar-5 |
| Ar-2 | Ar-5 | Ar-5 | Ar-6 |
| Ar-2 | Ar-5 | Ar-6 | Ar-2 |
| Ar-2 | Ar-5 | Ar-6 | Ar-3 |
| Ar-2 | Ar-5 | Ar-6 | Ar-4 |
| Ar-2 | Ar-5 | Ar-6 | Ar-5 |
| Ar-2 | Ar-5 | Ar-6 | Ar-6 |
| Ar-2 | Ar-6 | Ar-1 | Ar-3 |
| Ar-2 | Ar-6 | Ar-1 | Ar-4 |
| Ar-2 | Ar-6 | Ar-1 | Ar-5 |
| Ar-2 | Ar-6 | Ar-1 | Ar-6 |
| Ar-2 | Ar-6 | Ar-2 | Ar-3 |
| Ar-2 | Ar-6 | Ar-2 | Ar-4 |
| Ar-2 | Ar-6 | Ar-2 | Ar-5 |
| Ar-2 | Ar-6 | Ar-2 | Ar-6 |
| Ar-2 | Ar-6 | Ar-3 | Ar-3 |
| Ar-2 | Ar-6 | Ar-3 | Ar-4 |
| Ar-2 | Ar-6 | Ar-3 | Ar-5 |
| Ar-2 | Ar-6 | Ar-3 | Ar-6 |
| Ar-2 | Ar-6 | Ar-4 | Ar-3 |
| Ar-2 | Ar-6 | Ar-4 | Ar-4 |
| Ar-2 | Ar-6 | Ar-4 | Ar-5 |
| Ar-2 | Ar-6 | Ar-4 | Ar-6 |
| Ar-2 | Ar-6 | Ar-5 | Ar-3 |
| Ar-2 | Ar-6 | Ar-5 | Ar-4 |
| Ar-2 | Ar-6 | Ar-5 | Ar-5 |
| Ar-2 | Ar-6 | Ar-5 | Ar-6 |

TABLE 1-7

| R1 | R3 | R4 | R6 |
|---|---|---|---|
| Ar-2 | Ar-6 | Ar-6 | Ar-2 |
| Ar-2 | Ar-6 | Ar-6 | Ar-3 |
| Ar-2 | Ar-6 | Ar-6 | Ar-4 |
| Ar-2 | Ar-6 | Ar-6 | Ar-5 |
| Ar-2 | Ar-6 | Ar-6 | Ar-6 |
| Ar-3 | Ar-1 | Ar-1 | Ar-3 |
| Ar-3 | Ar-1 | Ar-1 | Ar-4 |
| Ar-3 | Ar-1 | Ar-1 | Ar-5 |
| Ar-3 | Ar-1 | Ar-1 | Ar-6 |
| Ar-3 | Ar-1 | Ar-2 | Ar-3 |
| Ar-3 | Ar-1 | Ar-2 | Ar-4 |
| Ar-3 | Ar-1 | Ar-2 | Ar-5 |
| Ar-3 | Ar-1 | Ar-2 | Ar-6 |
| Ar-3 | Ar-1 | Ar-3 | Ar-3 |
| Ar-3 | Ar-1 | Ar-3 | Ar-4 |
| Ar-3 | Ar-1 | Ar-3 | Ar-5 |
| Ar-3 | Ar-1 | Ar-3 | Ar-6 |
| Ar-3 | Ar-1 | Ar-4 | Ar-3 |
| Ar-3 | Ar-1 | Ar-4 | Ar-4 |
| Ar-3 | Ar-1 | Ar-4 | Ar-5 |
| Ar-3 | Ar-1 | Ar-4 | Ar-6 |
| Ar-3 | Ar-1 | Ar-5 | Ar-3 |
| Ar-3 | Ar-1 | Ar-5 | Ar-4 |
| Ar-3 | Ar-1 | Ar-5 | Ar-5 |
| Ar-3 | Ar-1 | Ar-5 | Ar-6 |
| Ar-3 | Ar-1 | Ar-6 | Ar-3 |
| Ar-3 | Ar-1 | Ar-6 | Ar-4 |
| Ar-3 | Ar-1 | Ar-6 | Ar-5 |
| Ar-3 | Ar-1 | Ar-6 | Ar-6 |
| Ar-3 | Ar-2 | Ar-1 | Ar-4 |
| Ar-3 | Ar-2 | Ar-1 | Ar-5 |
| Ar-3 | Ar-2 | Ar-1 | Ar-6 |
| Ar-3 | Ar-2 | Ar-2 | Ar-3 |
| Ar-3 | Ar-2 | Ar-2 | Ar-4 |
| Ar-3 | Ar-2 | Ar-2 | Ar-5 |
| Ar-3 | Ar-2 | Ar-2 | Ar-6 |
| Ar-3 | Ar-2 | Ar-3 | Ar-3 |
| Ar-3 | Ar-2 | Ar-3 | Ar-4 |
| Ar-3 | Ar-2 | Ar-3 | Ar-5 |
| Ar-3 | Ar-2 | Ar-3 | Ar-6 |
| Ar-3 | Ar-2 | Ar-4 | Ar-3 |
| Ar-3 | Ar-2 | Ar-4 | Ar-4 |
| Ar-3 | Ar-2 | Ar-4 | Ar-5 |
| Ar-3 | Ar-2 | Ar-4 | Ar-6 |
| Ar-3 | Ar-2 | Ar-5 | Ar-3 |
| Ar-3 | Ar-2 | Ar-5 | Ar-4 |
| Ar-3 | Ar-2 | Ar-5 | Ar-5 |
| Ar-3 | Ar-2 | Ar-5 | Ar-6 |
| Ar-3 | Ar-2 | Ar-6 | Ar-3 |
| Ar-3 | Ar-2 | Ar-6 | Ar-4 |
| Ar-3 | Ar-2 | Ar-6 | Ar-5 |
| Ar-3 | Ar-2 | Ar-6 | Ar-6 |
| Ar-3 | Ar-3 | Ar-1 | Ar-4 |
| Ar-3 | Ar-3 | Ar-1 | Ar-5 |
| Ar-3 | Ar-3 | Ar-1 | Ar-6 |
| Ar-3 | Ar-3 | Ar-2 | Ar-4 |
| Ar-3 | Ar-3 | Ar-2 | Ar-5 |
| Ar-3 | Ar-3 | Ar-2 | Ar-6 |
| Ar-3 | Ar-3 | Ar-3 | Ar-3 |
| Ar-3 | Ar-3 | Ar-3 | Ar-4 |
| Ar-3 | Ar-3 | Ar-3 | Ar-5 |

TABLE 1-8

| R1 | R3 | R4 | R6 |
|---|---|---|---|
| Ar-3 | Ar-3 | Ar-3 | Ar-6 |
| Ar-3 | Ar-3 | Ar-4 | Ar-3 |
| Ar-3 | Ar-3 | Ar-4 | Ar-4 |
| Ar-3 | Ar-3 | Ar-4 | Ar-5 |
| Ar-3 | Ar-3 | Ar-4 | Ar-6 |
| Ar-3 | Ar-3 | Ar-5 | Ar-3 |
| Ar-3 | Ar-3 | Ar-5 | Ar-4 |
| Ar-3 | Ar-3 | Ar-5 | Ar-5 |
| Ar-3 | Ar-3 | Ar-5 | Ar-6 |
| Ar-3 | Ar-3 | Ar-6 | Ar-3 |
| Ar-3 | Ar-3 | Ar-6 | Ar-4 |
| Ar-3 | Ar-3 | Ar-6 | Ar-5 |
| Ar-3 | Ar-3 | Ar-6 | Ar-6 |
| Ar-3 | Ar-4 | Ar-1 | Ar-4 |
| Ar-3 | Ar-4 | Ar-1 | Ar-5 |
| Ar-3 | Ar-4 | Ar-1 | Ar-6 |
| Ar-3 | Ar-4 | Ar-2 | Ar-4 |
| Ar-3 | Ar-4 | Ar-2 | Ar-5 |

TABLE 1-8-continued

| R1 | R3 | R4 | R6 |
|---|---|---|---|
| Ar-3 | Ar-4 | Ar-2 | Ar-6 |
| Ar-3 | Ar-4 | Ar-3 | Ar-4 |
| Ar-3 | Ar-4 | Ar-3 | Ar-5 |
| Ar-3 | Ar-4 | Ar-3 | Ar-6 |
| Ar-3 | Ar-4 | Ar-4 | Ar-3 |
| Ar-3 | Ar-4 | Ar-4 | Ar-4 |
| Ar-3 | Ar-4 | Ar-4 | Ar-5 |
| Ar-3 | Ar-4 | Ar-4 | Ar-6 |
| Ar-3 | Ar-4 | Ar-5 | Ar-3 |
| Ar-3 | Ar-4 | Ar-5 | Ar-4 |
| Ar-3 | Ar-4 | Ar-5 | Ar-5 |
| Ar-3 | Ar-4 | Ar-5 | Ar-6 |
| Ar-3 | Ar-4 | Ar-6 | Ar-3 |
| Ar-3 | Ar-4 | Ar-6 | Ar-4 |
| Ar-3 | Ar-4 | Ar-6 | Ar-5 |
| Ar-3 | Ar-4 | Ar-6 | Ar-6 |
| Ar-3 | Ar-5 | Ar-1 | Ar-4 |
| Ar-3 | Ar-5 | Ar-1 | Ar-5 |
| Ar-3 | Ar-5 | Ar-1 | Ar-6 |
| Ar-3 | Ar-5 | Ar-2 | Ar-4 |
| Ar-3 | Ar-5 | Ar-2 | Ar-5 |
| Ar-3 | Ar-5 | Ar-2 | Ar-6 |
| Ar-3 | Ar-5 | Ar-3 | Ar-4 |
| Ar-3 | Ar-5 | Ar-3 | Ar-5 |
| Ar-3 | Ar-5 | Ar-3 | Ar-6 |
| Ar-3 | Ar-5 | Ar-4 | Ar-4 |
| Ar-3 | Ar-5 | Ar-4 | Ar-5 |
| Ar-3 | Ar-5 | Ar-4 | Ar-6 |
| Ar-3 | Ar-5 | Ar-5 | Ar-3 |
| Ar-3 | Ar-5 | Ar-5 | Ar-4 |
| Ar-3 | Ar-5 | Ar-5 | Ar-5 |
| Ar-3 | Ar-5 | Ar-5 | Ar-6 |
| Ar-3 | Ar-5 | Ar-6 | Ar-3 |
| Ar-3 | Ar-5 | Ar-6 | Ar-4 |
| Ar-3 | Ar-5 | Ar-6 | Ar-5 |
| Ar-3 | Ar-5 | Ar-6 | Ar-6 |
| Ar-3 | Ar-6 | Ar-1 | Ar-4 |
| Ar-3 | Ar-6 | Ar-1 | Ar-5 |
| Ar-3 | Ar-6 | Ar-1 | Ar-6 |
| Ar-3 | Ar-6 | Ar-2 | Ar-4 |
| Ar-3 | Ar-6 | Ar-2 | Ar-5 |
| Ar-3 | Ar-6 | Ar-2 | Ar-6 |

TABLE 1-9

| R1 | R3 | R4 | R6 |
|---|---|---|---|
| Ar-3 | Ar-6 | Ar-3 | Ar-4 |
| Ar-3 | Ar-6 | Ar-3 | Ar-5 |
| Ar-3 | Ar-6 | Ar-3 | Ar-6 |
| Ar-3 | Ar-6 | Ar-4 | Ar-4 |
| Ar-3 | Ar-6 | Ar-4 | Ar-5 |
| Ar-3 | Ar-6 | Ar-4 | Ar-6 |
| Ar-3 | Ar-6 | Ar-5 | Ar-4 |
| Ar-3 | Ar-6 | Ar-5 | Ar-5 |
| Ar-3 | Ar-6 | Ar-5 | Ar-6 |
| Ar-3 | Ar-6 | Ar-6 | Ar-3 |
| Ar-3 | Ar-6 | Ar-6 | Ar-4 |
| Ar-3 | Ar-6 | Ar-6 | Ar-5 |
| Ar-3 | Ar-6 | Ar-6 | Ar-6 |
| Ar-4 | Ar-1 | Ar-1 | Ar-4 |
| Ar-4 | Ar-1 | Ar-1 | Ar-5 |
| Ar-4 | Ar-1 | Ar-1 | Ar-6 |
| Ar-4 | Ar-1 | Ar-2 | Ar-4 |
| Ar-4 | Ar-1 | Ar-2 | Ar-5 |
| Ar-4 | Ar-1 | Ar-2 | Ar-6 |
| Ar-4 | Ar-1 | Ar-3 | Ar-4 |
| Ar-4 | Ar-1 | Ar-3 | Ar-5 |
| Ar-4 | Ar-1 | Ar-3 | Ar-6 |
| Ar-4 | Ar-1 | Ar-4 | Ar-4 |
| Ar-4 | Ar-1 | Ar-4 | Ar-5 |
| Ar-4 | Ar-1 | Ar-4 | Ar-6 |
| Ar-4 | Ar-1 | Ar-5 | Ar-4 |
| Ar-4 | Ar-1 | Ar-5 | Ar-5 |
| Ar-4 | Ar-1 | Ar-5 | Ar-6 |

TABLE 1-9-continued

| R1 | R3 | R4 | R6 |
|---|---|---|---|
| Ar-4 | Ar-1 | Ar-6 | Ar-4 |
| Ar-4 | Ar-1 | Ar-6 | Ar-5 |
| Ar-4 | Ar-1 | Ar-6 | Ar-6 |
| Ar-4 | Ar-2 | Ar-1 | Ar-5 |
| Ar-4 | Ar-2 | Ar-1 | Ar-6 |
| Ar-4 | Ar-2 | Ar-2 | Ar-4 |
| Ar-4 | Ar-2 | Ar-2 | Ar-5 |
| Ar-4 | Ar-2 | Ar-2 | Ar-6 |
| Ar-4 | Ar-2 | Ar-3 | Ar-4 |
| Ar-4 | Ar-2 | Ar-3 | Ar-5 |
| Ar-4 | Ar-2 | Ar-3 | Ar-6 |
| Ar-4 | Ar-2 | Ar-4 | Ar-4 |
| Ar-4 | Ar-2 | Ar-4 | Ar-5 |
| Ar-4 | Ar-2 | Ar-4 | Ar-6 |
| Ar-4 | Ar-2 | Ar-5 | Ar-4 |
| Ar-4 | Ar-2 | Ar-5 | Ar-5 |
| Ar-4 | Ar-2 | Ar-5 | Ar-6 |
| Ar-4 | Ar-2 | Ar-6 | Ar-4 |
| Ar-4 | Ar-2 | Ar-6 | Ar-5 |
| Ar-4 | Ar-2 | Ar-6 | Ar-6 |
| Ar-4 | Ar-3 | Ar-1 | Ar-5 |
| Ar-4 | Ar-3 | Ar-1 | Ar-6 |
| Ar-4 | Ar-3 | Ar-2 | Ar-5 |
| Ar-4 | Ar-3 | Ar-2 | Ar-6 |
| Ar-4 | Ar-3 | Ar-3 | Ar-4 |
| Ar-4 | Ar-3 | Ar-3 | Ar-5 |
| Ar-4 | Ar-3 | Ar-3 | Ar-6 |
| Ar-4 | Ar-3 | Ar-4 | Ar-4 |
| Ar-4 | Ar-3 | Ar-4 | Ar-5 |
| Ar-4 | Ar-3 | Ar-4 | Ar-6 |
| Ar-4 | Ar-3 | Ar-5 | Ar-4 |
| Ar-4 | Ar-3 | Ar-5 | Ar-5 |
| Ar-4 | Ar-3 | Ar-5 | Ar-6 |

TABLE 1-10

| R1 | R3 | R4 | R6 |
|---|---|---|---|
| Ar-4 | Ar-3 | Ar-6 | Ar-4 |
| Ar-4 | Ar-3 | Ar-6 | Ar-5 |
| Ar-4 | Ar-3 | Ar-6 | Ar-6 |
| Ar-4 | Ar-4 | Ar-1 | Ar-5 |
| Ar-4 | Ar-4 | Ar-1 | Ar-6 |
| Ar-4 | Ar-4 | Ar-2 | Ar-5 |
| Ar-4 | Ar-4 | Ar-2 | Ar-6 |
| Ar-4 | Ar-4 | Ar-3 | Ar-5 |
| Ar-4 | Ar-4 | Ar-3 | Ar-6 |
| Ar-4 | Ar-4 | Ar-4 | Ar-4 |
| Ar-4 | Ar-4 | Ar-4 | Ar-5 |
| Ar-4 | Ar-4 | Ar-4 | Ar-6 |
| Ar-4 | Ar-4 | Ar-5 | Ar-4 |
| Ar-4 | Ar-4 | Ar-5 | Ar-5 |
| Ar-4 | Ar-4 | Ar-5 | Ar-6 |
| Ar-4 | Ar-4 | Ar-6 | Ar-4 |
| Ar-4 | Ar-4 | Ar-6 | Ar-5 |
| Ar-4 | Ar-4 | Ar-6 | Ar-6 |
| Ar-4 | Ar-5 | Ar-1 | Ar-5 |
| Ar-4 | Ar-5 | Ar-1 | Ar-6 |
| Ar-4 | Ar-5 | Ar-2 | Ar-5 |
| Ar-4 | Ar-5 | Ar-2 | Ar-6 |
| Ar-4 | Ar-5 | Ar-3 | Ar-5 |
| Ar-4 | Ar-5 | Ar-3 | Ar-6 |
| Ar-4 | Ar-5 | Ar-4 | Ar-5 |
| Ar-4 | Ar-5 | Ar-4 | Ar-6 |
| Ar-4 | Ar-5 | Ar-5 | Ar-4 |
| Ar-4 | Ar-5 | Ar-5 | Ar-5 |
| Ar-4 | Ar-5 | Ar-5 | Ar-6 |
| Ar-4 | Ar-5 | Ar-6 | Ar-4 |
| Ar-4 | Ar-5 | Ar-6 | Ar-5 |
| Ar-4 | Ar-5 | Ar-6 | Ar-6 |
| Ar-4 | Ar-6 | Ar-1 | Ar-5 |
| Ar-4 | Ar-6 | Ar-1 | Ar-6 |
| Ar-4 | Ar-6 | Ar-2 | Ar-5 |
| Ar-4 | Ar-6 | Ar-2 | Ar-6 |
| Ar-4 | Ar-6 | Ar-3 | Ar-5 |

TABLE 1-10-continued

| R1 | R3 | R4 | R6 |
|---|---|---|---|
| Ar-4 | Ar-6 | Ar-3 | Ar-6 |
| Ar-4 | Ar-6 | Ar-4 | Ar-5 |
| Ar-4 | Ar-6 | Ar-4 | Ar-6 |
| Ar-4 | Ar-6 | Ar-5 | Ar-5 |
| Ar-4 | Ar-6 | Ar-5 | Ar-6 |
| Ar-4 | Ar-6 | Ar-6 | Ar-4 |
| Ar-4 | Ar-6 | Ar-6 | Ar-5 |
| Ar-4 | Ar-6 | Ar-6 | Ar-6 |
| Ar-5 | Ar-1 | Ar-1 | Ar-5 |
| Ar-5 | Ar-1 | Ar-1 | Ar-6 |
| Ar-5 | Ar-1 | Ar-2 | Ar-5 |
| Ar-5 | Ar-1 | Ar-2 | Ar-6 |
| Ar-5 | Ar-1 | Ar-3 | Ar-5 |
| Ar-5 | Ar-1 | Ar-3 | Ar-6 |
| Ar-5 | Ar-1 | Ar-4 | Ar-5 |
| Ar-5 | Ar-1 | Ar-4 | Ar-6 |
| Ar-5 | Ar-1 | Ar-5 | Ar-5 |
| Ar-5 | Ar-1 | Ar-5 | Ar-6 |
| Ar-5 | Ar-1 | Ar-6 | Ar-5 |
| Ar-5 | Ar-1 | Ar-6 | Ar-6 |
| Ar-5 | Ar-2 | Ar-1 | Ar-6 |
| Ar-5 | Ar-2 | Ar-2 | Ar-5 |
| Ar-5 | Ar-2 | Ar-2 | Ar-6 |
| Ar-5 | Ar-2 | Ar-3 | Ar-5 |
| Ar-5 | Ar-2 | Ar-3 | Ar-6 |

TABLE 1-11

| R1 | R3 | R4 | R6 |
|---|---|---|---|
| Ar-5 | Ar-2 | Ar-4 | Ar-5 |
| Ar-5 | Ar-2 | Ar-4 | Ar-6 |
| Ar-5 | Ar-2 | Ar-5 | Ar-5 |
| Ar-5 | Ar-2 | Ar-5 | Ar-6 |
| Ar-5 | Ar-2 | Ar-6 | Ar-5 |
| Ar-5 | Ar-2 | Ar-6 | Ar-6 |
| Ar-5 | Ar-3 | Ar-1 | Ar-6 |
| Ar-5 | Ar-3 | Ar-2 | Ar-6 |
| Ar-5 | Ar-3 | Ar-3 | Ar-5 |
| Ar-5 | Ar-3 | Ar-3 | Ar-6 |
| Ar-5 | Ar-3 | Ar-4 | Ar-5 |
| Ar-5 | Ar-3 | Ar-4 | Ar-6 |
| Ar-5 | Ar-3 | Ar-5 | Ar-5 |
| Ar-5 | Ar-3 | Ar-5 | Ar-6 |
| Ar-5 | Ar-3 | Ar-6 | Ar-5 |
| Ar-5 | Ar-3 | Ar-6 | Ar-6 |
| Ar-5 | Ar-4 | Ar-1 | Ar-6 |
| Ar-5 | Ar-4 | Ar-2 | Ar-6 |
| Ar-5 | Ar-4 | Ar-3 | Ar-6 |
| Ar-5 | Ar-4 | Ar-4 | Ar-5 |
| Ar-5 | Ar-4 | Ar-4 | Ar-6 |
| Ar-5 | Ar-4 | Ar-5 | Ar-5 |
| Ar-5 | Ar-4 | Ar-5 | Ar-6 |
| Ar-5 | Ar-4 | Ar-6 | Ar-5 |
| Ar-5 | Ar-4 | Ar-6 | Ar-6 |
| Ar-5 | Ar-5 | Ar-1 | Ar-6 |
| Ar-5 | Ar-5 | Ar-2 | Ar-6 |
| Ar-5 | Ar-5 | Ar-3 | Ar-6 |
| Ar-5 | Ar-5 | Ar-4 | Ar-6 |
| Ar-5 | Ar-5 | Ar-5 | Ar-5 |
| Ar-5 | Ar-5 | Ar-5 | Ar-6 |
| Ar-5 | Ar-5 | Ar-6 | Ar-5 |
| Ar-5 | Ar-5 | Ar-6 | Ar-6 |
| Ar-5 | Ar-6 | Ar-1 | Ar-6 |
| Ar-5 | Ar-6 | Ar-2 | Ar-6 |
| Ar-5 | Ar-6 | Ar-3 | Ar-6 |
| Ar-5 | Ar-6 | Ar-4 | Ar-6 |
| Ar-5 | Ar-6 | Ar-5 | Ar-6 |
| Ar-5 | Ar-6 | Ar-6 | Ar-5 |
| Ar-5 | Ar-6 | Ar-6 | Ar-6 |
| Ar-6 | Ar-1 | Ar-1 | Ar-6 |
| Ar-6 | Ar-1 | Ar-2 | Ar-6 |
| Ar-6 | Ar-1 | Ar-3 | Ar-6 |
| Ar-6 | Ar-1 | Ar-4 | Ar-6 |
| Ar-6 | Ar-1 | Ar-5 | Ar-6 |

TABLE 1-11-continued

| R1 | R3 | R4 | R6 |
|---|---|---|---|
| Ar-6 | Ar-1 | Ar-6 | Ar-6 |
| Ar-6 | Ar-2 | Ar-2 | Ar-6 |
| Ar-6 | Ar-2 | Ar-3 | Ar-6 |
| Ar-6 | Ar-2 | Ar-4 | Ar-6 |
| Ar-6 | Ar-2 | Ar-5 | Ar-6 |
| Ar-6 | Ar-2 | Ar-6 | Ar-6 |
| Ar-6 | Ar-3 | Ar-3 | Ar-6 |
| Ar-6 | Ar-3 | Ar-4 | Ar-6 |
| Ar-6 | Ar-3 | Ar-5 | Ar-6 |
| Ar-6 | Ar-3 | Ar-6 | Ar-6 |
| Ar-6 | Ar-4 | Ar-4 | Ar-6 |
| Ar-6 | Ar-4 | Ar-5 | Ar-6 |
| Ar-6 | Ar-4 | Ar-6 | Ar-6 |
| Ar-6 | Ar-5 | Ar-5 | Ar-6 |
| Ar-6 | Ar-5 | Ar-6 | Ar-6 |
| Ar-6 | Ar-6 | Ar-6 | Ar-6 |

$R^2$ and $R^5$ are preferably hydrogen, an alkyl group, a carbonyl group, an oxycarbonyl group, or an aryl group, but from the viewpoint of thermal stability, the alkyl group or hydrogen is preferable, and from the viewpoint of availability of a narrow half-width in an emission spectrum, hydrogen is more preferable.

$R^8$ and $R^9$ are preferably an alkyl group, an aryl group, a heteroaryl group, fluorine, a fluorine-containing alkyl group, a fluorine-containing heteroaryl group or a fluorine-containing aryl group, and more preferably fluorine or the fluorine-containing aryl group because of stability against an excitation light, and a higher fluorescent quantum yield. Fluorine is more preferable because of easy synthesis.

Herein, the fluorine-containing aryl group refers to an aryl group containing fluorine, and examples of the fluorine-containing aryl group include a fluorophenyl group, a trifluoromethylphenyl group, a pentafluorophenyl group, and the like. The fluorine-containing heteroaryl group refers to a heteroaryl group containing fluorine, and examples of the fluorine-containing heteroaryl group include a fluoropyridyl group, a trifluoromethylpyridyl group, a trifluoropyridyl group, and the like. The fluorine-containing alkyl group refers to an alkyl group containing fluorine, and examples of the fluorine-containing alkyl group include a trifluoromethyl group, a pentafluoroethyl group, and the like.

X is preferably C—$R^7$ from the viewpoint of light stability.

When X is C—$R^7$, the substituent $R^7$ greatly affects durability of the compound represented by general formula (3), i.e. time-dependent decrease in emission intensity. That means, when $R^7$ is hydrogen, this hydrogen has a high reactivity, and easily reacts with water and oxygen in air to cause decomposition. In addition, when $R^7$ is e.g. a substituent having a high motional freedom degree of a molecular chain, such as an alkyl group, indeed the reactivity is decreased, but the compounds aggregate in the composition over time, resulting in decrease in the emission intensity due to concentration quenching. Thus, $R^7$ is preferably a rigid group having a low motional freedom degree and hardly causing aggregation, and specifically $R^7$ is preferably either a substituted or unsubstituted aryl group, or a substituted or unsubstituted heteroaryl group.

It is preferable that X is C—$R^7$, and $R^7$ is a substituted or unsubstituted aryl group from the viewpoint of a higher fluorescent quantum yield and difficulty in thermal decomposition, and light stability. The aryl group is preferably a phenyl group, a biphenyl group, a terphenyl group, a naphthyl group, a fluorenyl group, a phenanthryl group, an anthracenyl group from the viewpoint that an emission wavelength is not impaired.

Furthermore, twist of $R^7$ and the carbon-carbon bond of the pyromethene skeleton should be appropriately suppressed for improving the light stability. If the twist is excessive, the light stability is decreased, e.g. the reactivity to the excitation light is increased. From such a viewpoint, $R^7$ is preferably a substituted or unsubstituted phenyl group, a substituted or unsubstituted biphenyl group, a substituted or unsubstituted terphenyl group, or a substituted or unsubstituted naphthyl group, more preferably the substituted or unsubstituted phenyl group, the substituted or unsubstituted biphenyl group, or the substituted or unsubstituted terphenyl group. The substituted or unsubstituted phenyl group is particularly preferable.

In addition, $R^7$ is preferably a moderately bulky substituent. When $R^7$ has a certain bulkiness, molecular aggregation can be prevented, so that the light-emitting efficiency and durability are further improved.

More preferable examples of such a bulky substituent include a structure represented by the following general formula (4).

[Formula 5]

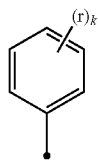

(4)

r is selected from a group consisting of hydrogen, an alkyl group, a cycloalkyl group, a heterocyclic group, an alkenyl group, a cycloalkenyl group, an alkynyl group, a hydroxyl group, a thiol group, an alkoxy group, an alkylthio group, an aryl ether group, an aryl thioether group, an aryl group, a heteroaryl group, a halogen, a cyano group, an aldehyde group, a carbonyl group, a carboxyl group, an oxycarbonyl group, a carbamoyl group, an amino group, a nitro group, a silyl group, a siloxanyl group, a boryl group, and a phosphine oxide group. k represents an integer of 1 to 3. When k represents 2 or larger, each r may be the same or different.

r is preferably a substituted or unsubstituted aryl group in view of giving a higher fluorescent quantum yield. Particularly preferable examples of the aryl group include a phenyl group and a naphthyl group. When r is an aryl group, k in general formula (4) represents preferably 1 or 2, and more preferably 2 from the viewpoint of further preventing molecular aggregation. Furthermore, it is preferable that at least one of r is substituted with an alkyl group. Particular preferable examples of the alkyl group in this case include a methyl group, an ethyl group and a tert-butyl group from the viewpoint of thermal stability.

In terms of controlling a fluorescent wavelength or an absorption wavelength or increasing a compatibility with a solvent, r is preferably a substituted or unsubstituted alkyl group, a substituted or unsubstituted alkoxy group, or a halogen, more preferably a methyl group, an ethyl group, a tert-butyl group, or a methoxy group. From the viewpoint of dispersibility, the tert-butyl group and the methoxy group are particularly preferable, which prevent quenching due to aggregation of molecules.

In addition, as another aspect of the compound represented by general formula (3), at least one of $R^1$ to $R^7$ is preferably an electroattracting group. In particular, it is preferable that (1) at least one of $R^1$ to $R^6$ is an electroattracting group, (2) $R^7$ is an electron withdrawing group, or (3) at least one of $R^1$ to $R^6$ is an electroattracting group and $R^7$ is an electroattracting group. An electron density of a pyromethene skeleton can be significantly decreased by introducing an electroattracting group into the pyromethene skeleton. Thereby, the stability to oxygen and the durability can be further improved.

The electroattracting group is also referred to as an electron-accepting group, which is an atomic group attracting electrons from a substituted atomic group by an inductive effect or a resonance effect in the organic electronic theory. The electroattracting group can be exemplified by a group having a positive value as a Hammett's substituent constant (σp (para)). The Hammett's substituent constant (σp (para)) can be cited from the Chemical Handbook, Basic Edition, the fifth revised version (Chapter II, p. 380).

Although the phenyl group also has a positive value in some cases, the electroattracting group according to the present application contains no phenyl group.

Examples of the electroattracting group include —F (σp: +0.20), —Cl (σp: +0.28), —Br (σp: +0.30), —I (σp: +0.30), —CO$_2$R$^{12}$ (σp: +0.45 with the proviso that R$^{12}$ is an ethyl group), —CONH$_2$ (σp: +0.38), —COR$^{12}$ (σp: +0.49 with the proviso that R$^{12}$ is a methyl group), —CF$_3$ (σp: +0.51), —SO$_2$R$^{12}$ (σp: +0.69 with the proviso that R$^{12}$ is a methyl group), —NO$_2$ (σp: +0.81), and the like. Each R$^{12}$ independently represents hydrogen atom, a substituted or unsubstituted aromatic hydrocarbon group having 6 to 30 ring-forming carbon atoms, a substituted or unsubstituted heterocyclic group having 5 to 30 ring-forming atoms, a substituted or unsubstituted alkyl group having 1 to 30 carbon atoms, or a substituted or unsubstituted cycloalkyl group having 1 to 30 carbon atoms. Specific examples of each of these groups are the same as described above.

Preferable examples of the electroattracting group include fluorine, a fluorine-containing aryl group, a fluorine-containing heteroaryl group, a fluorine-containing alkyl group, a substituted or unsubstituted acyl group, a substituted or unsubstituted ester group, a substituted or unsubstituted amide group, and a substituted or unsubstituted sulfonyl group or cyano group. The reason for this is that these groups are hard to chemically decompose.

More preferable examples of the electroattracting groups include a fluorine-containing alkyl group, a substituted or unsubstituted acyl group, and a substituted or unsubstituted ester group or cyano group. The reason for this is that the groups can lead effects of preventing the concentration quenching and improving the luminescent quantum yield. The substituted or unsubstituted ester group is particularly preferable.

As another aspect of the compound represented by general formula (3), any m groups of $R^1$ to $R^7$ are preferably a group represented by the following general formula (5).

[Formula 6]

(5)

M is a linking group, and is selected from a single bond, an alkylene group, an arylene group, and a heteroarylene group.

Each $R^{10}$ is independently a substituted or unsubstituted alkyl group.

m and n independently represent a natural number.

—$OR^{10}$ is an alkoxy group, and bulkiness of —$OR^{10}$ can prevent quenching due to molecular aggregation. m represents 2 to 7. Preferably m represents 2 or larger because an aggregation inhibiting effect is improved, and more preferably m represents 3 or larger because the whole molecule can be covered with a bulky substituent, and therefore quenching due to molecular aggregation can be prevented to achieve a high light-emitting efficiency. More preferably, m represents 4 or larger.

In general formula (5), each n independently represents preferably 1 to 5, more preferably 1 to 3, even more preferably 1 from the viewpoint of improving the light-emitting efficiency of the light-emitting material.

When M is a group other than a single bond, the group serves as a spacer between the pyromethene skeleton and —$OR^{10}$. Since aggregation of the pyromethene skeletons is further suppressed, the case that there is the spacer between the pyromethene skeleton and —$OR^{10}$ is preferable. M is preferably selected from an alkylene group, an arylene group, and a heteroarylene group. Above all, the arylene group and the heteroarylene group which have a high rigidity are preferable, and the phenylene group is particularly preferable because twist of a carbon-carbon bond is not excessive.

Examples of $R^{10}$ include a methyl group, an ethyl group, an n-propyl group, an isopropyl group, an n-butyl group, a sec-butyl group, a tert-butyl group, a pentyl group, a hexyl group, and the like. Although not particularly limited, a methyl group is preferable in terms of easy synthesis.

From the viewpoint of improving the aggregation inhibiting effect, preferably at least two of $R^1$, $R^3$, $R^4$ and $R^6$ are groups represented by general formula (5), and more preferably at least three of $R^1$, $R^3$, $R^4$ and $R^6$ are groups represented by general formula (5). Furthermore, a case that all of $R^1$, $R^3$, $R^4$ and $R^6$ are groups represented by general formula (5) is particularly preferable because the whole molecule can be covered with a bulky substituent.

From the viewpoint of difficulty in thermal decomposition and light stability, $R^7$ is preferably a group represented by general formula (4) or a group represented by general formula (5).

Another particular preferable example of the compound represented by general formula (3) is a case that all of $R^1$, $R^3$, $R^4$ and $R^6$ may be the same or different and are selected from the Ar-1 to Ar-6, furthermore X is C—$R^7$, and $R^7$ is a substituted aryl group, particularly preferably an aryl group substituted with a methoxy group.

Examples of the compound represented by general formula (3) are presented below, but are not limited the following examples.

[Formula 7]

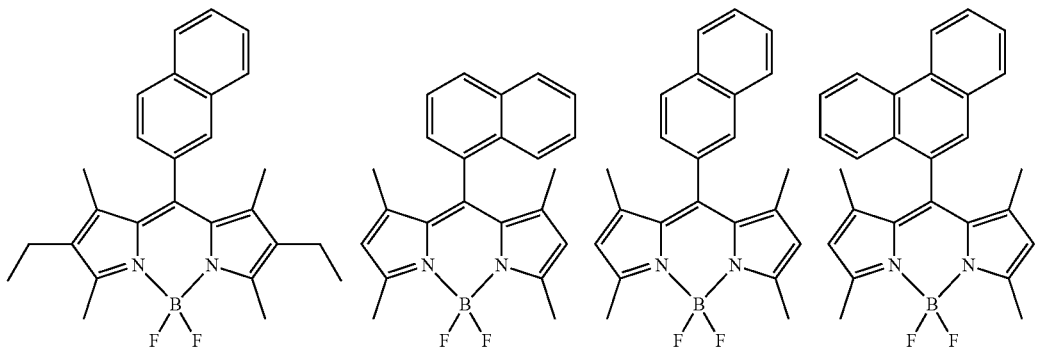

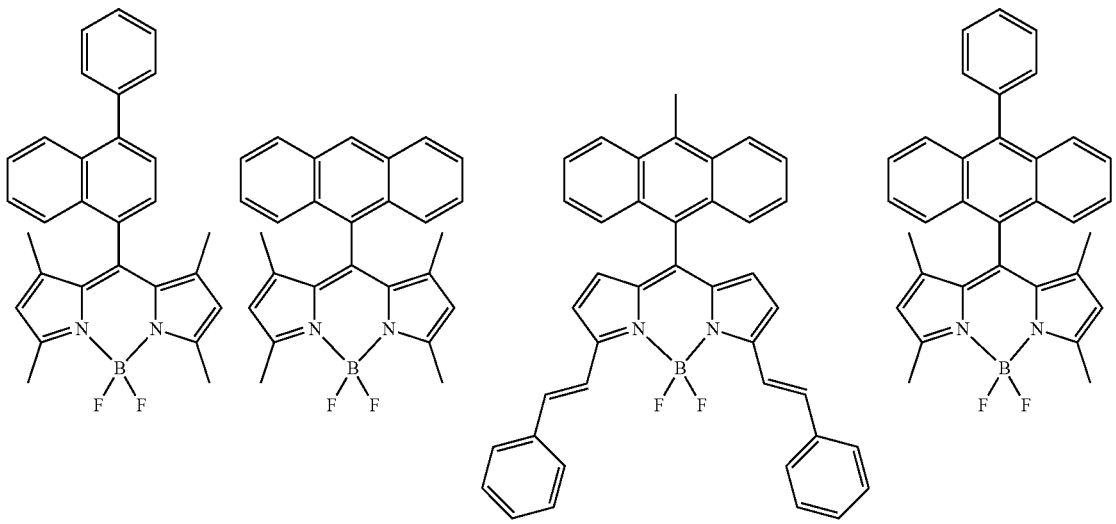

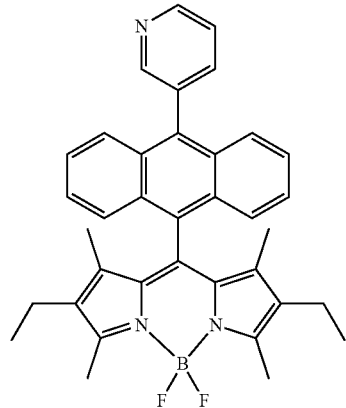 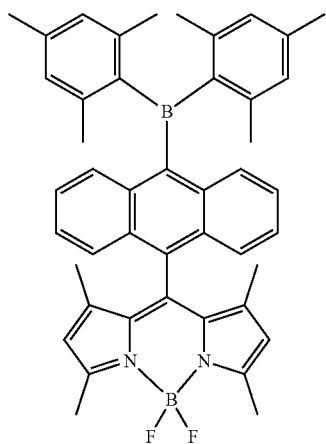 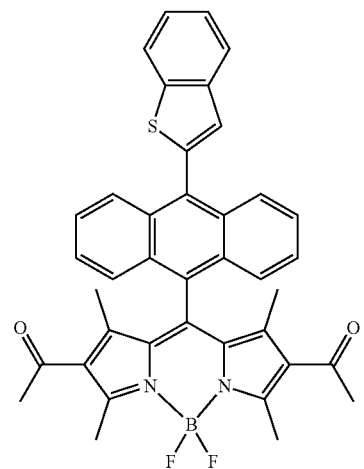
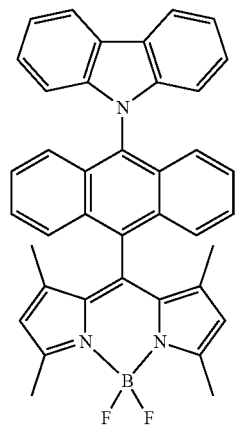
[Formula 8]
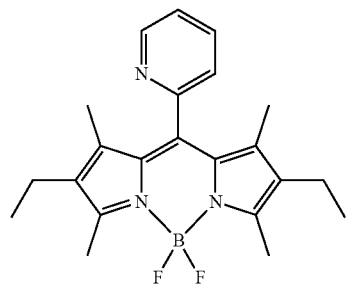 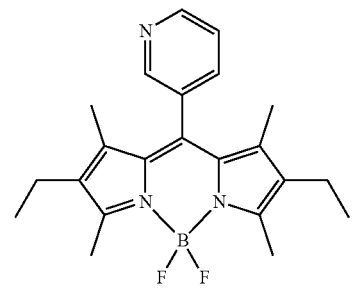 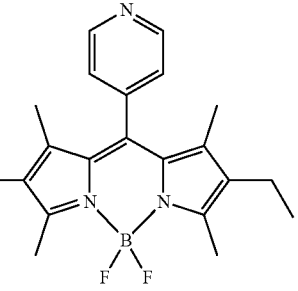
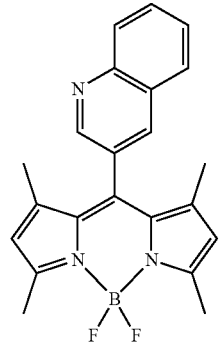 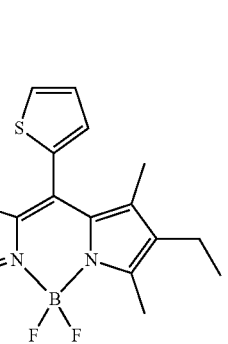 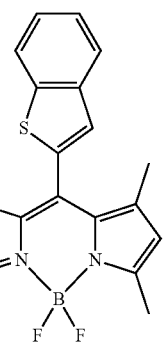 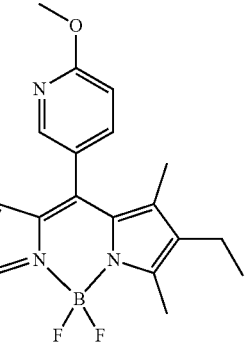

-continued
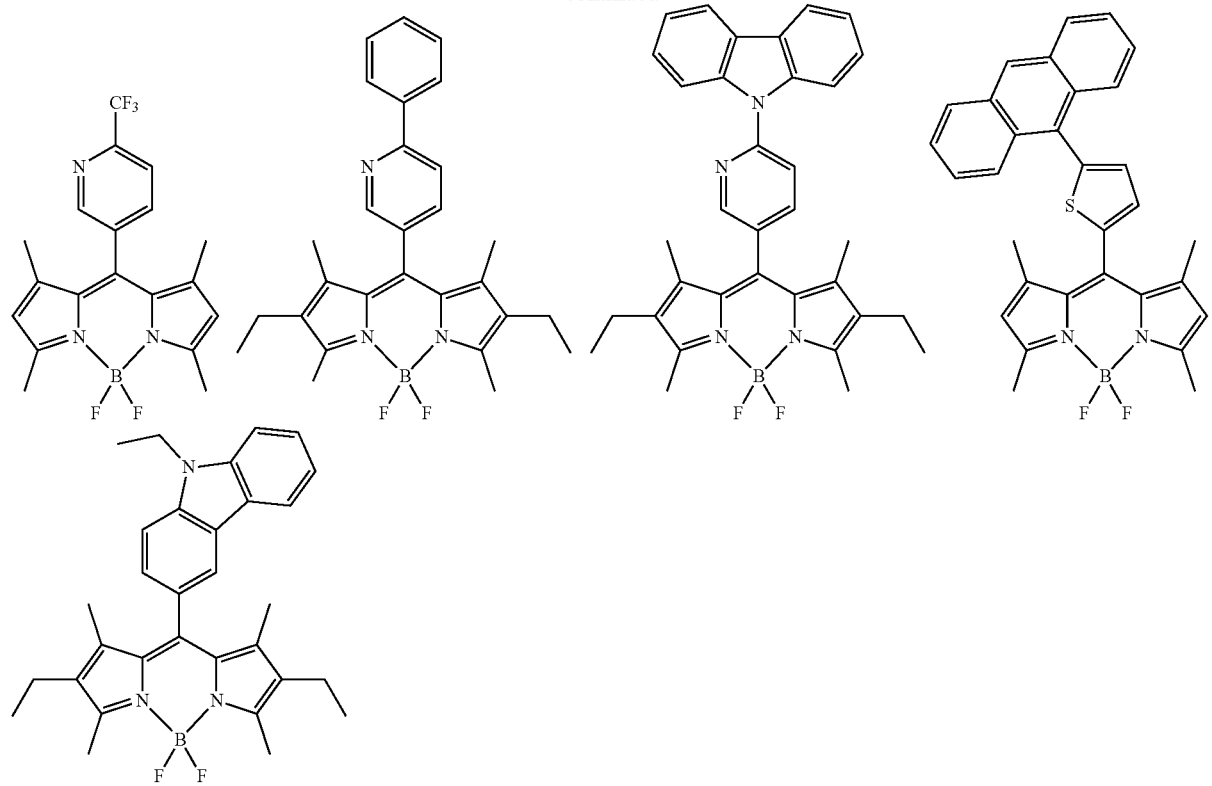
[Formula 9]
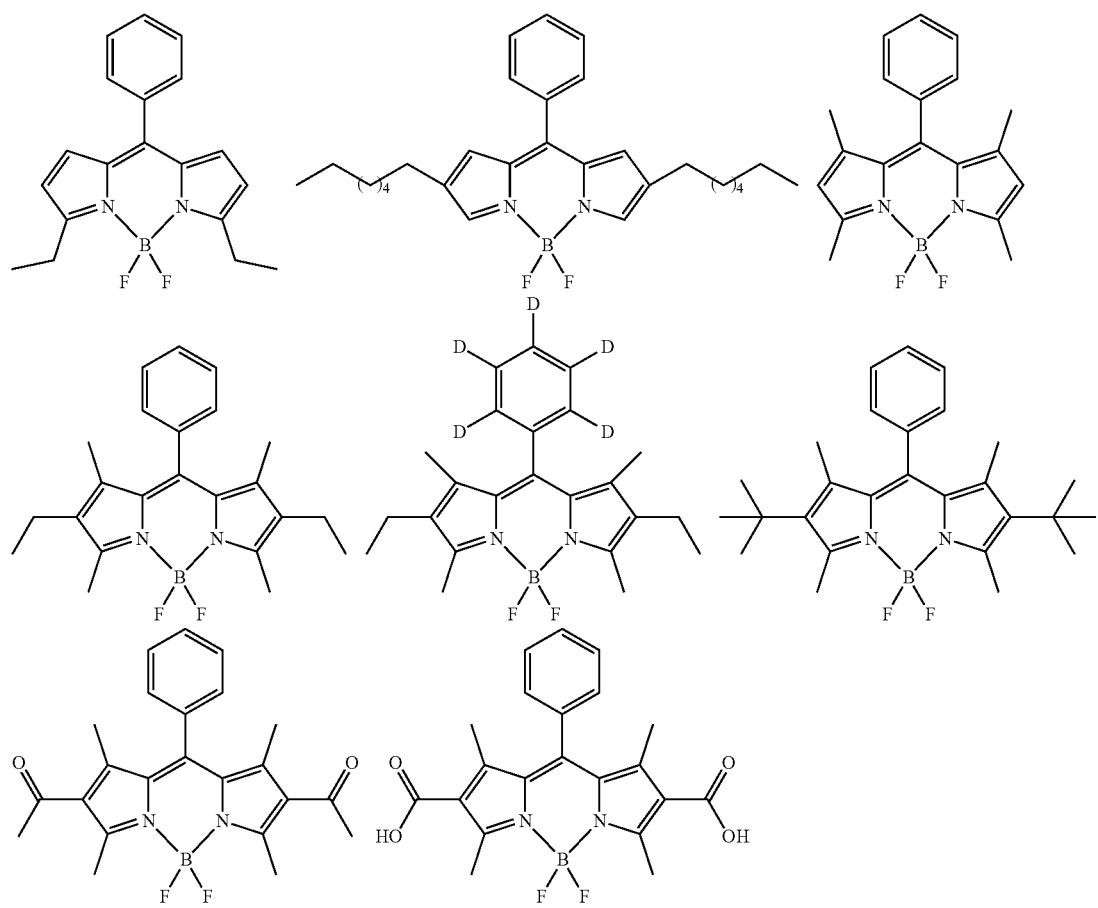

-continued
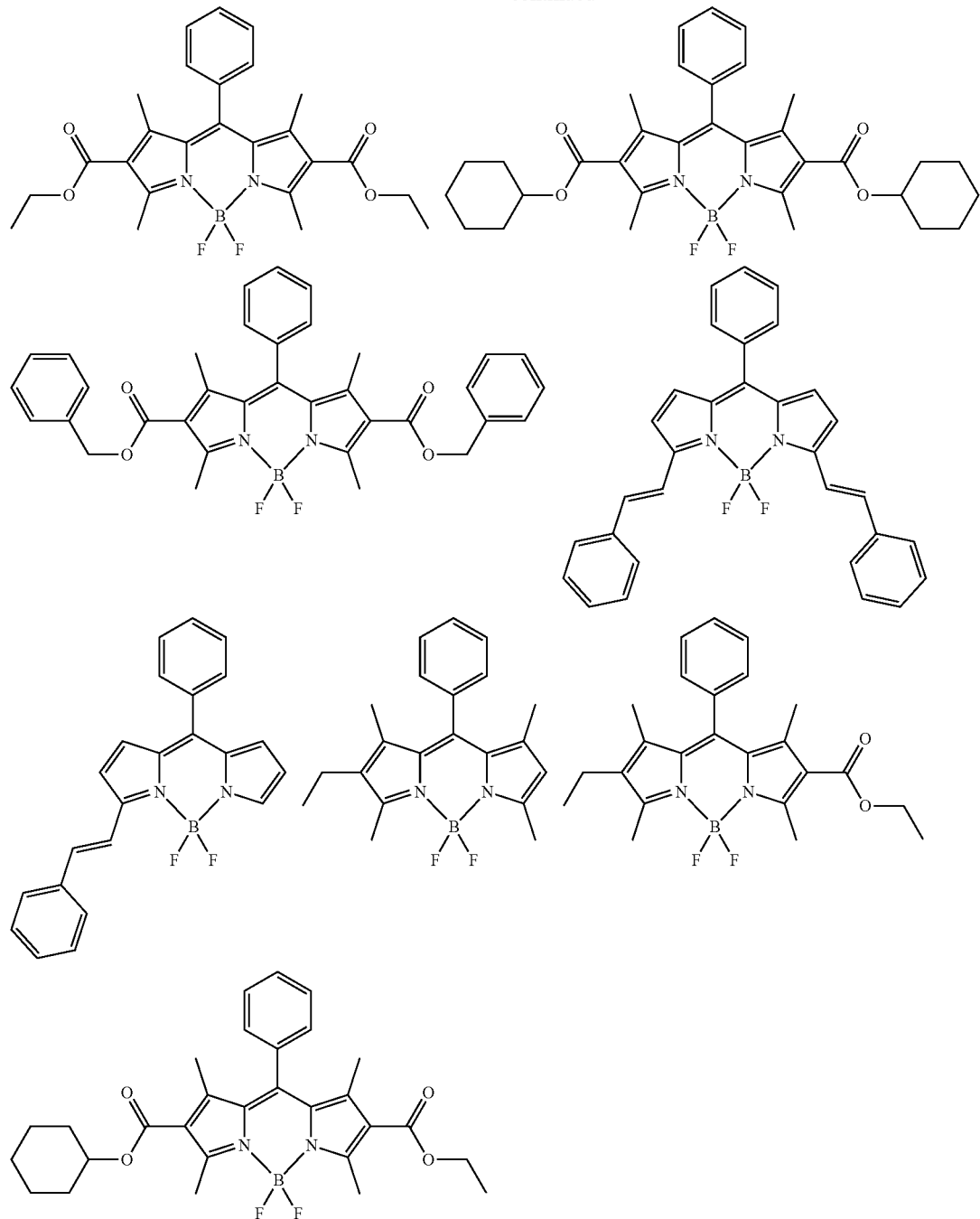
[Formula 10]
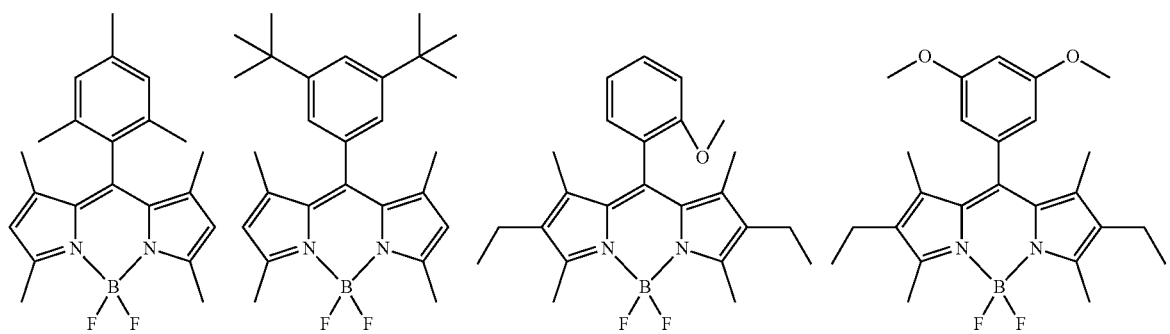

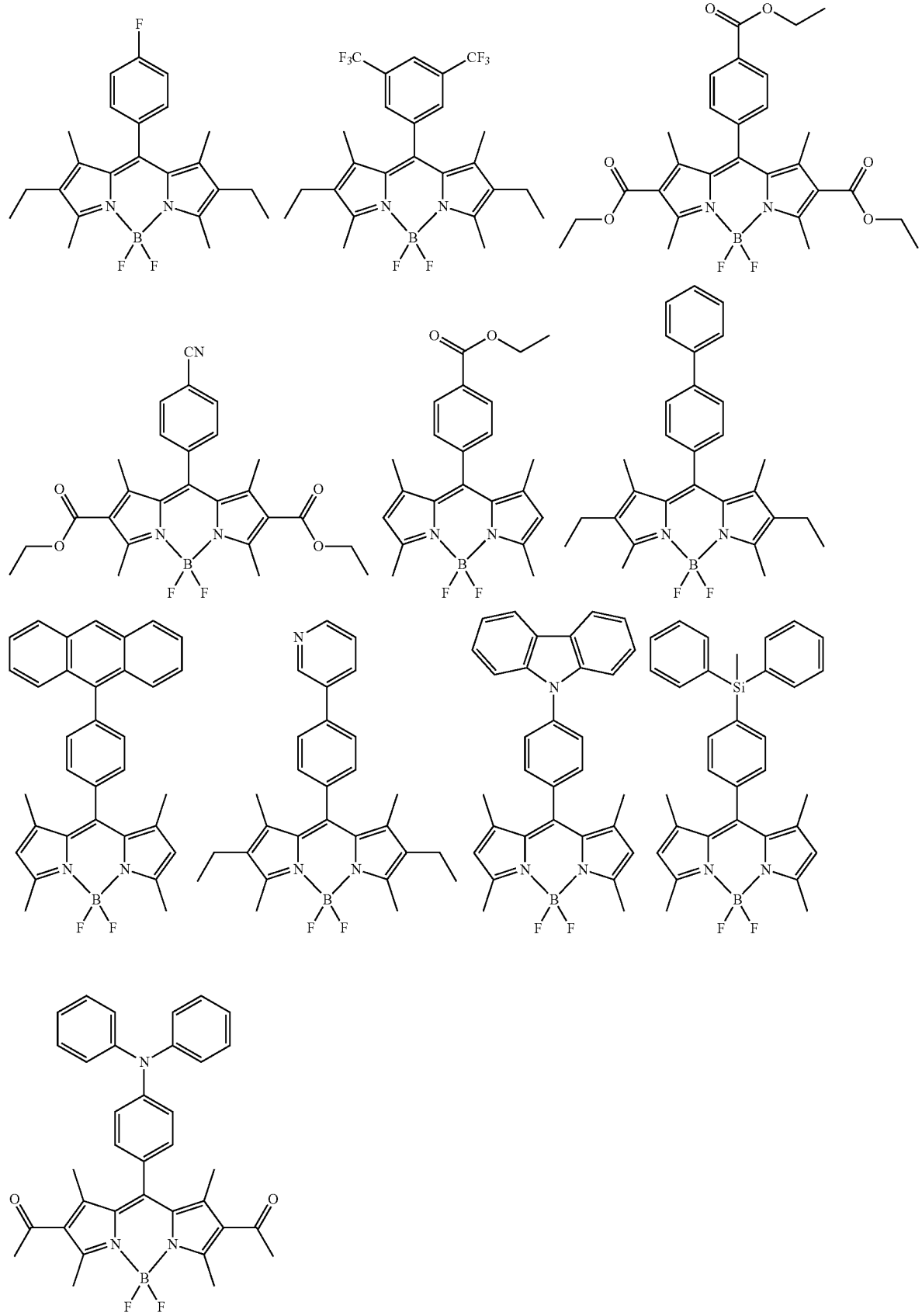

-continued
[Formula 11]
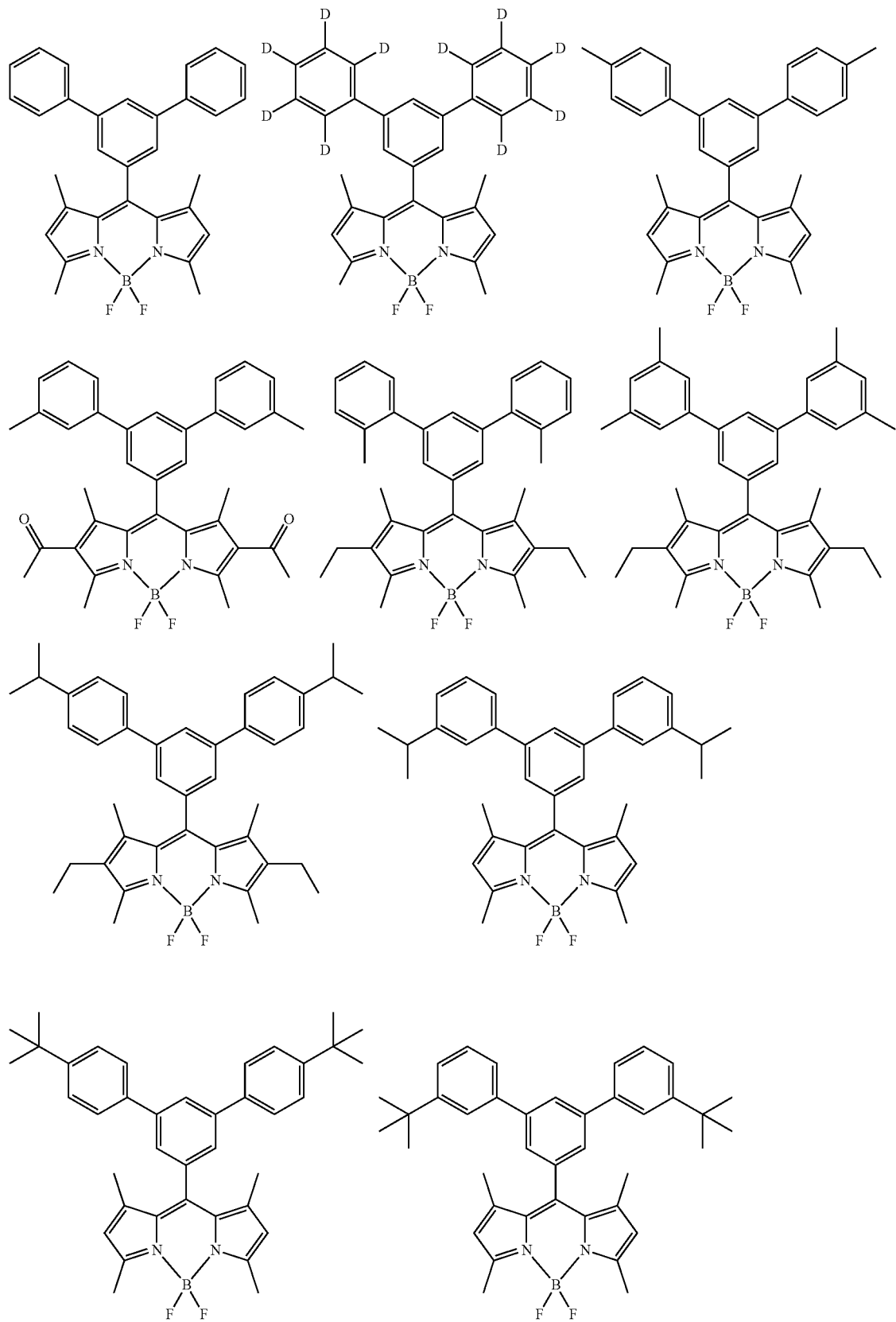

-continued
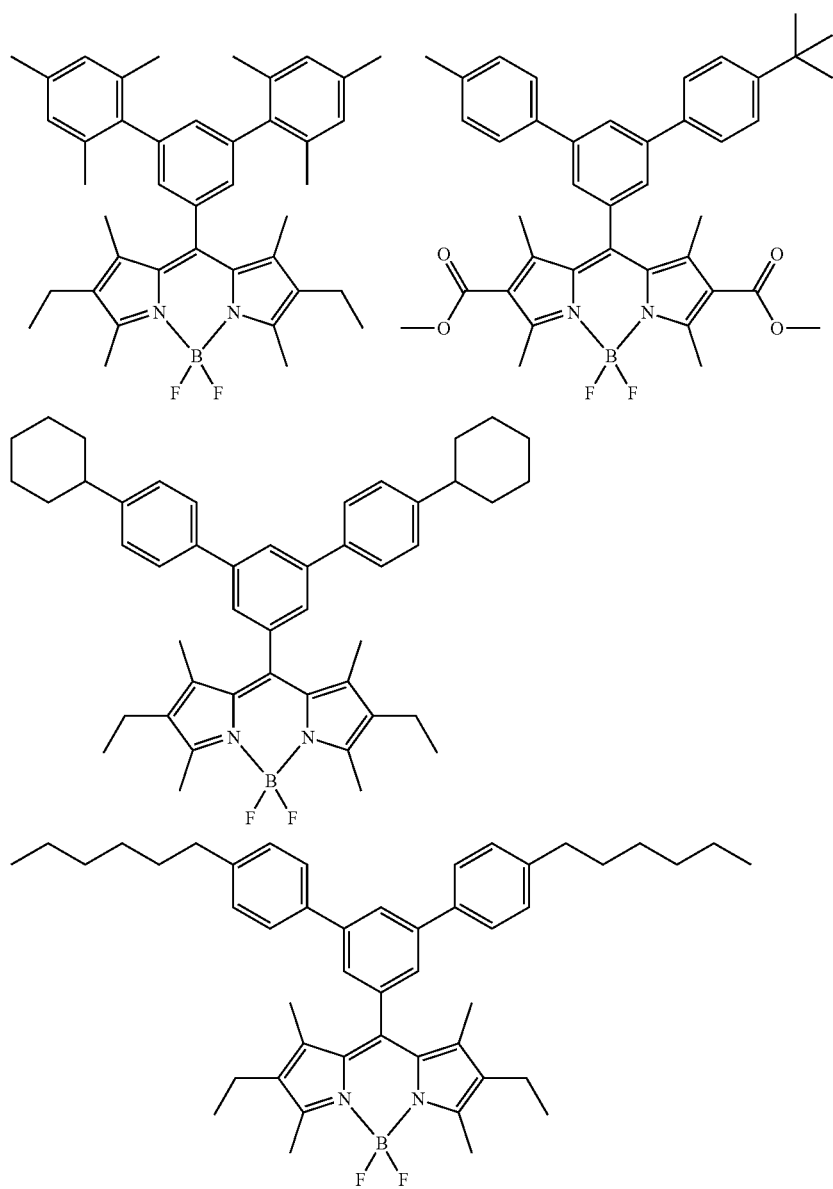
[Formula 12]
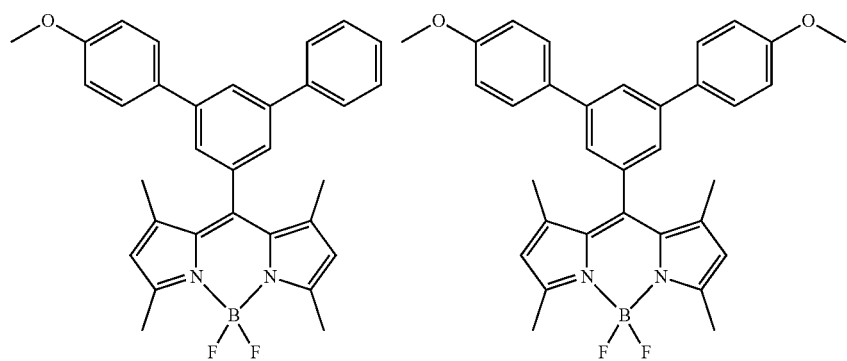

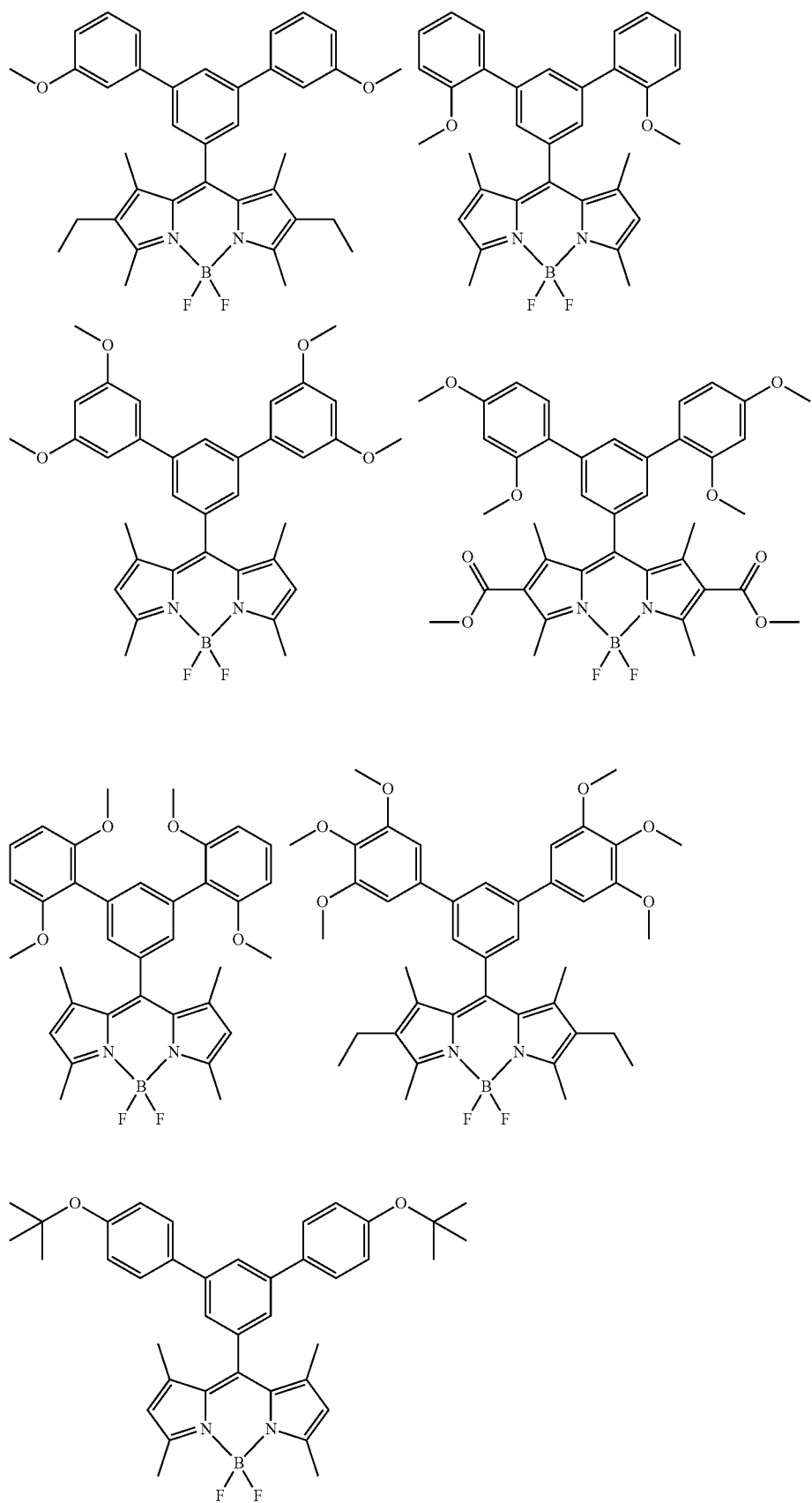

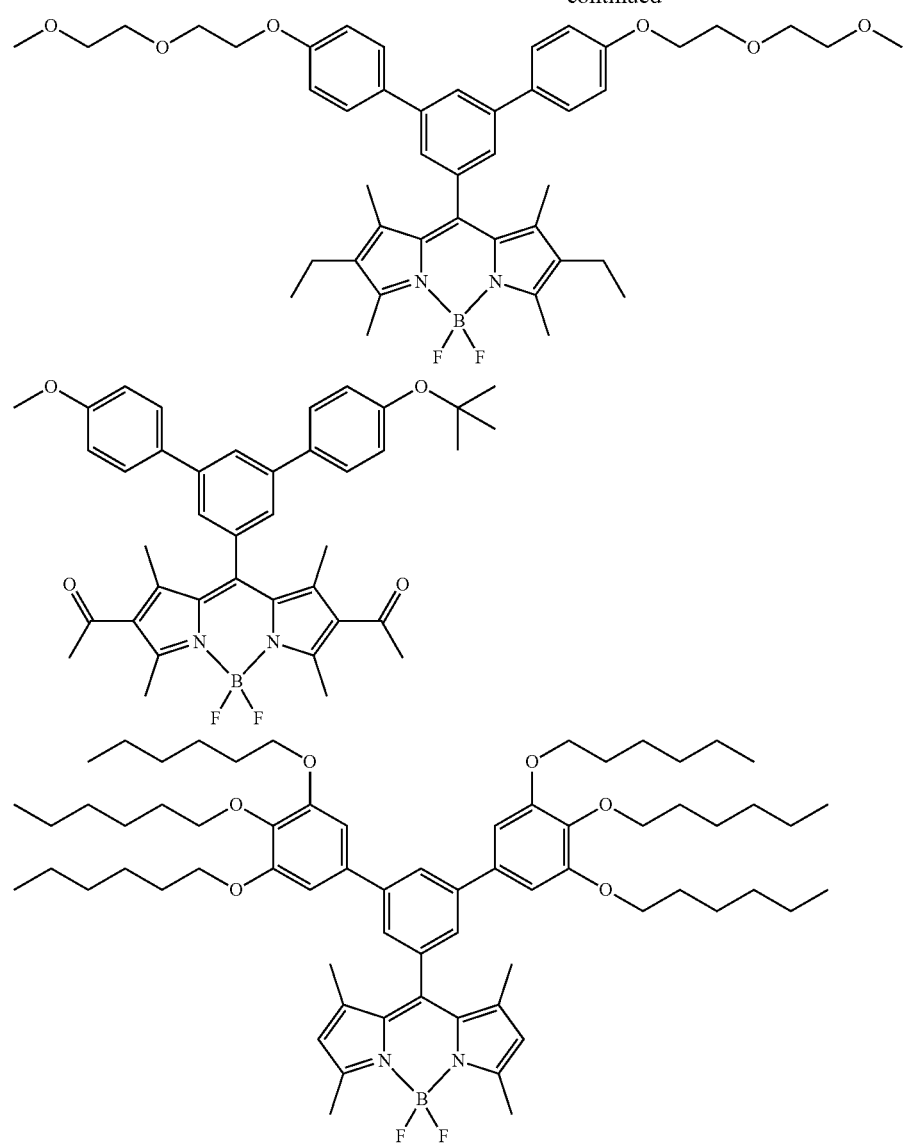
[Formula 13]
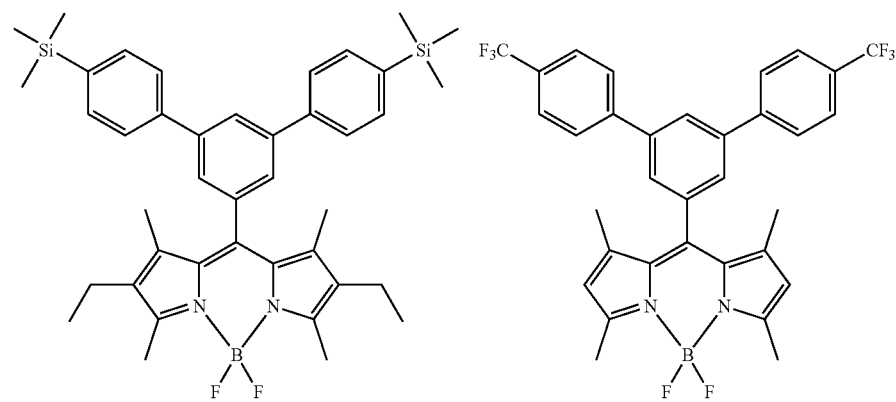

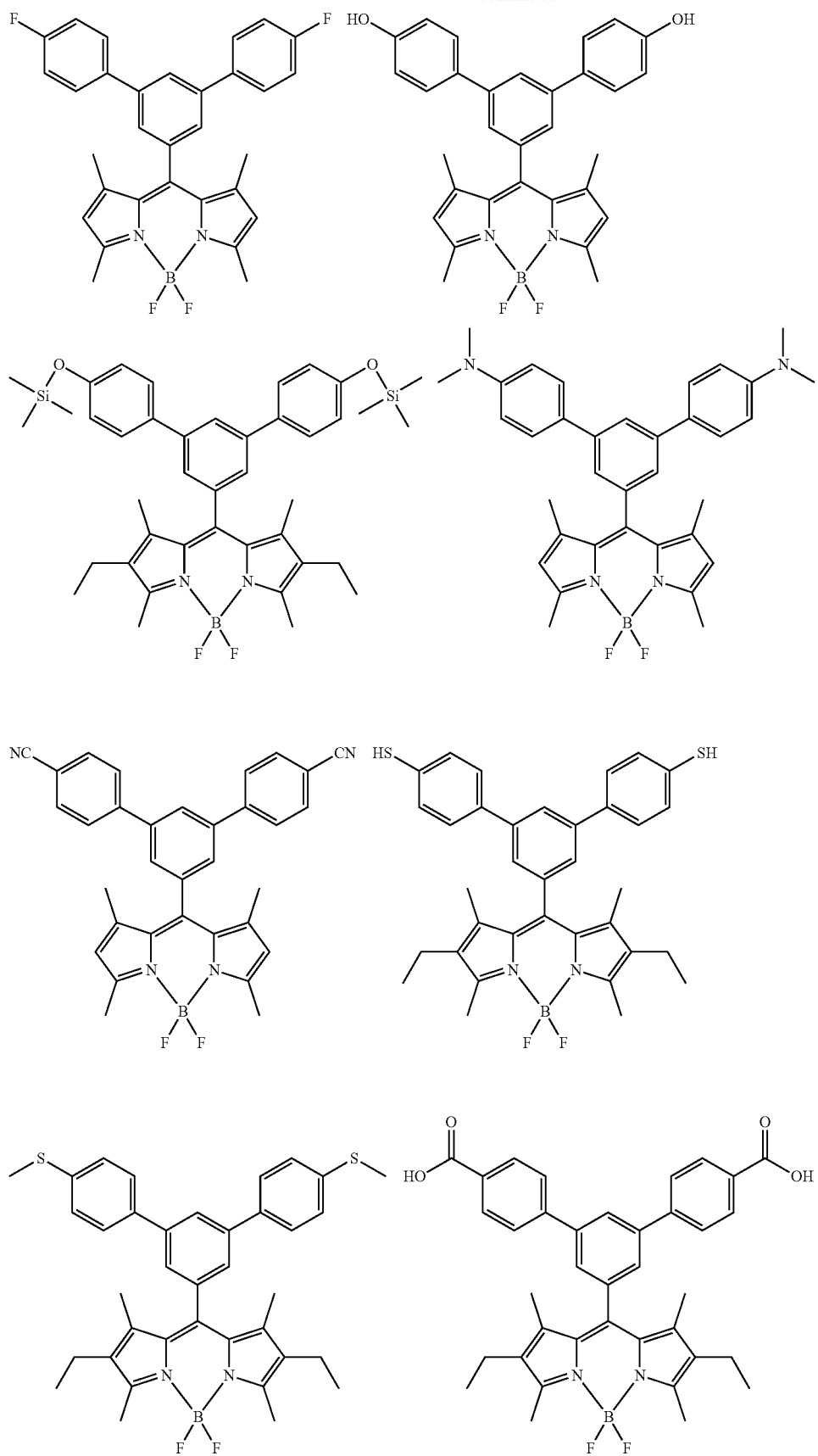

-continued
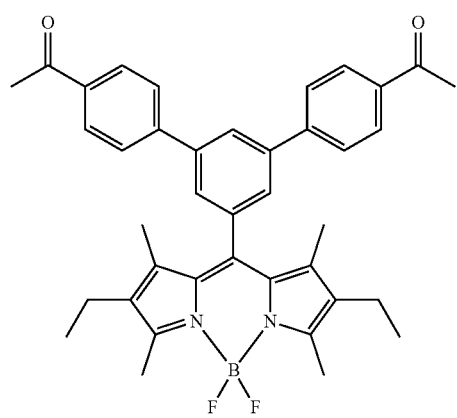
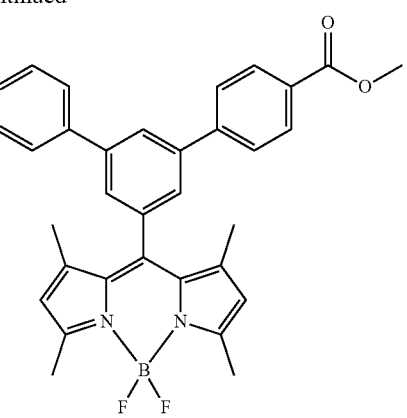
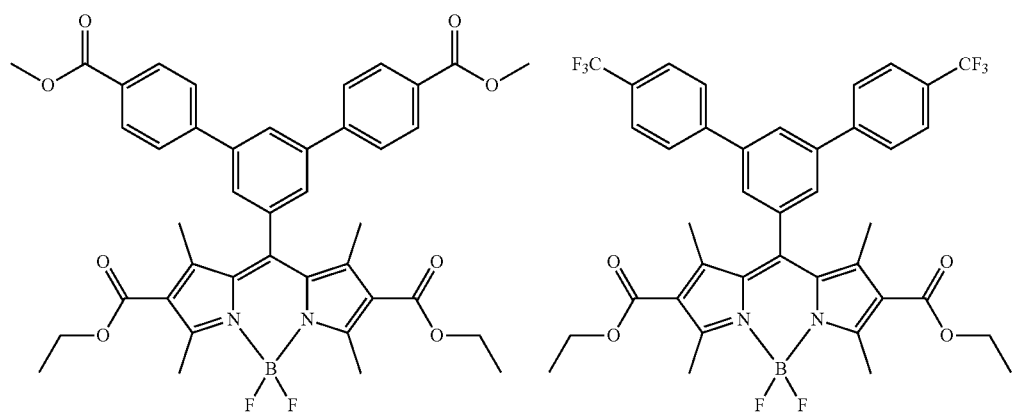
[Formula 14]
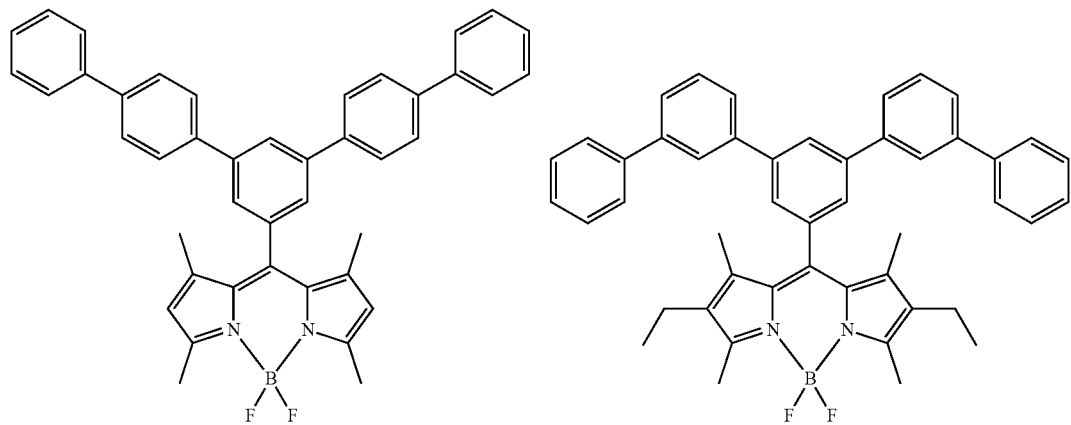

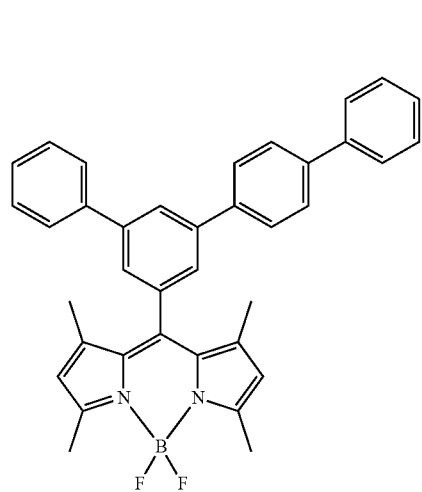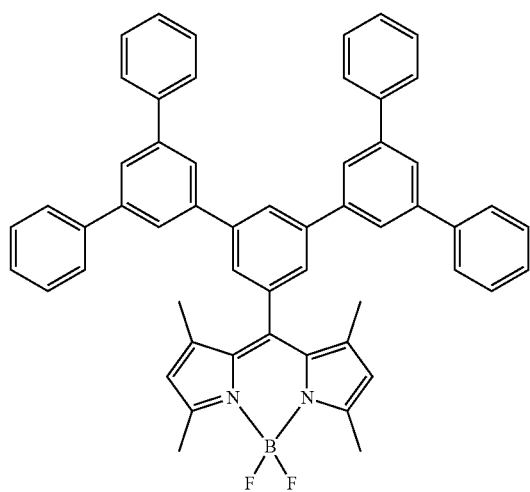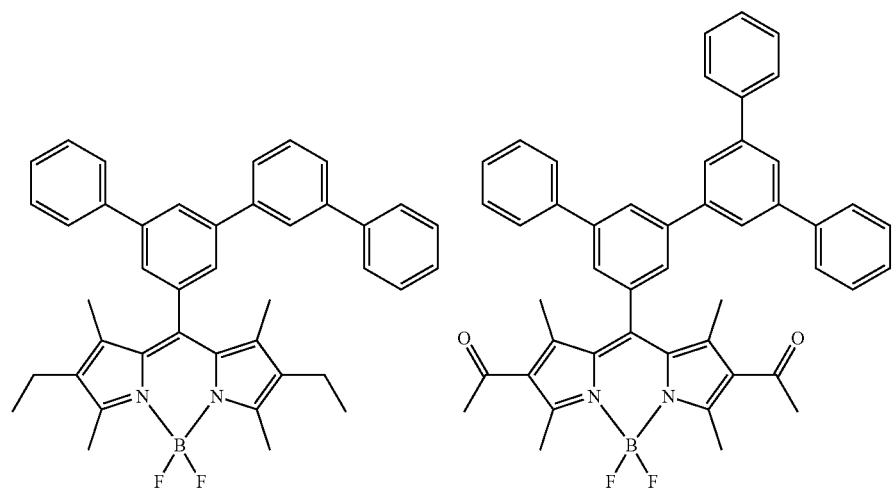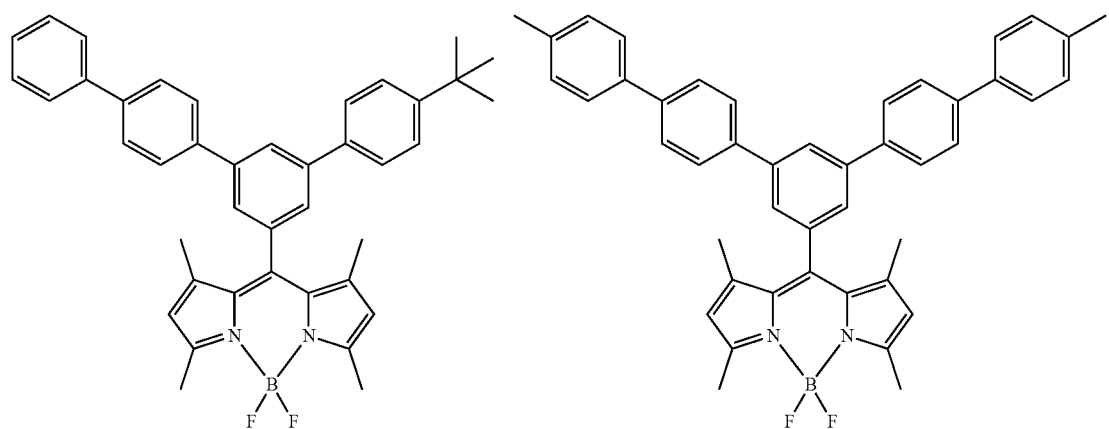

-continued
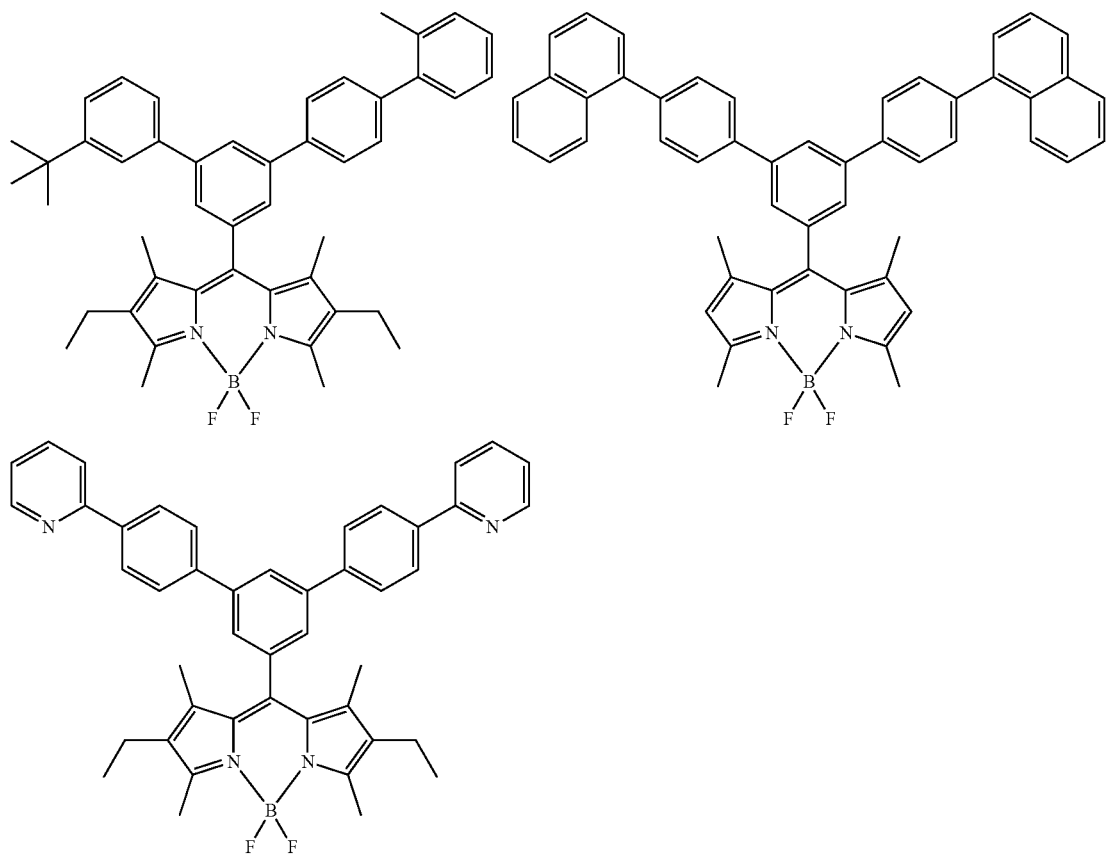
[Formula 15]
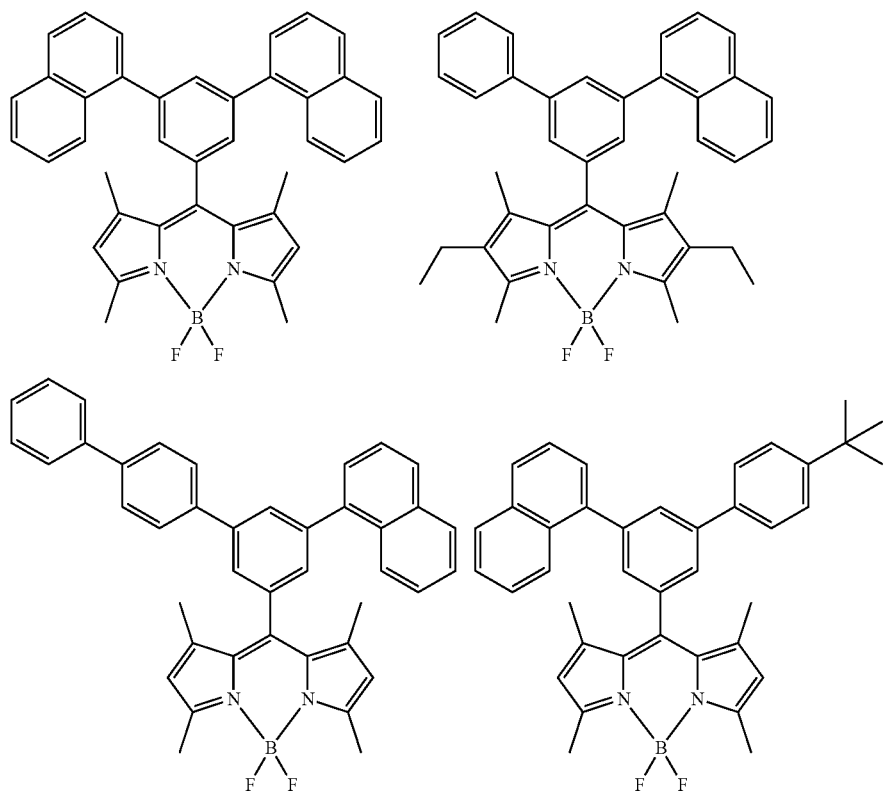

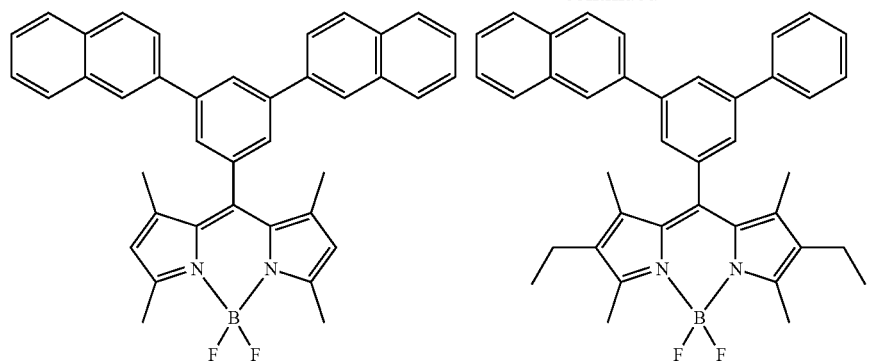
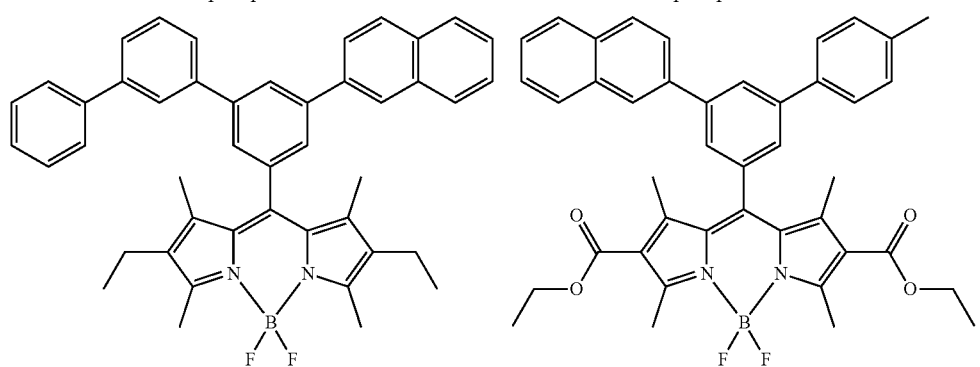
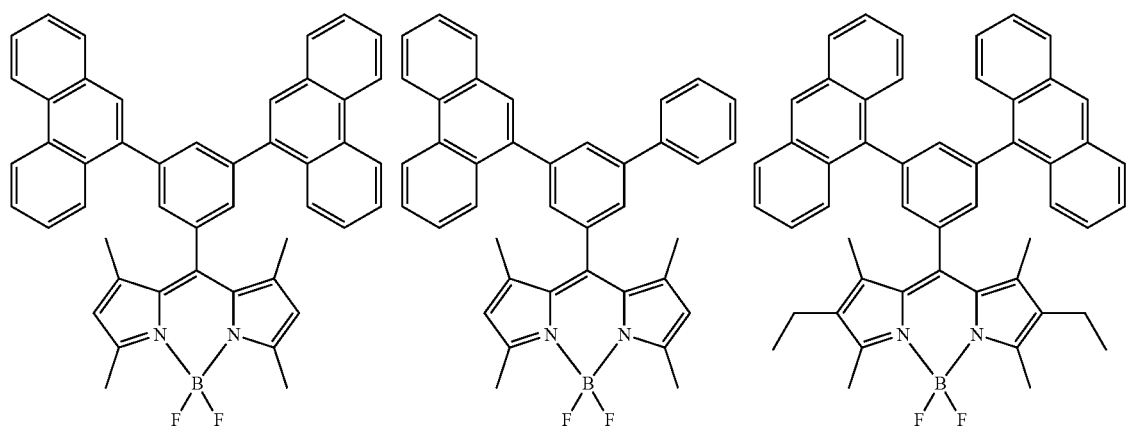
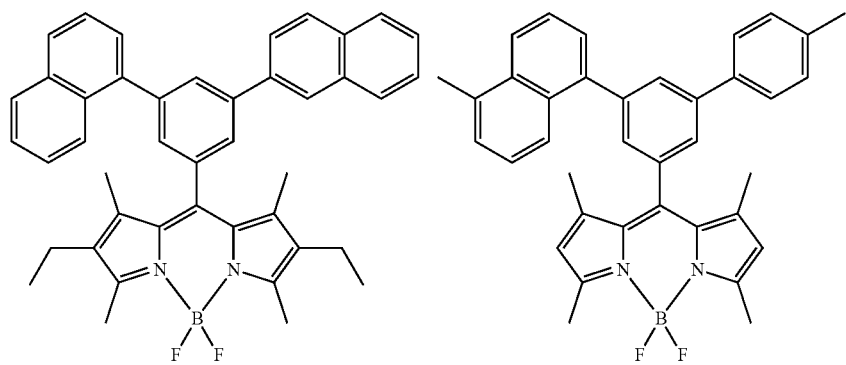

-continued
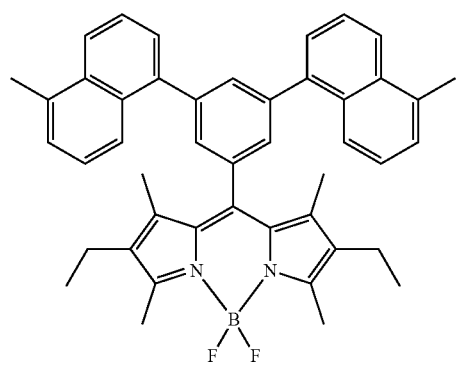
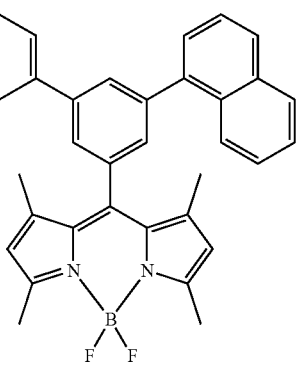
[Formula 16]
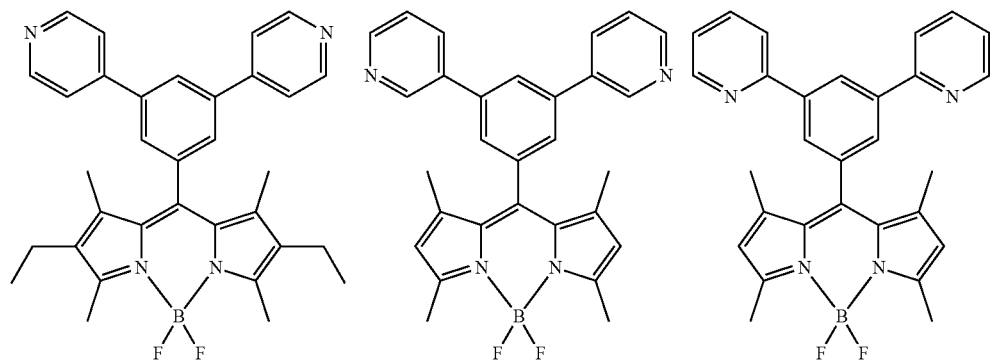
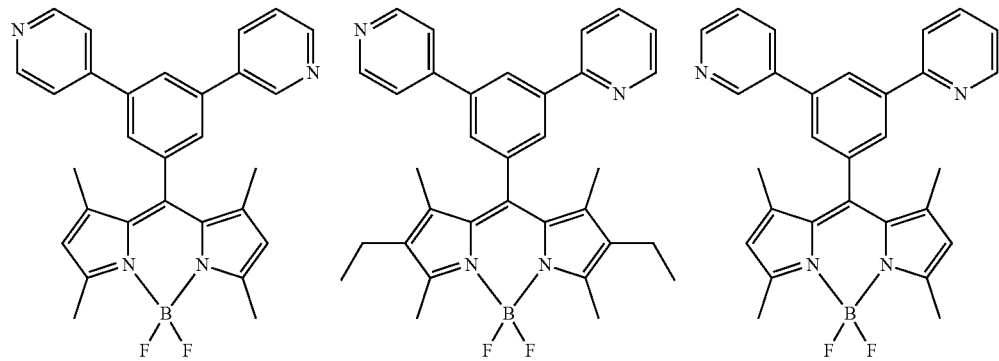
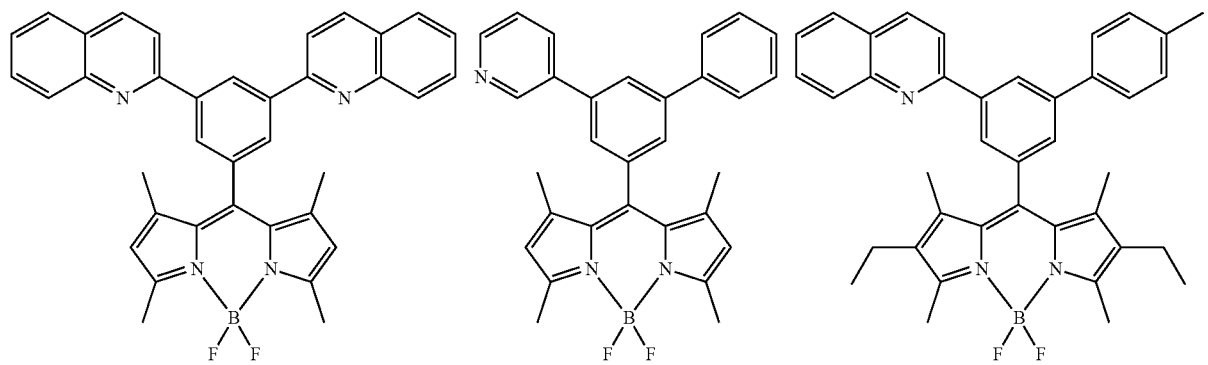

-continued
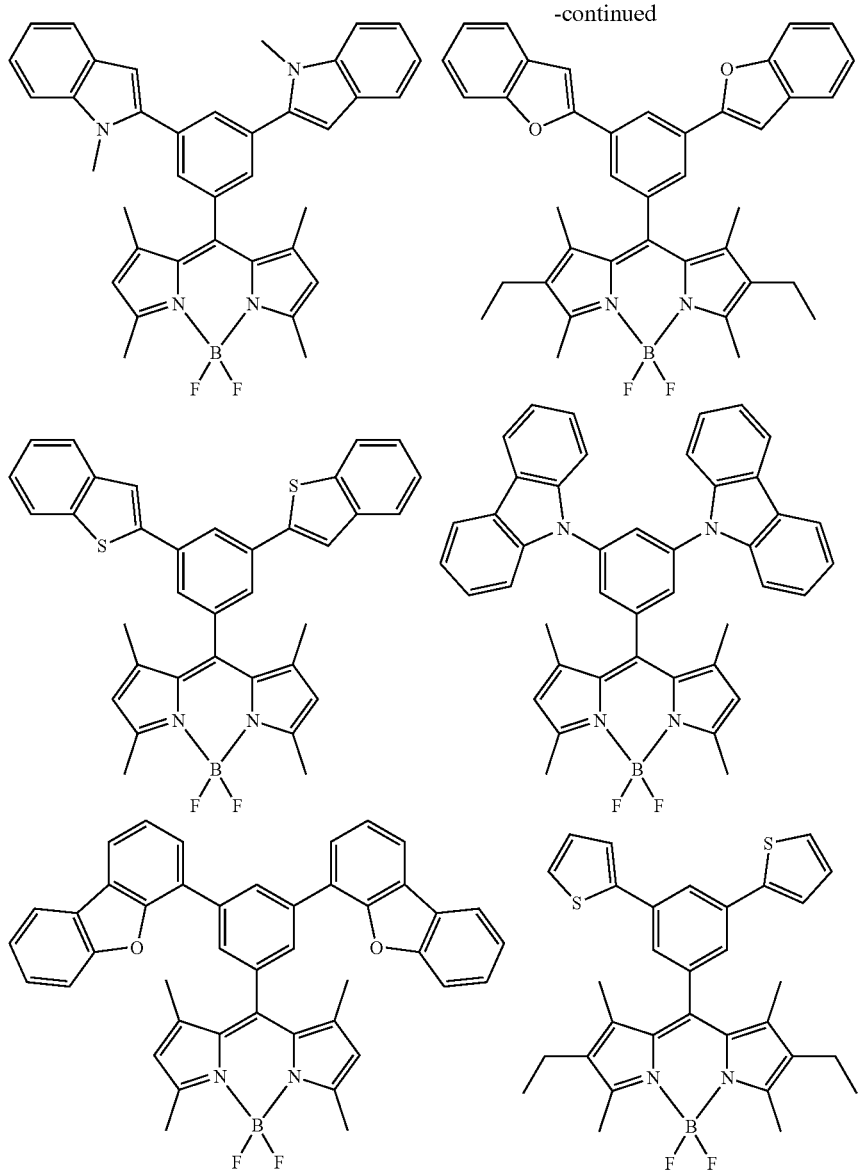
[Formula 17]
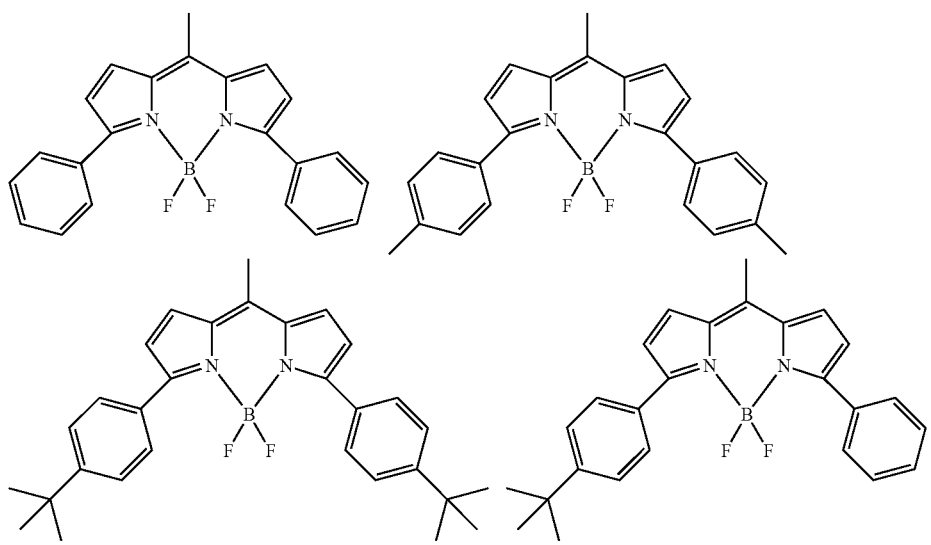

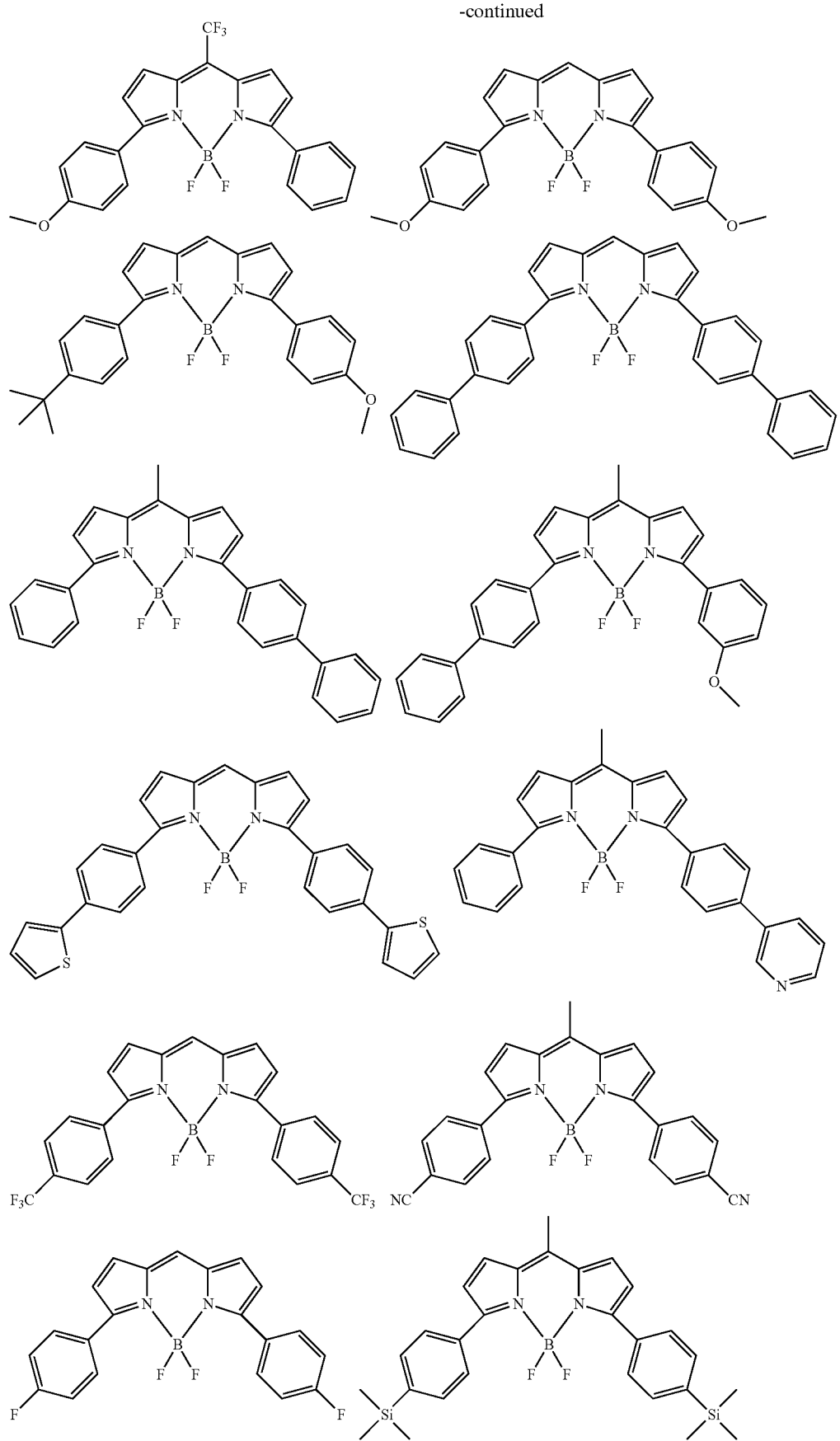

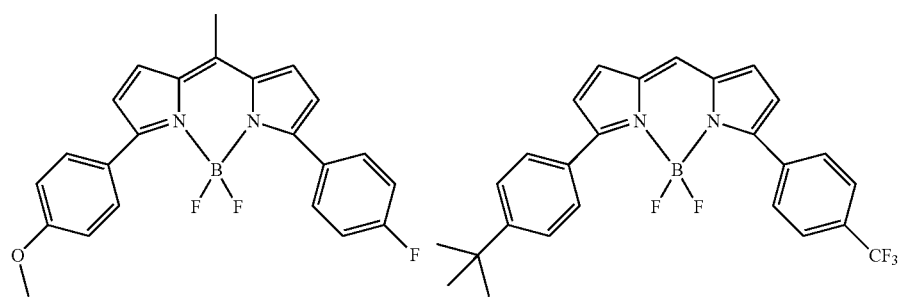
[Formula 18]
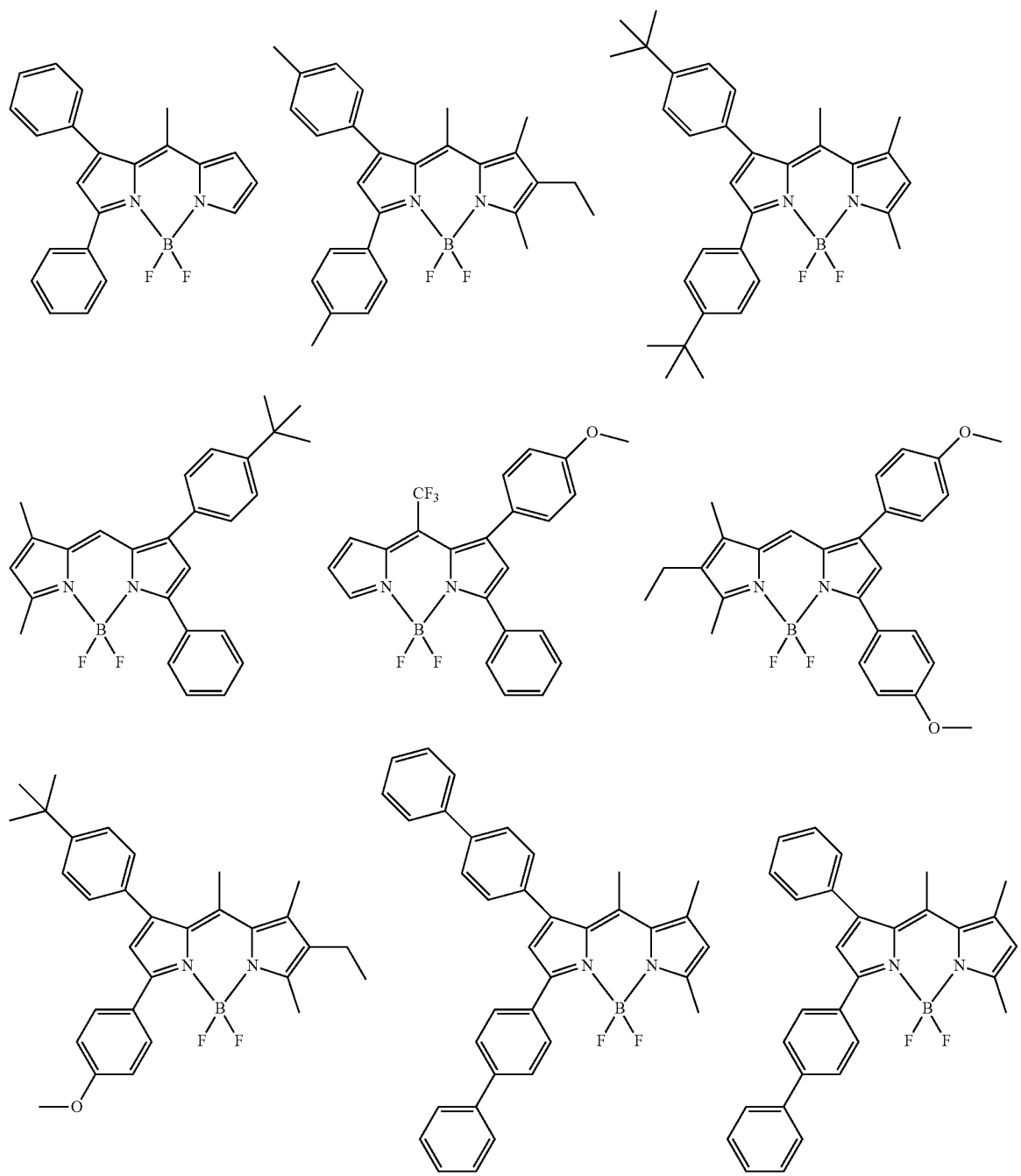

-continued
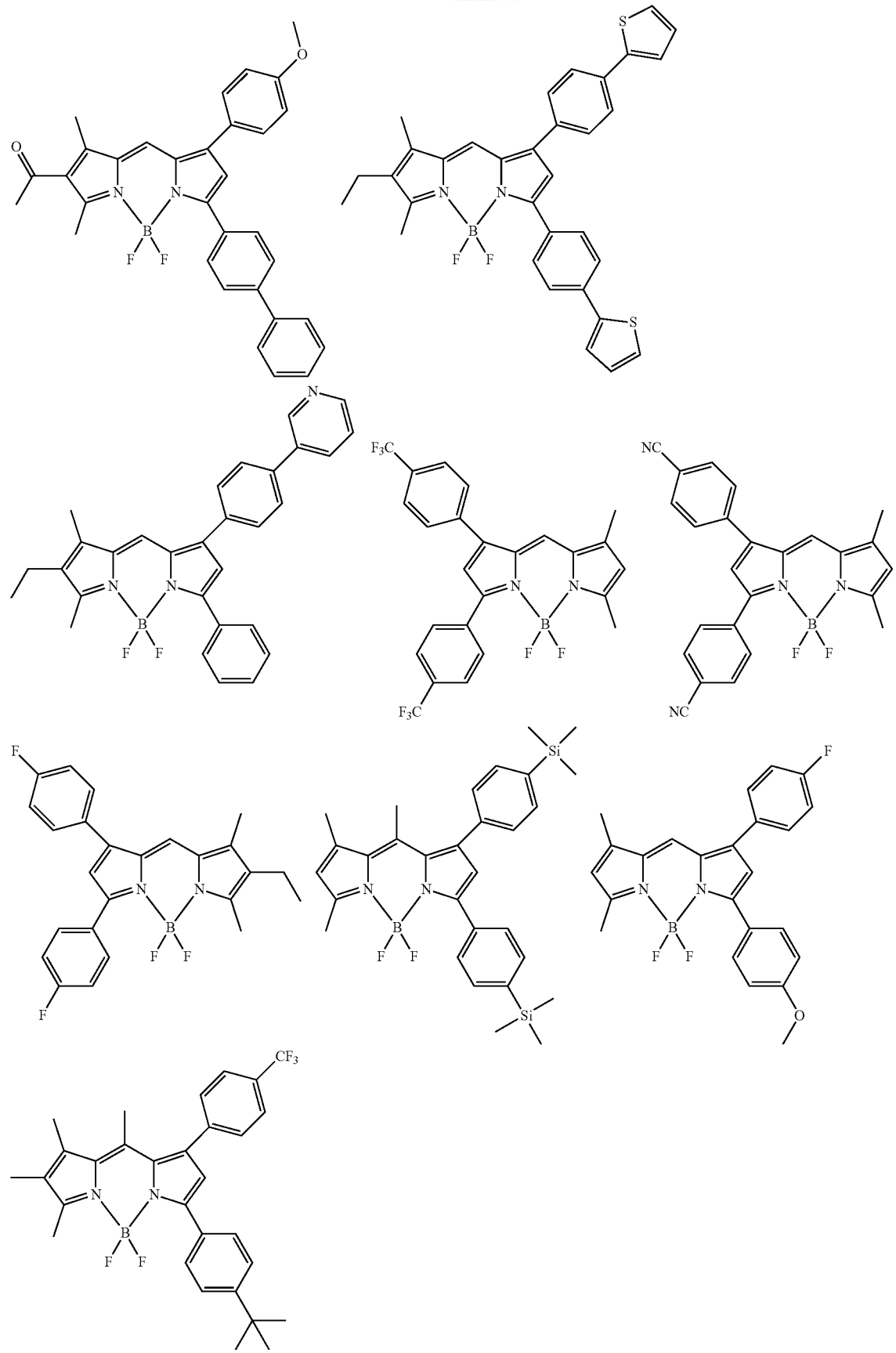

[Formula 19]
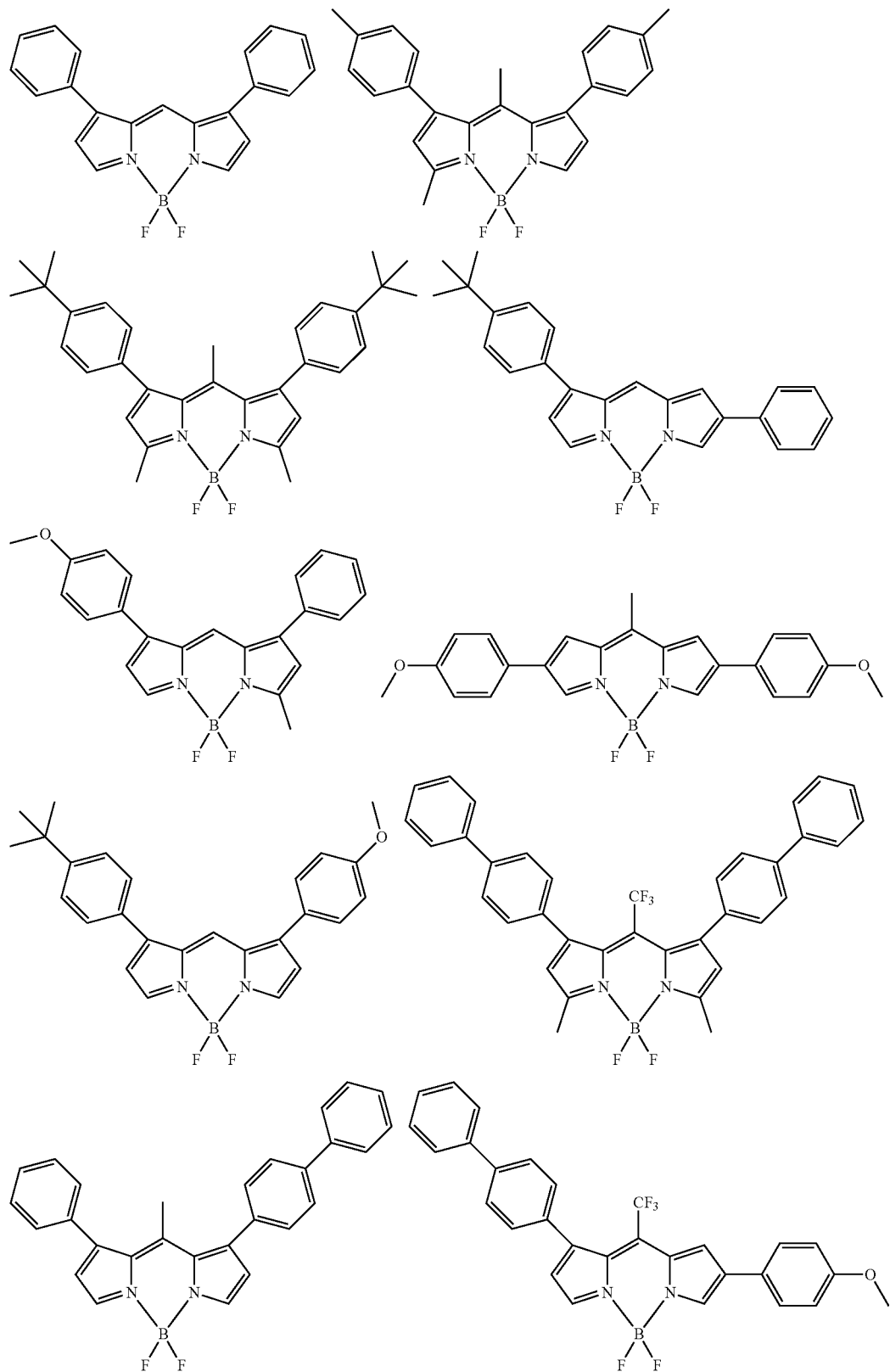

-continued
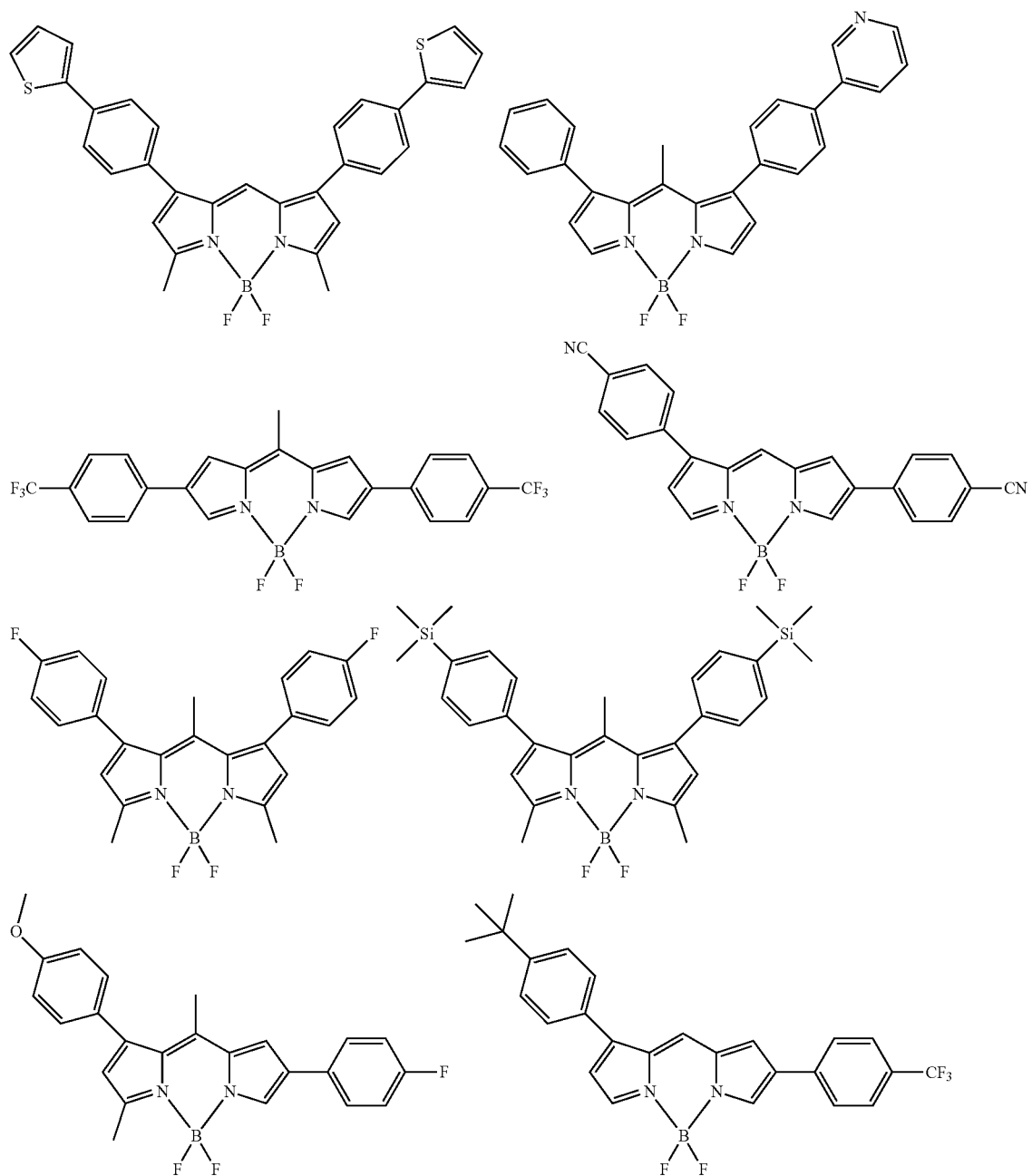
[Formula 20]
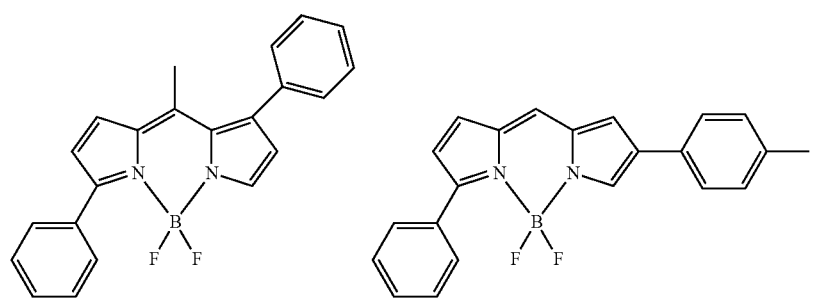

-continued
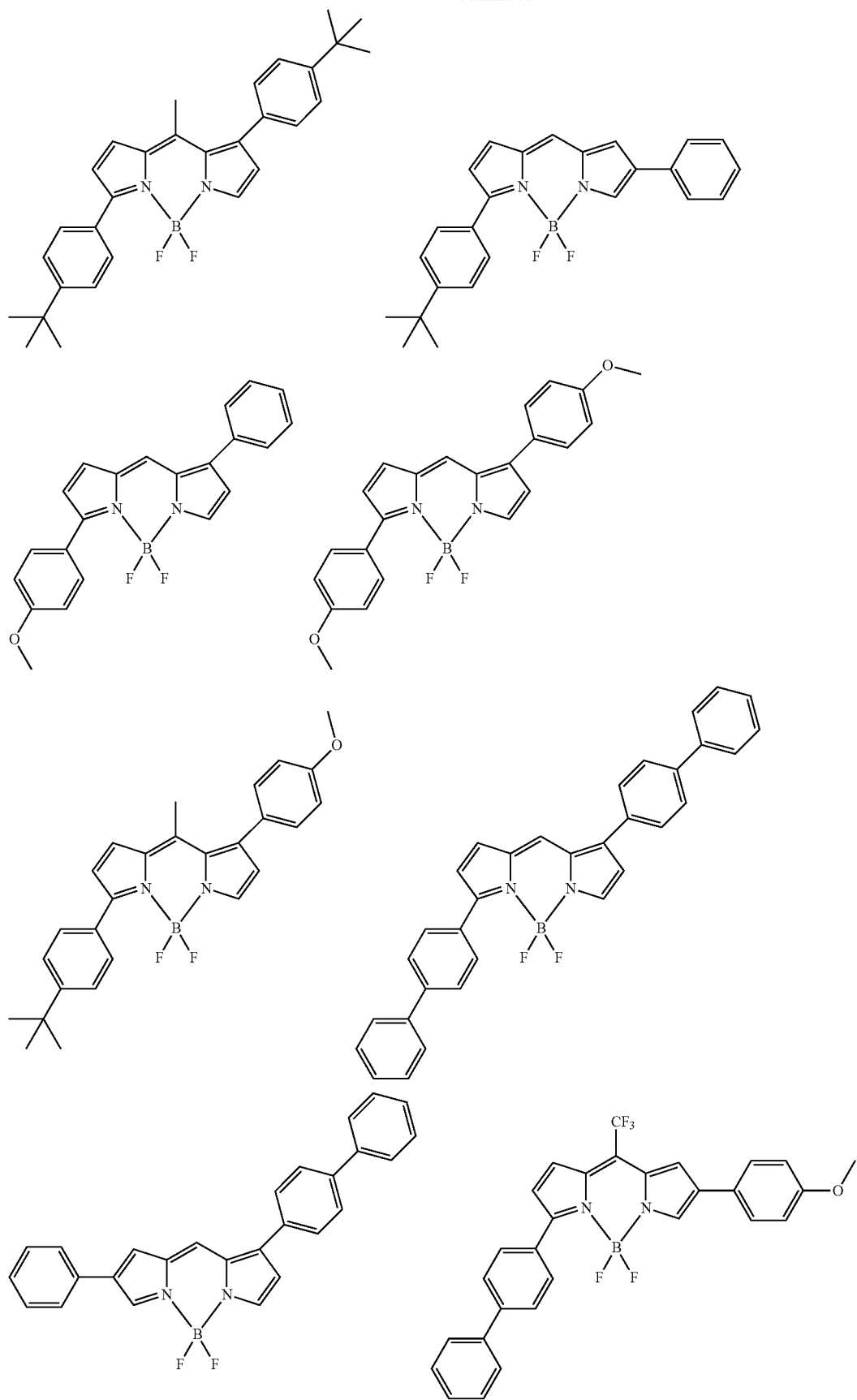

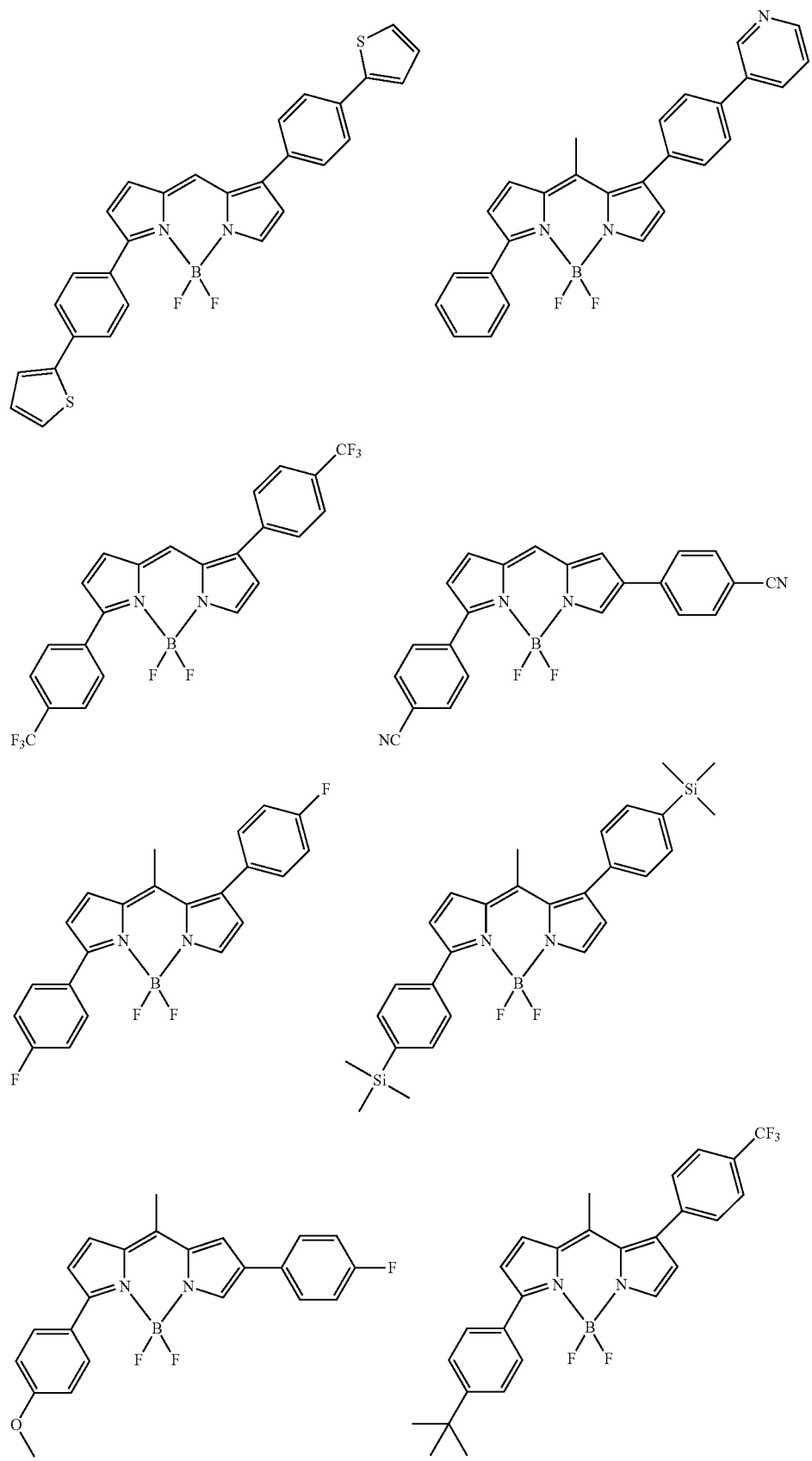

[Formula 21]
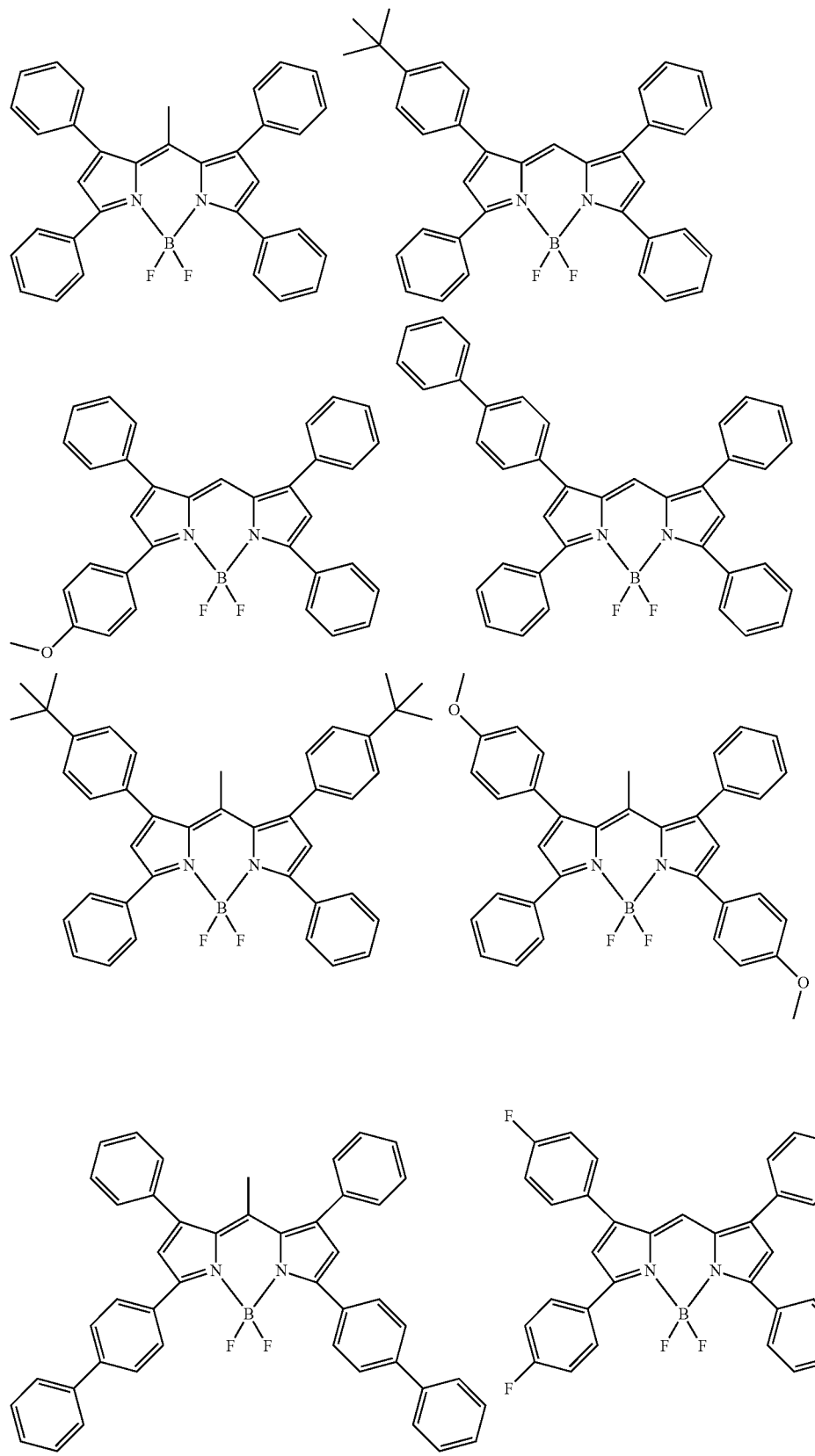

-continued
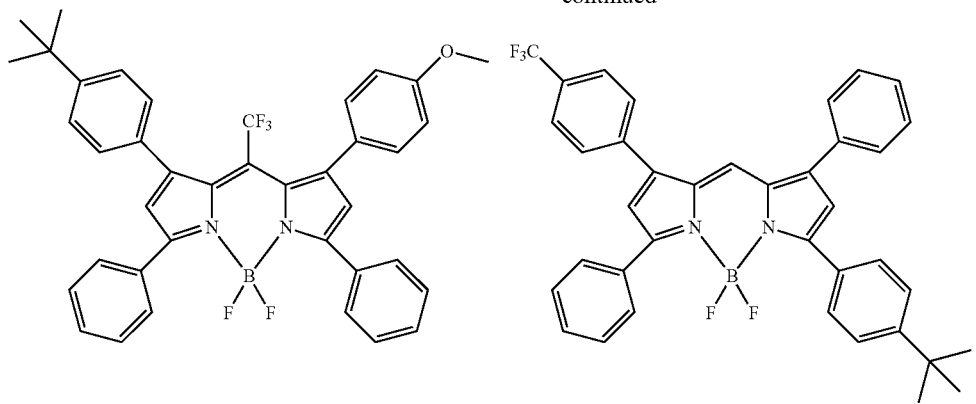
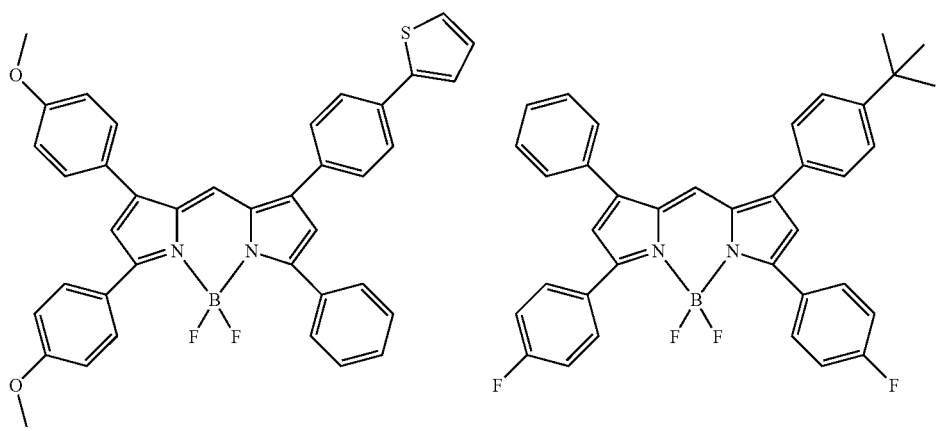
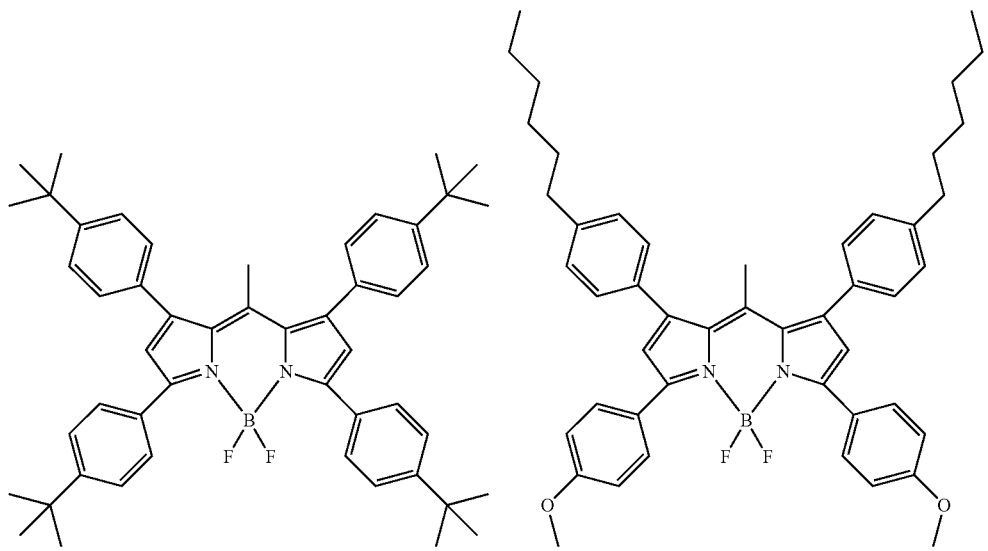

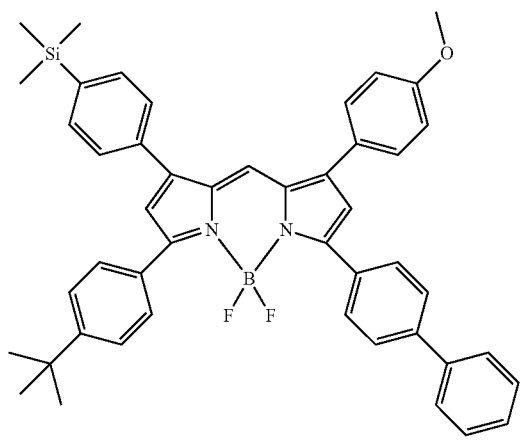
[Formula 22]
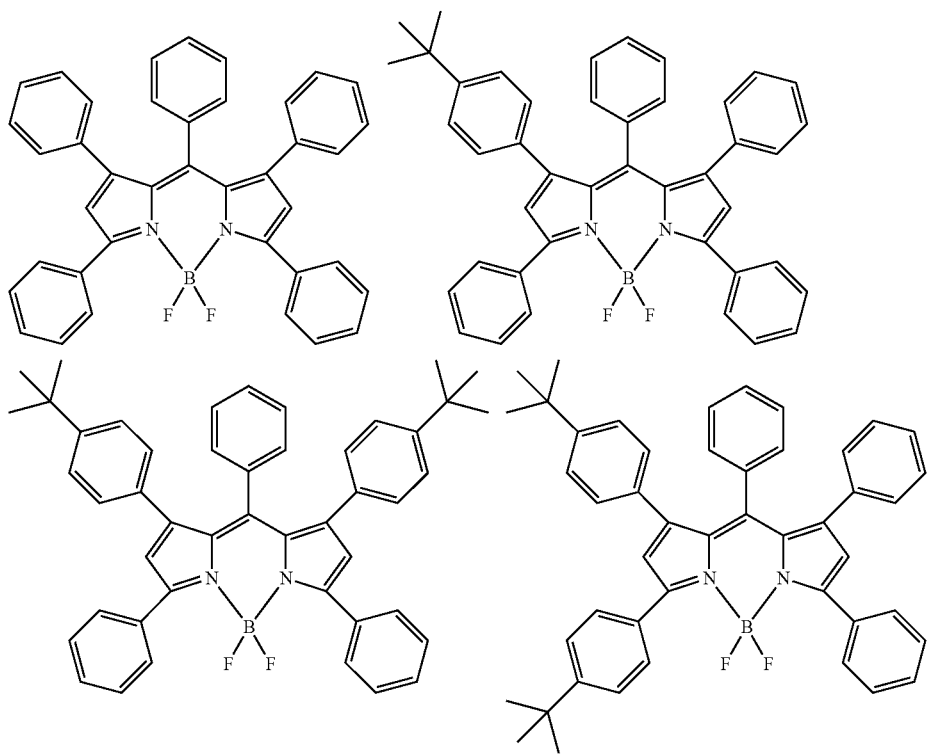
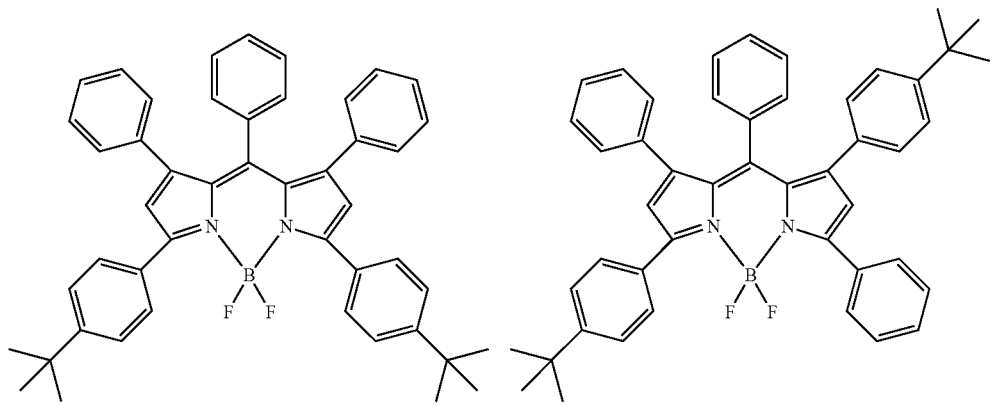

-continued
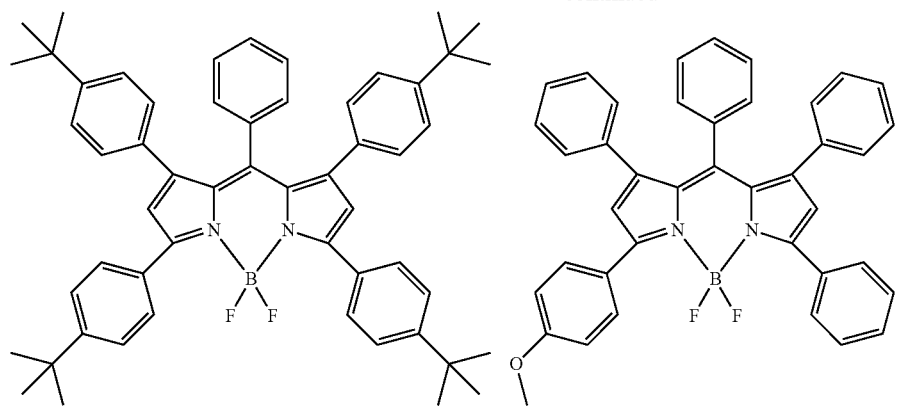
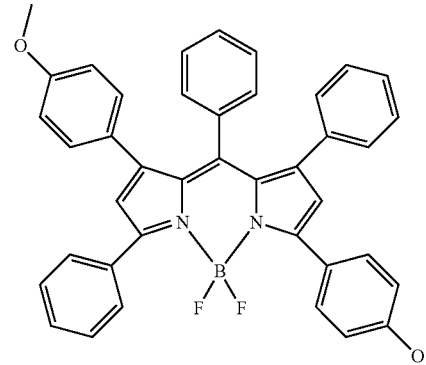
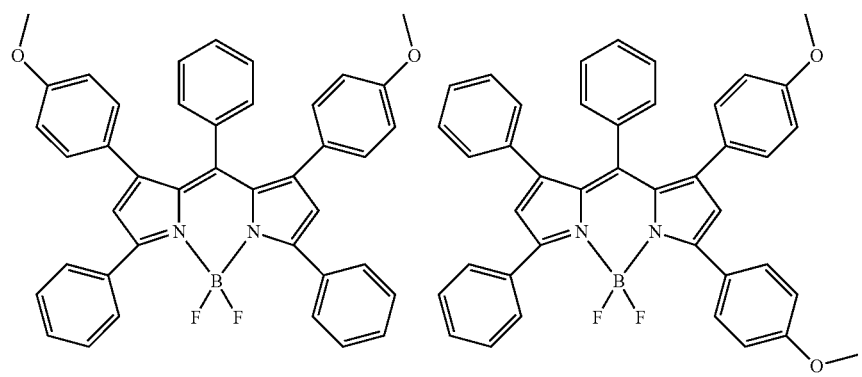
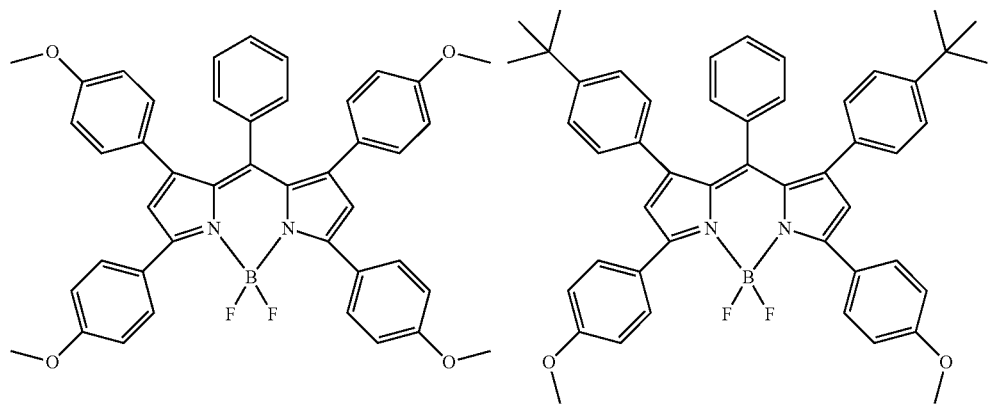

-continued
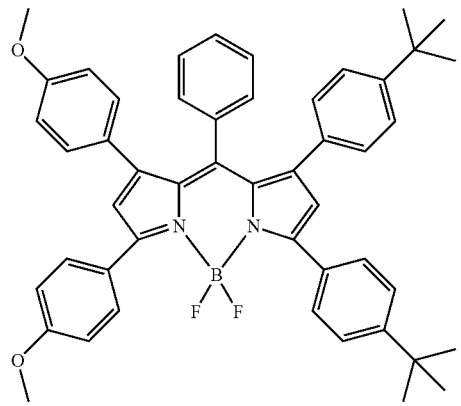
[Formula 23]
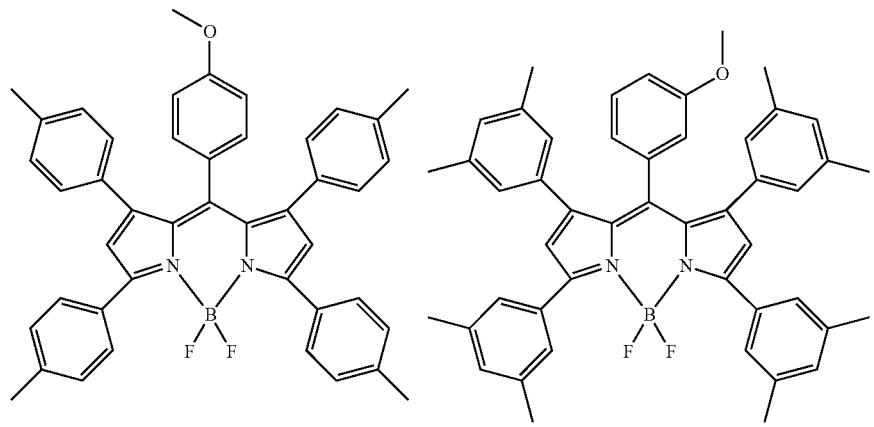
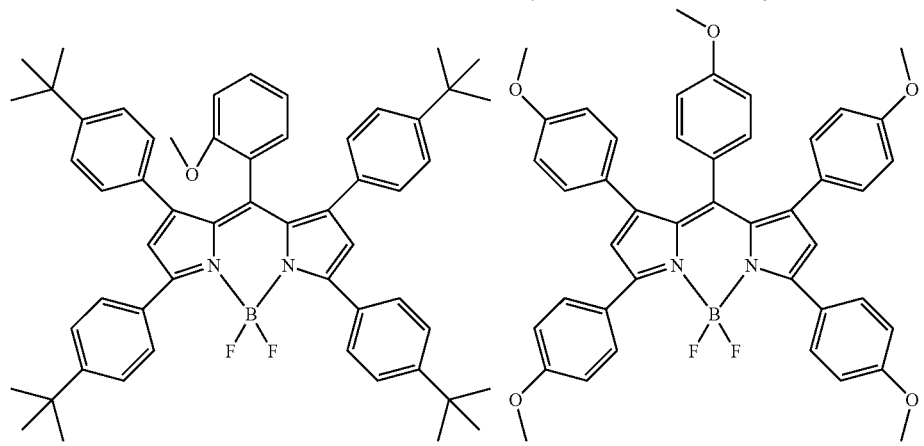
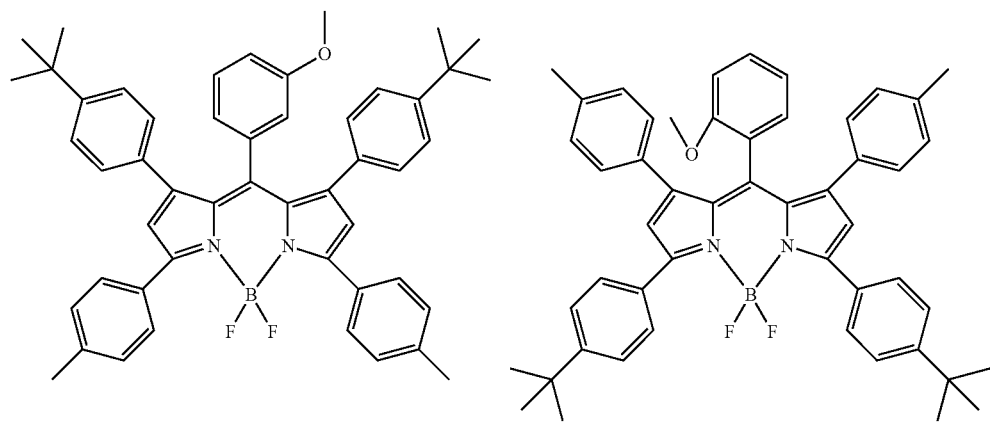

-continued
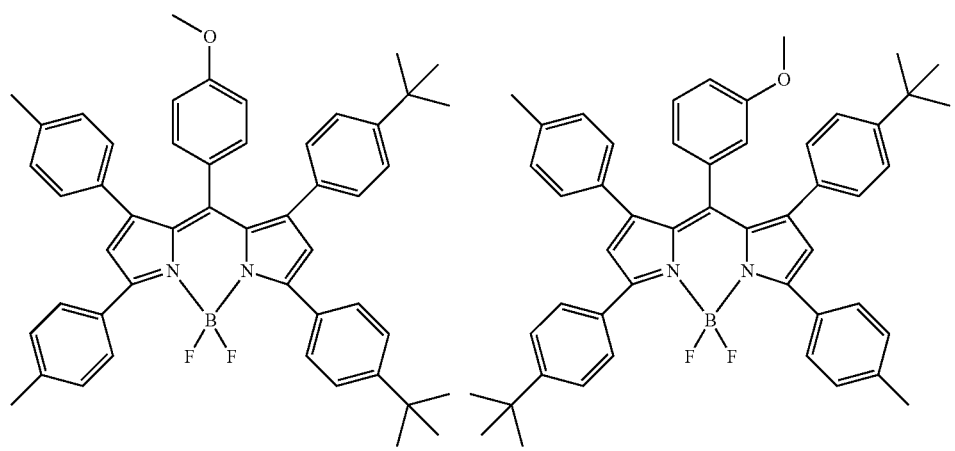
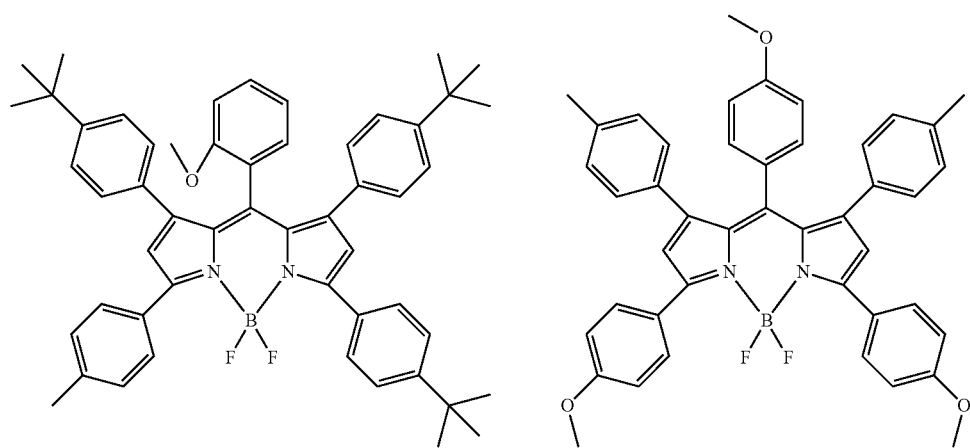
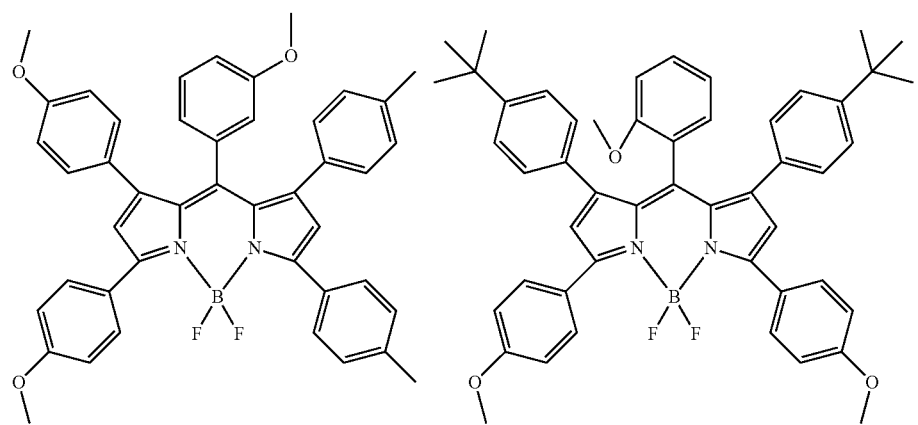

-continued
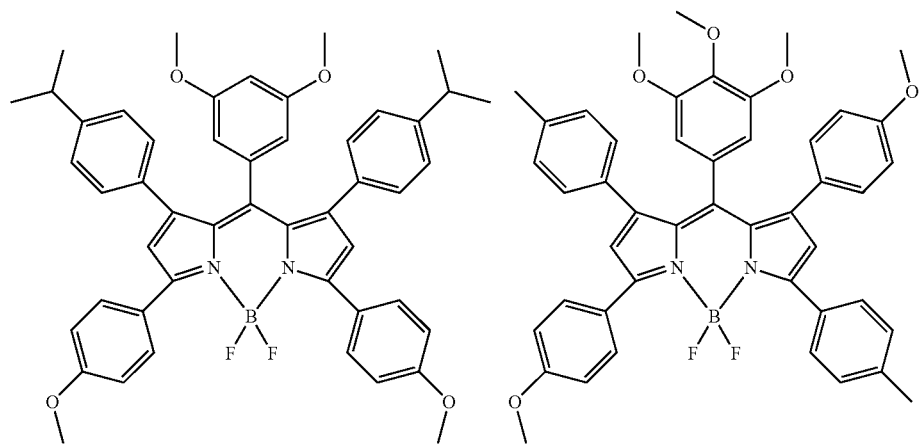
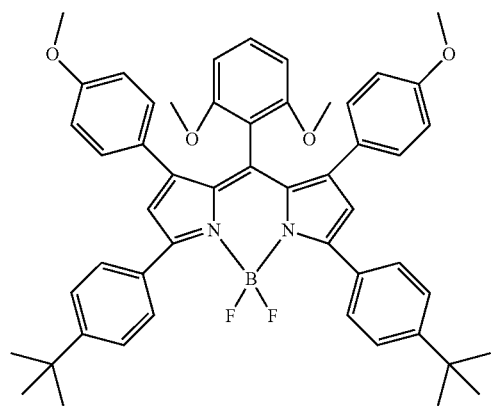
[Formula 24]
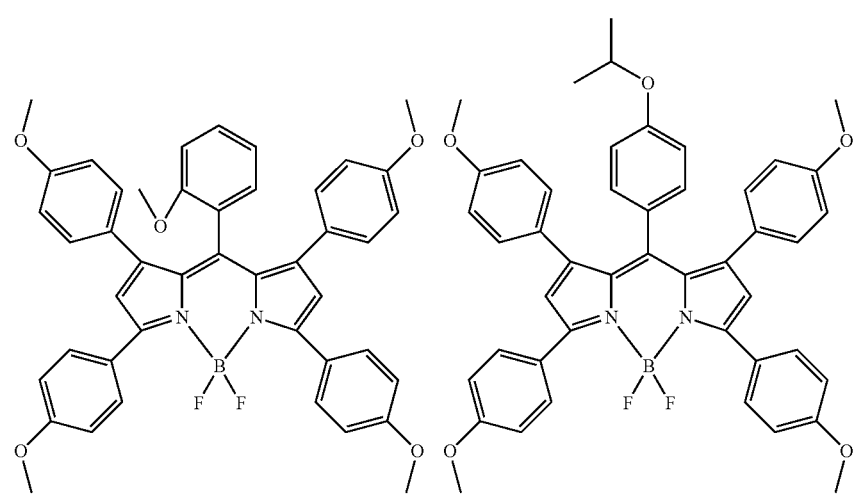

-continued
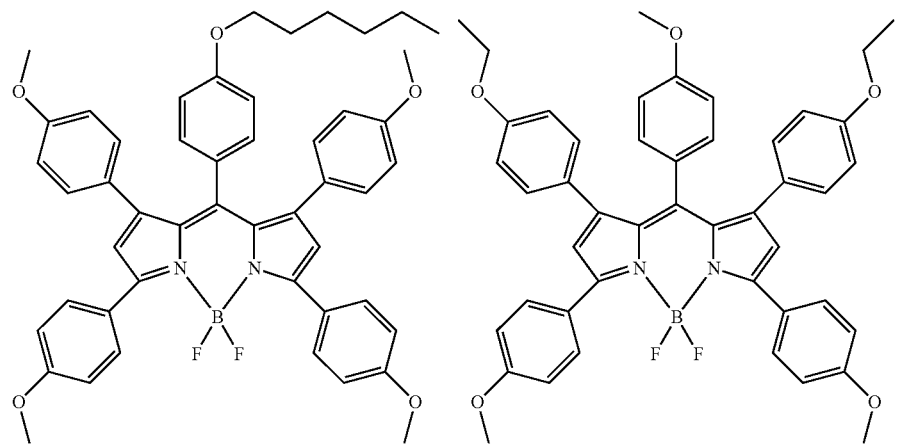
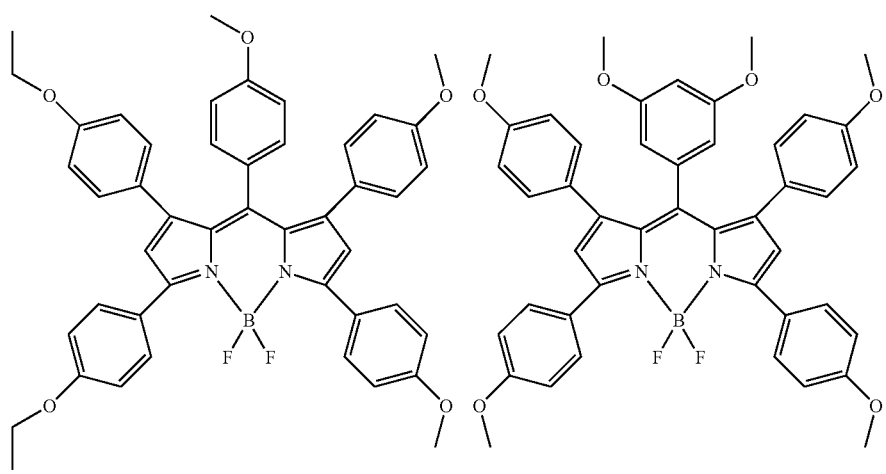
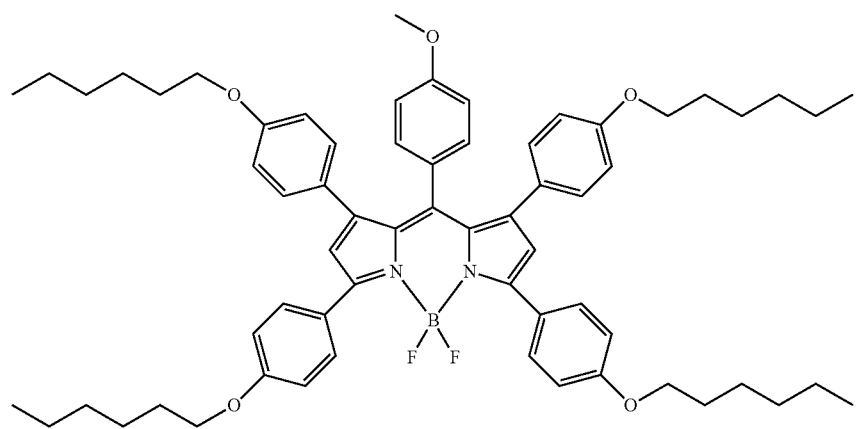

85
86
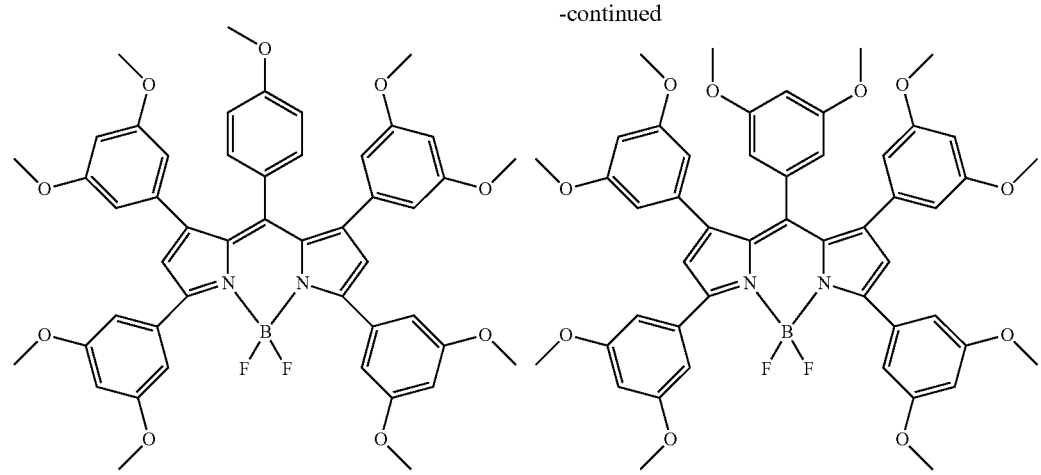
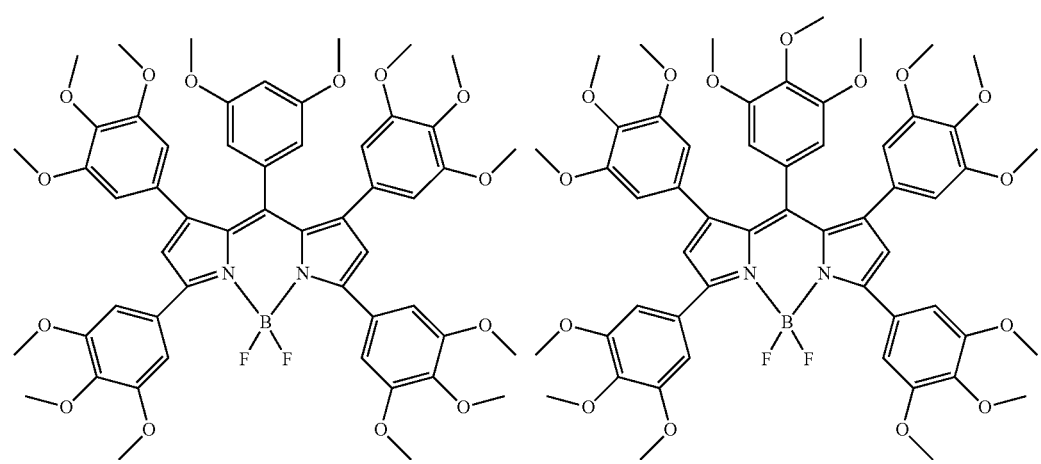
[Formula 25]
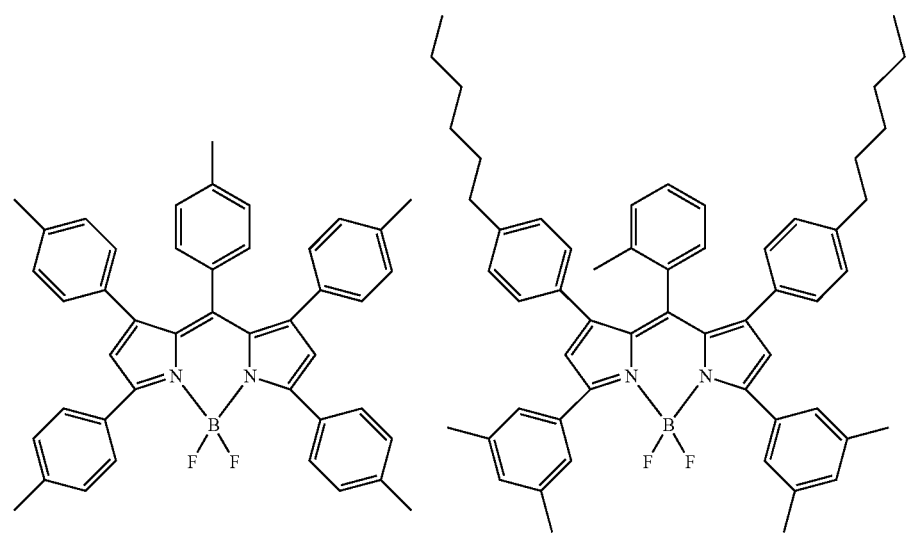

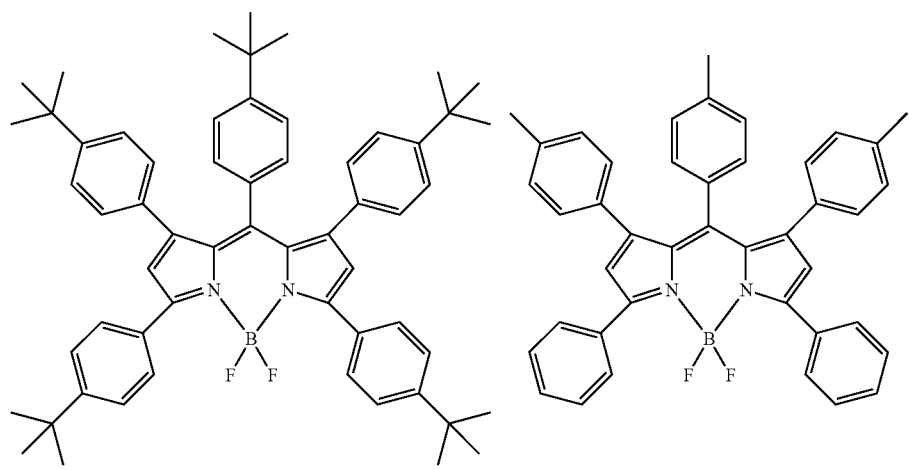
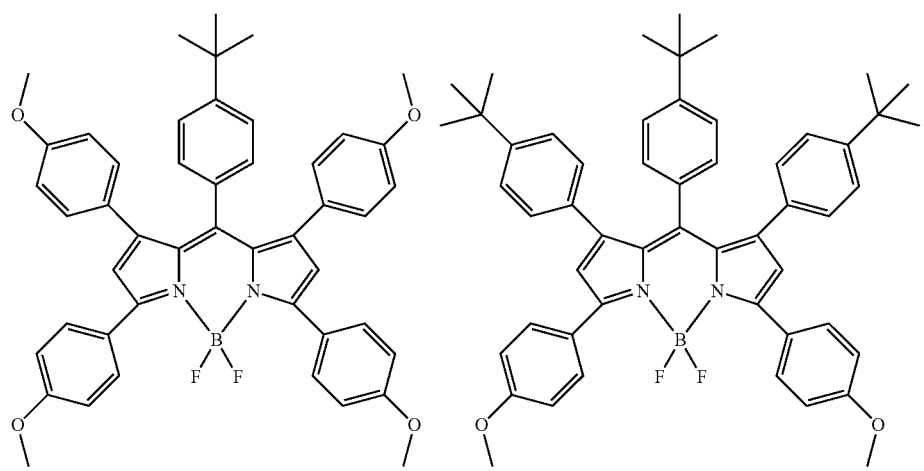
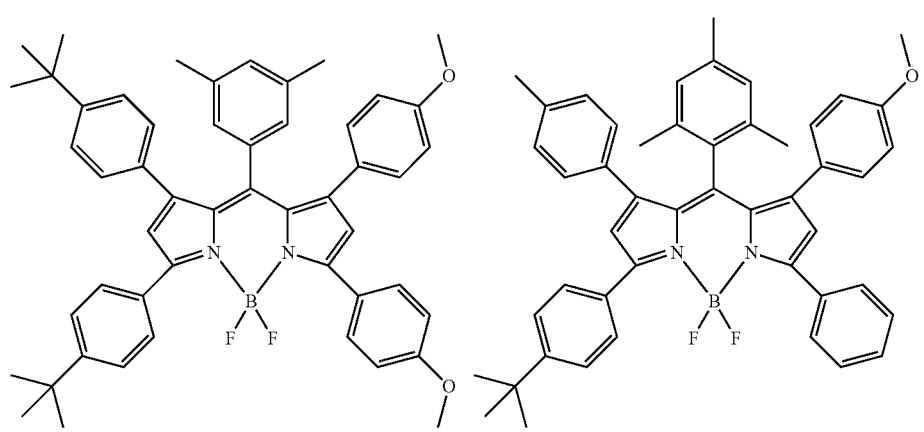

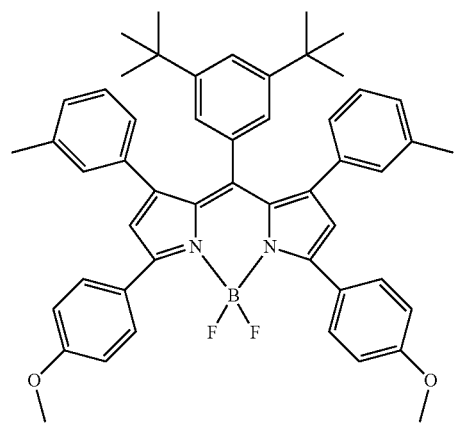
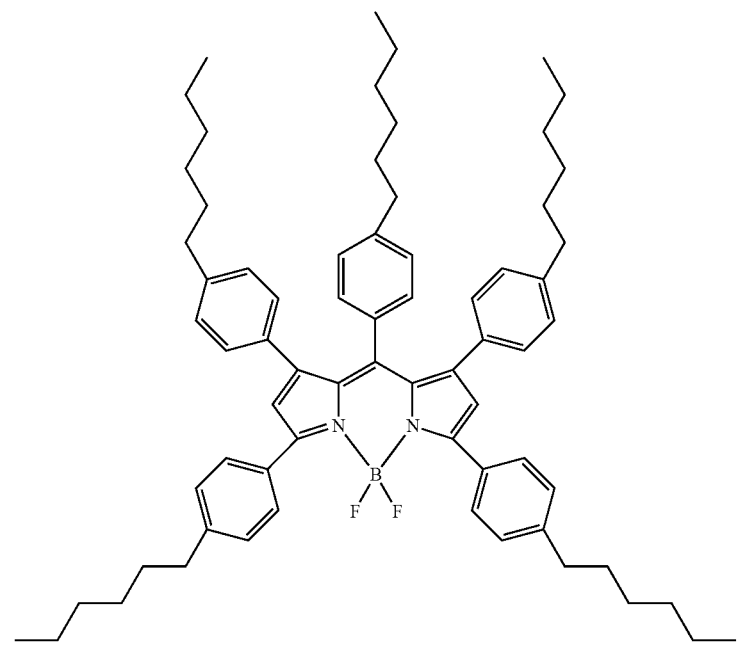
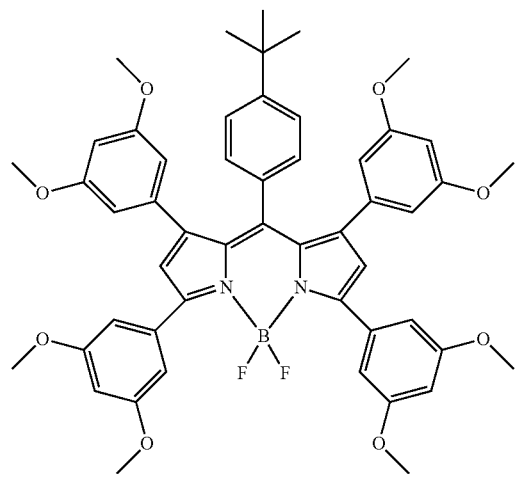
[Formula 26]
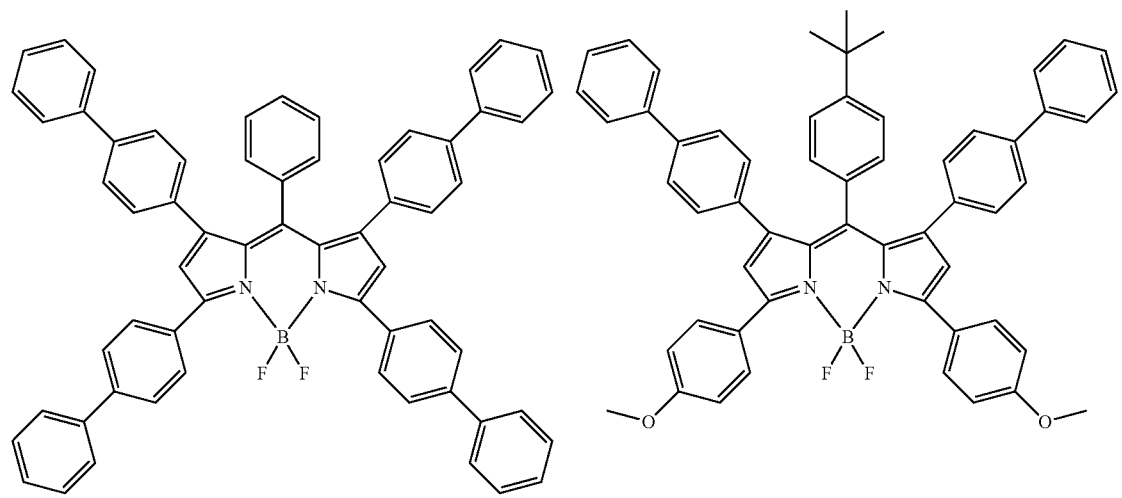

91
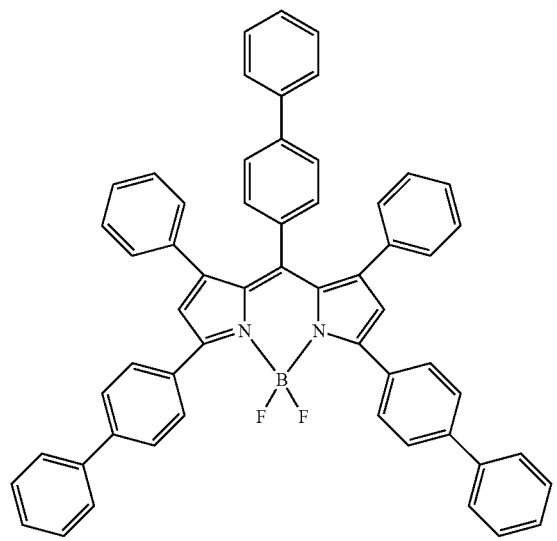
92
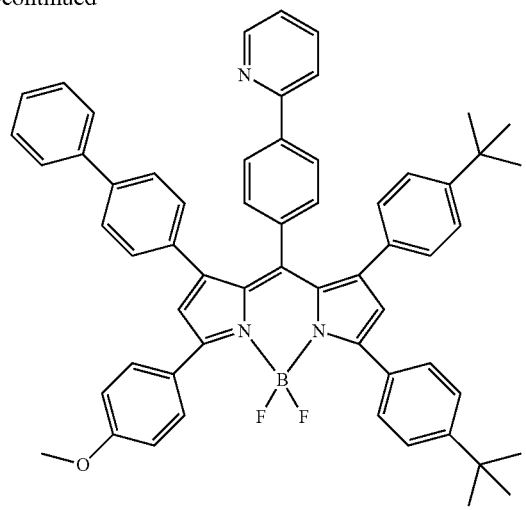
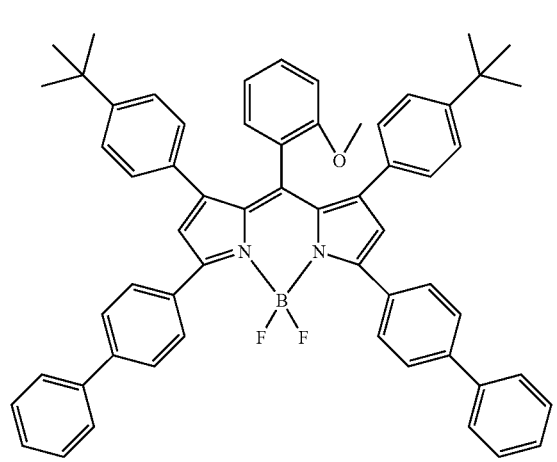
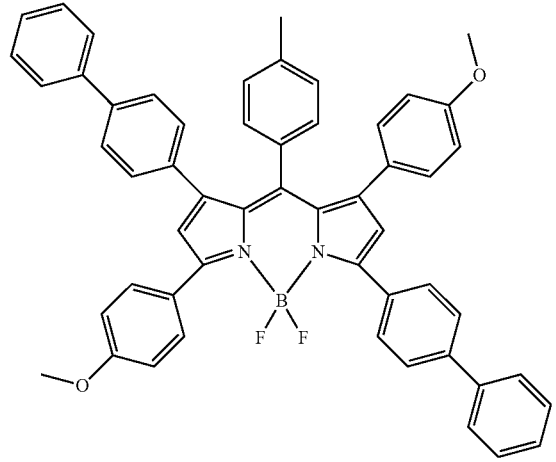
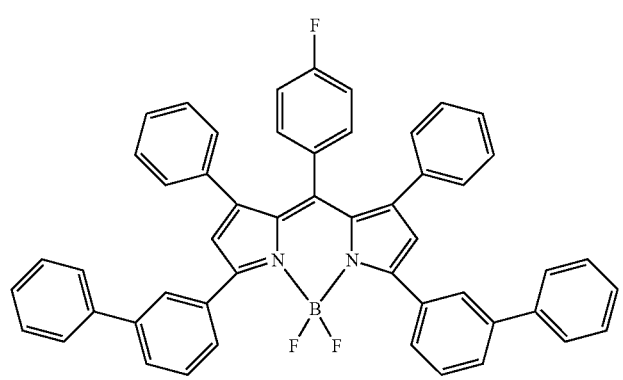
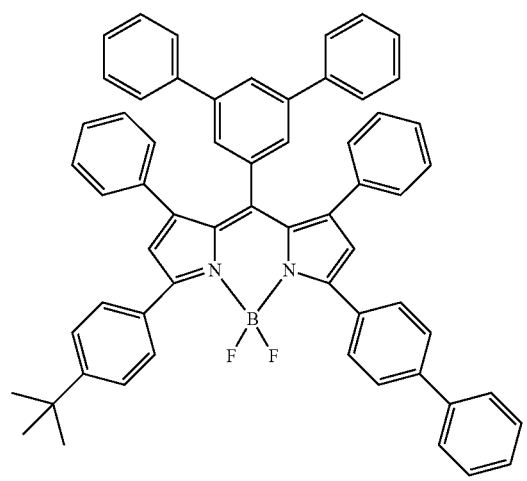

[Formula 27]
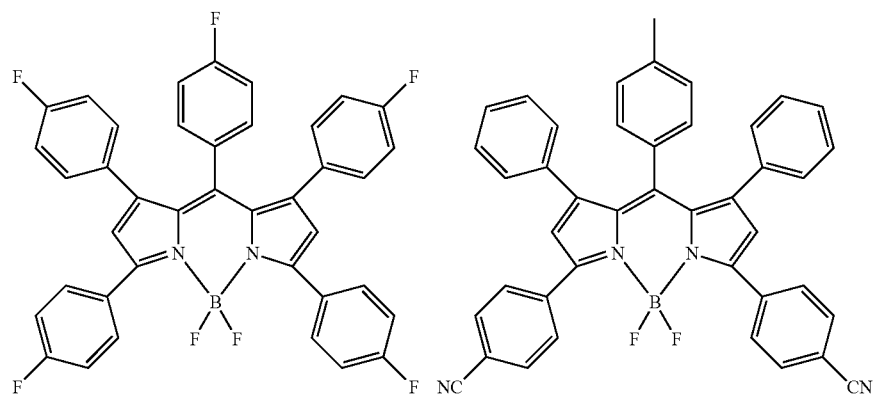
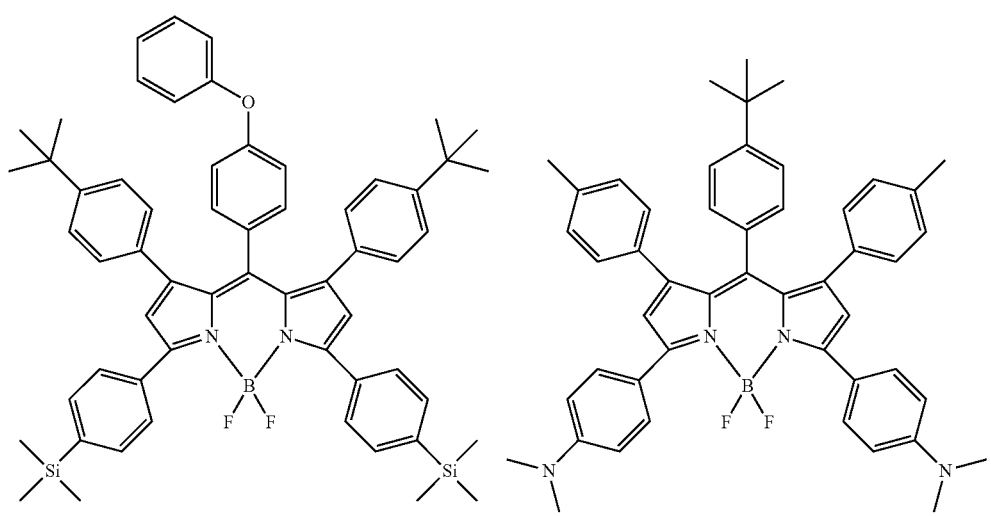
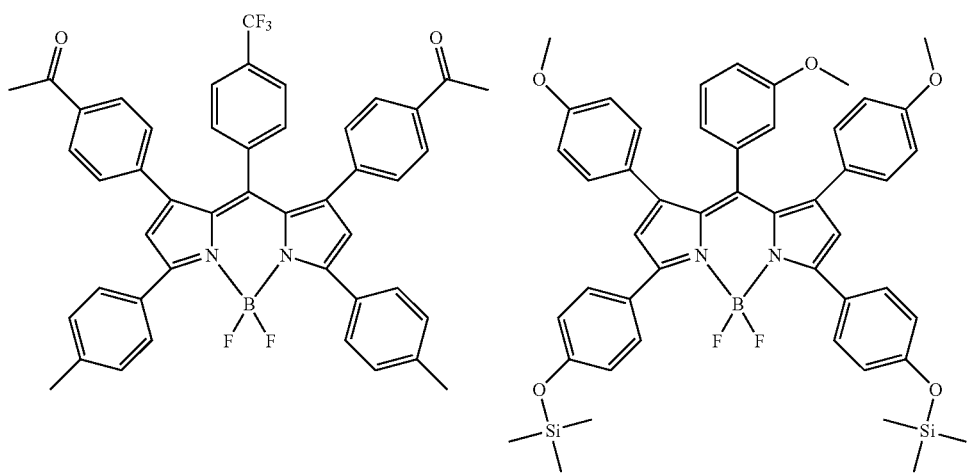

-continued
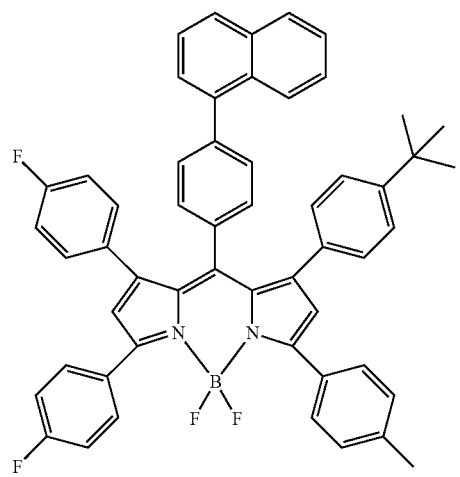
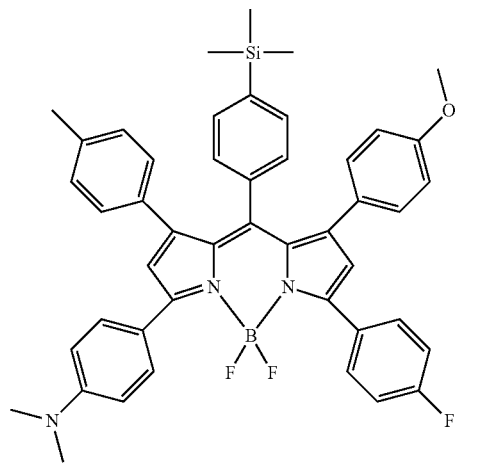
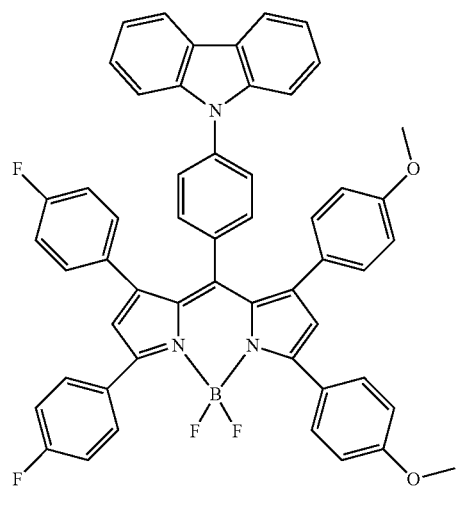
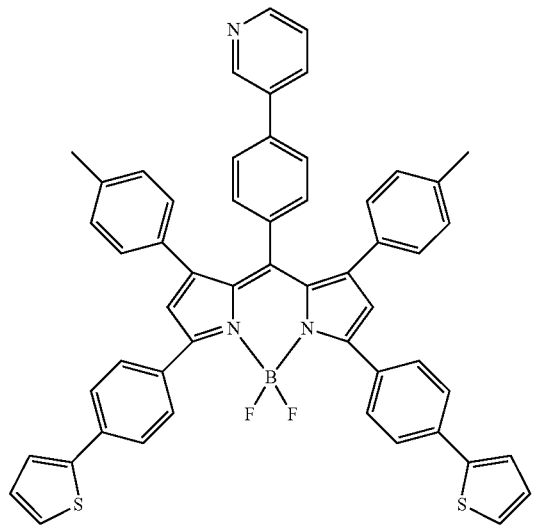
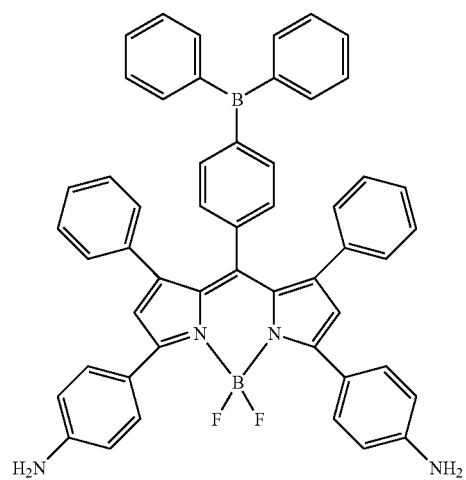
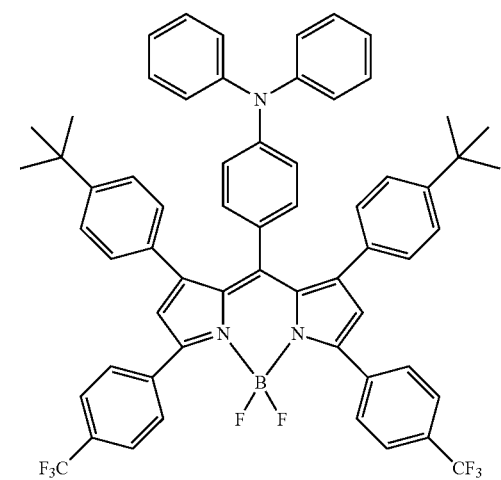

[Formula 28]
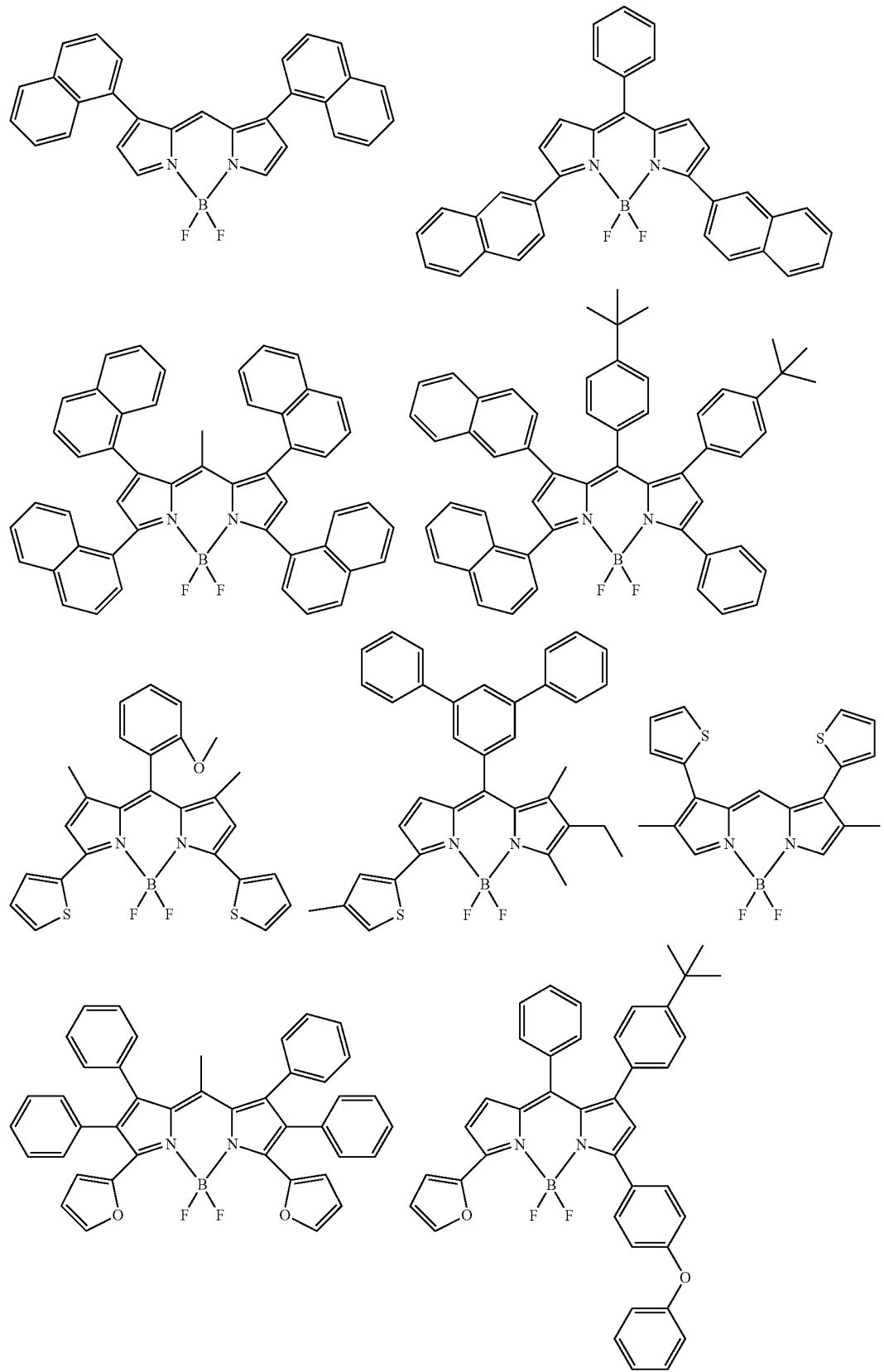

-continued
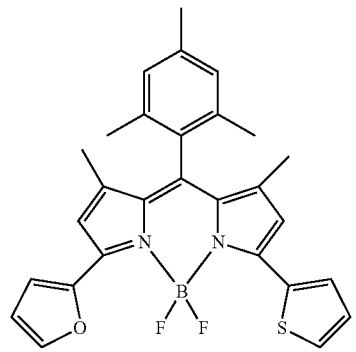
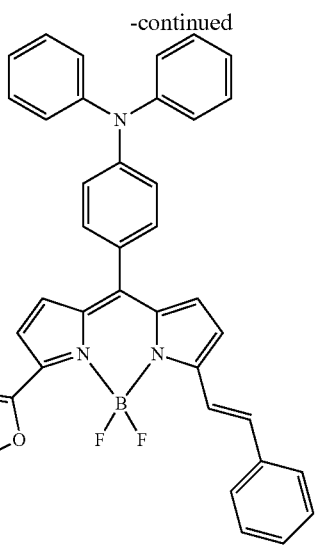
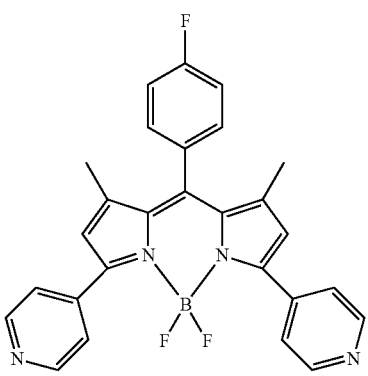
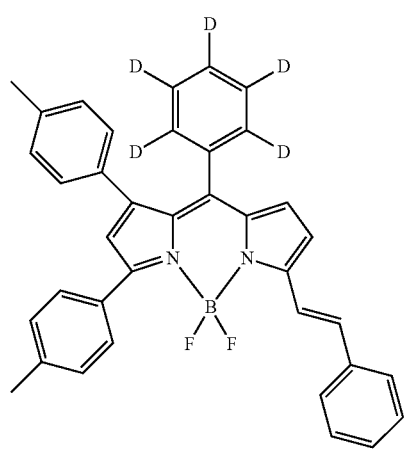
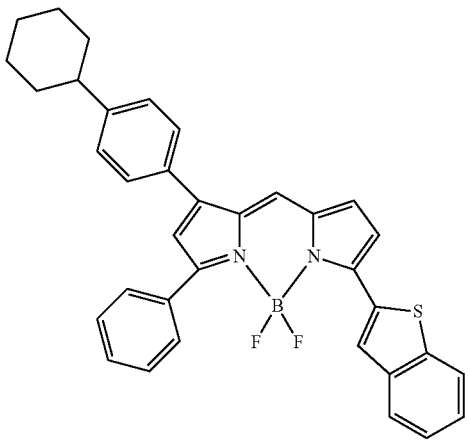
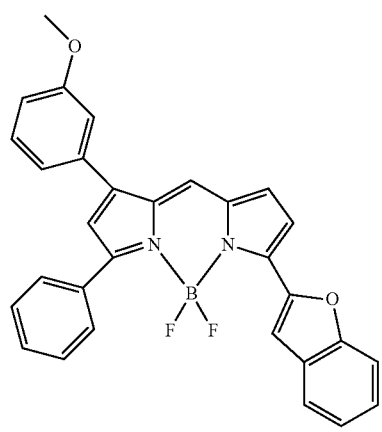

[Formula 29]
-continued
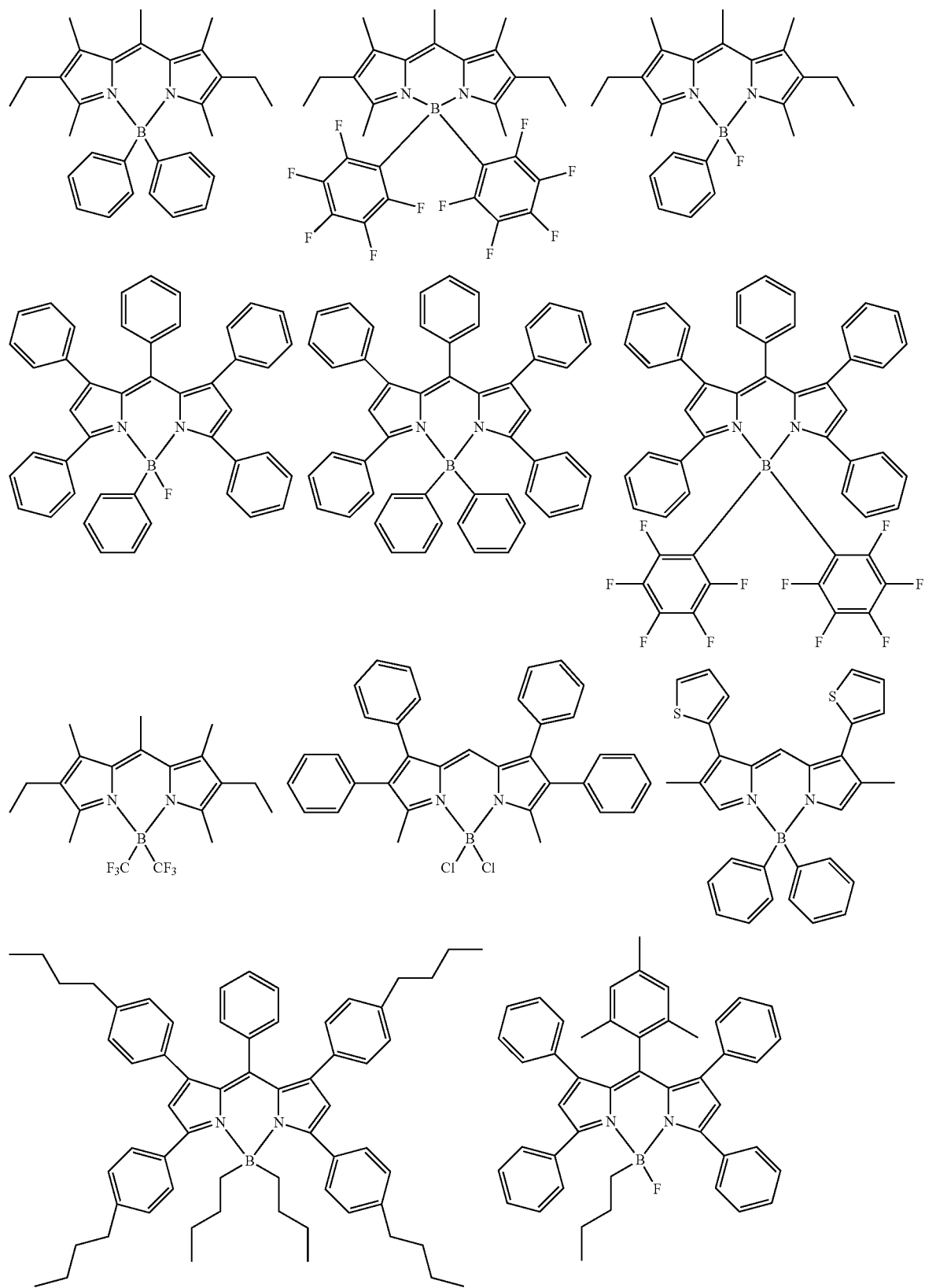

-continued
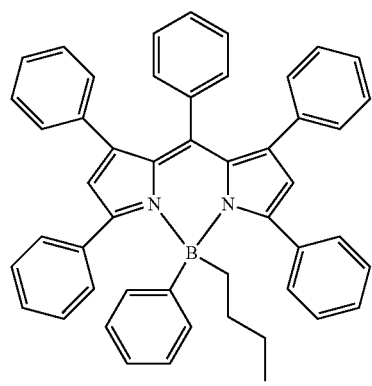
[Formula 30]
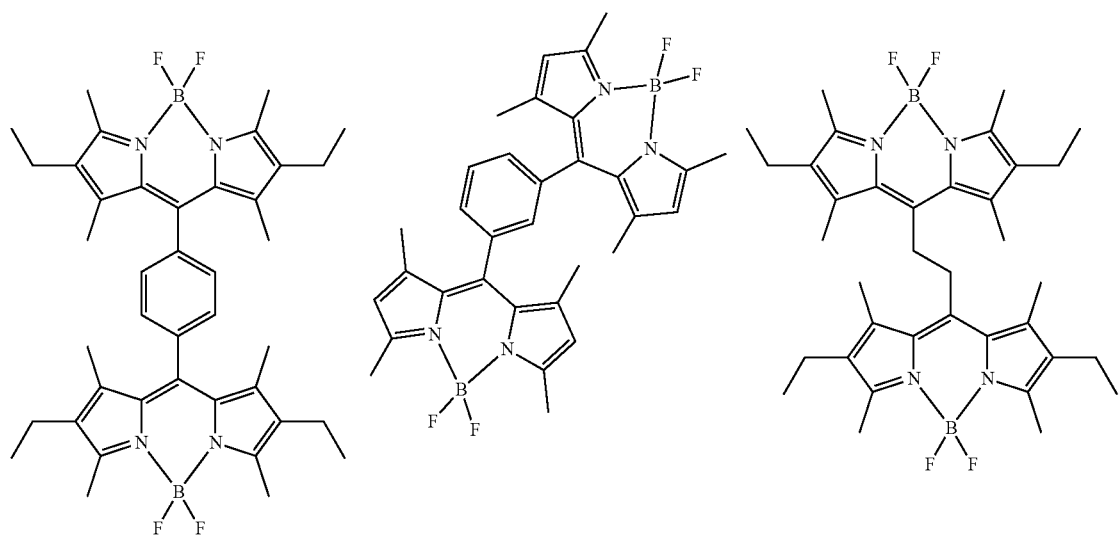
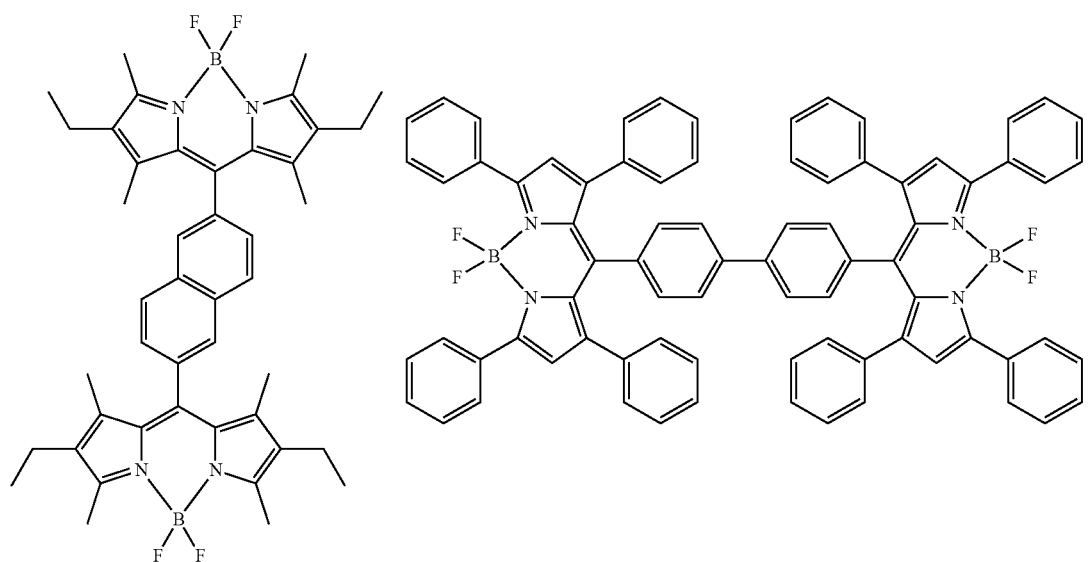

-continued
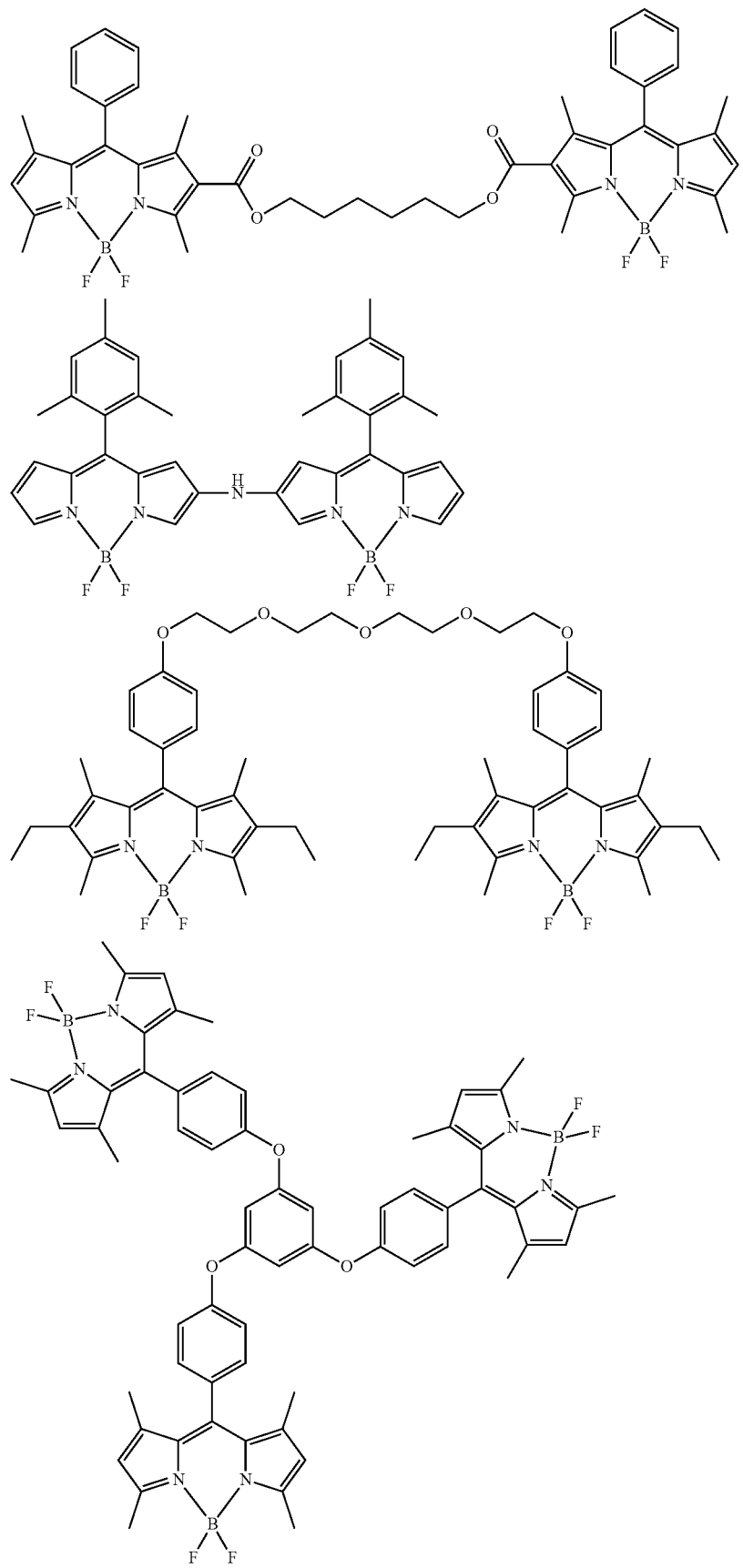

[Formula 31]
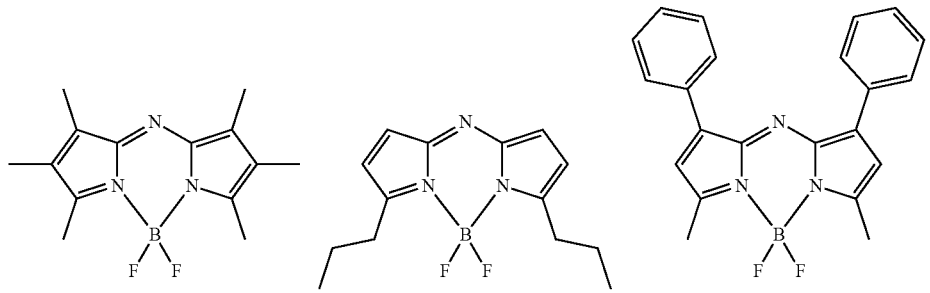
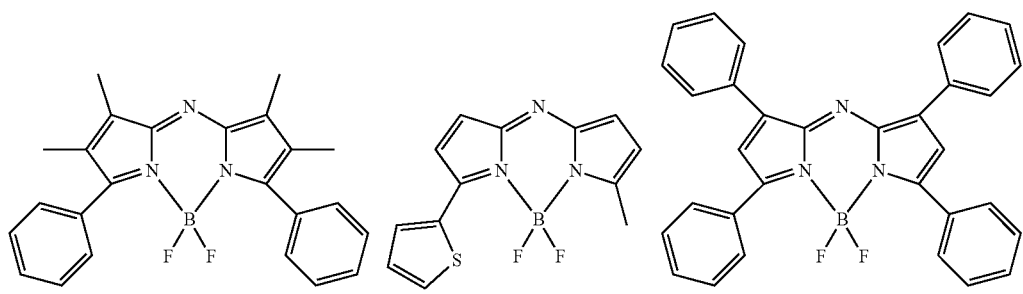
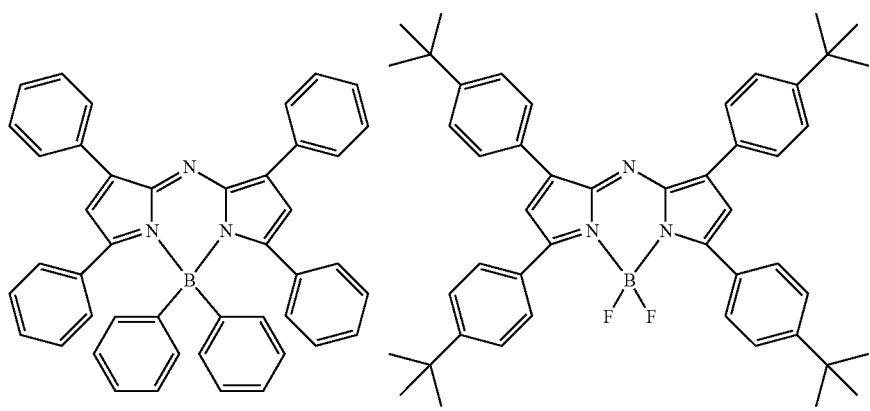
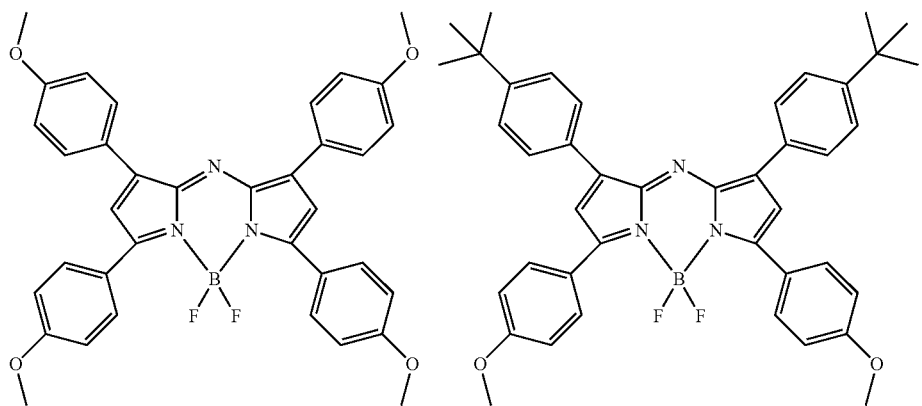

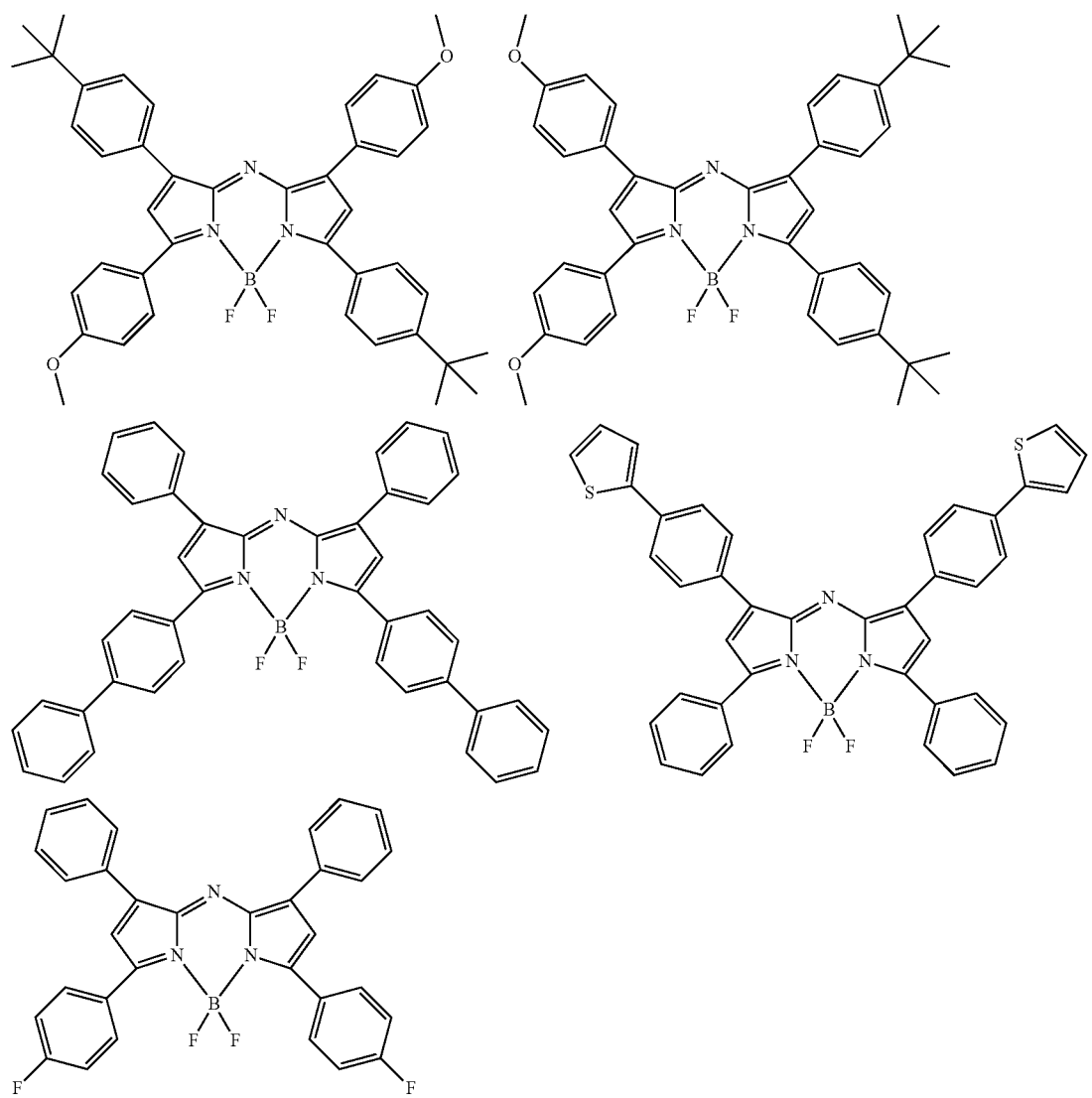
[Formula 32]
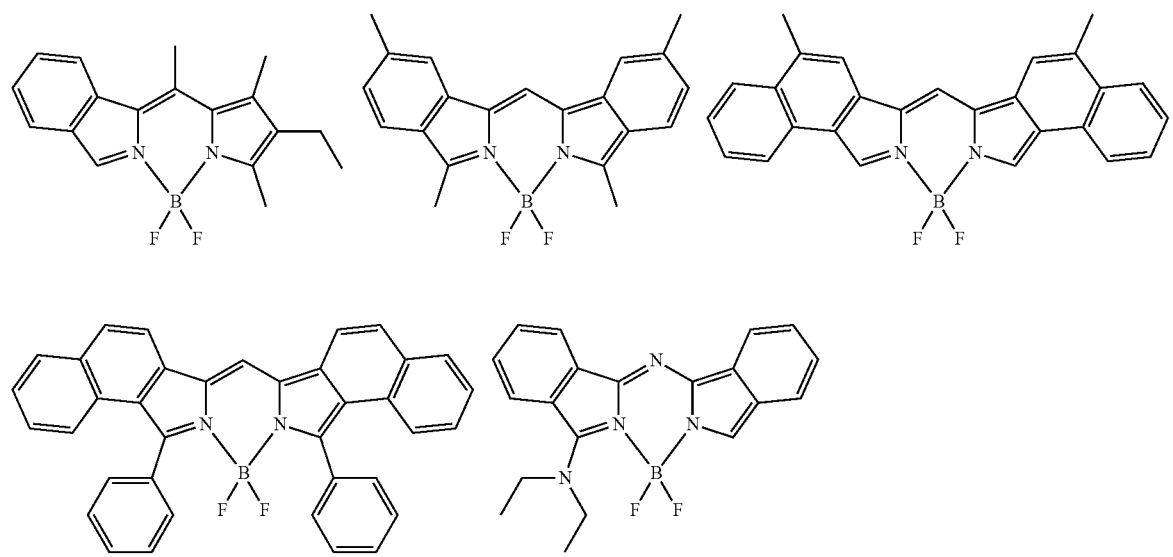

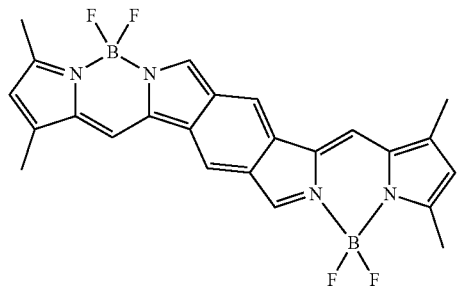

The compound represented by general formula (3) can be produced e.g. by a method described in Japanese Unexamined Patent Application Publication No. 8-509471 or Japanese Patent Laid-open Publication No. 2000-208262. That is, the target pyromethene-based metal complex can be obtained by reacting a pyromethene compound with a metal salt in the presence of a base.

In addition, a pyromethene-boron fluoride complex can be produced by reference to a method described in J. Org. Chem., vol. 64, No. 21, pp 7813-7819 (1999), Angew. Chem., Int. Ed. Engl., vol. 36, pp 1333-1335 (1997), or the like. Examples of the method include, but are not limited to, a method in which compounds represented by the following general formulas (6) and (7) are heated in the presence of phosphorus oxychloride in 1,2-dichloroethane, and then a compound represented by the following general formula (8) is reacted in the presence of triethylamine in 1,2-dichloroethane. Herein, $R^1$ to $R^9$ are the same as described above. J represents a halogen.

[Formula 33]

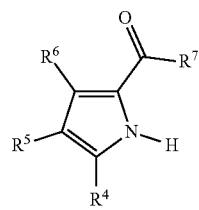

(6)

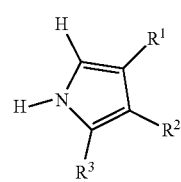

(7)

(8)

Furthermore, examples of a method for introducing an aryl group or a heteroaryl group include, but are not limited to, a method in which a carbon-carbon bond is produced using a coupling reaction between a halogenated derivative and a boronic acid or a boronic acid esterified derivative. Similarly, examples of a method for introducing an amino group or a carbazolyl group include, but are not limited to, a method in which a carbon-nitrogen bond is produced using a coupling reaction between a halogenated derivative and an amine or carbazole derivative in the presence of a metal catalyst such as palladium.

The color conversion composition according to the present invention can appropriately contain not only the compound represented by general formula (3) but also other compounds as necessary. For example, the color conversion composition may contain an assist dopant such as rubrene for further enhancing an energy transfer efficiency from an excitation light to a compound represented by the general formula (3). In addition, when it is necessary to add a luminescent color other than the luminescent color of the compound represented by general formula (3), the organic light-emitting material described above can be added. Besides the organic light-emitting materials, known light-emitting materials such as an inorganic fluorophore, a fluorescent pigment, a fluorescent dye and quantum dots can be added in combination.

Examples of an organic light-emitting material other than the compound represented by general formula (3) are presented below, but are not limited the following examples.

[Formula 34]

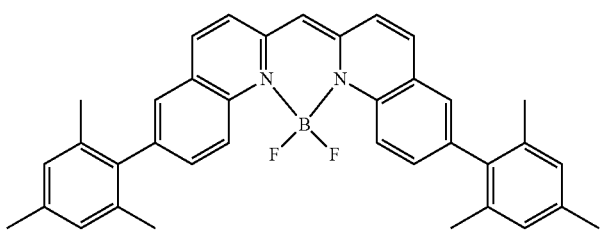
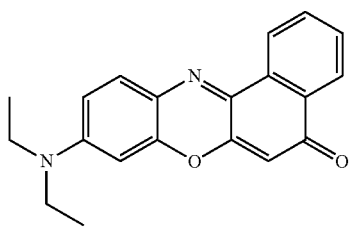

113
-continued
114
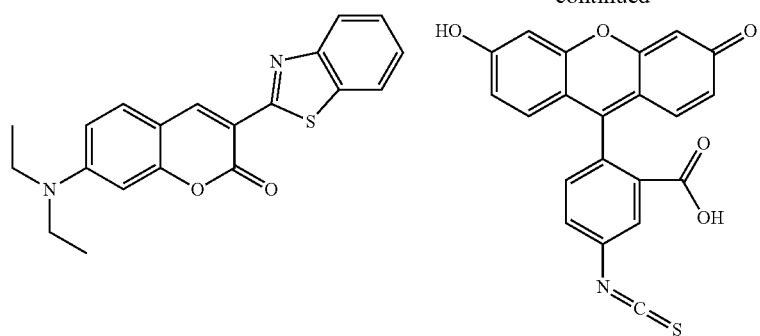
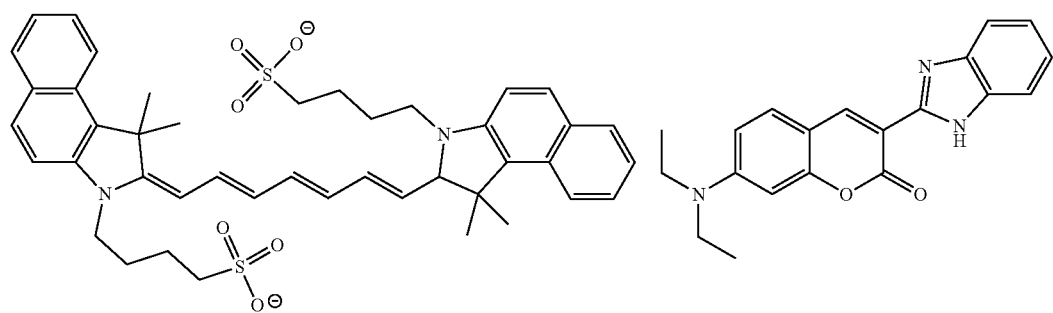
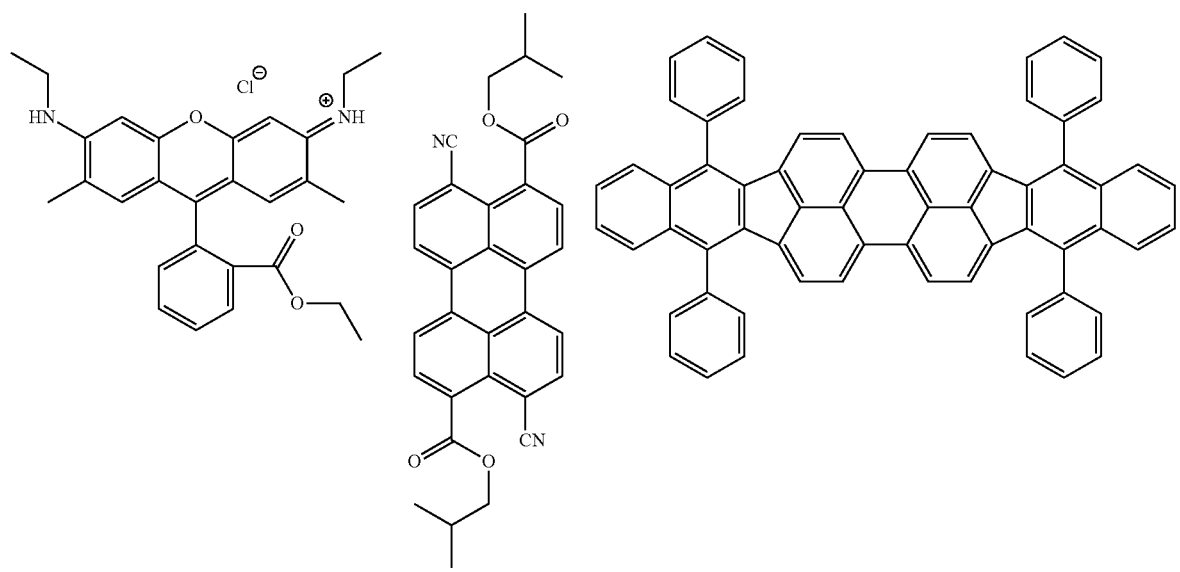
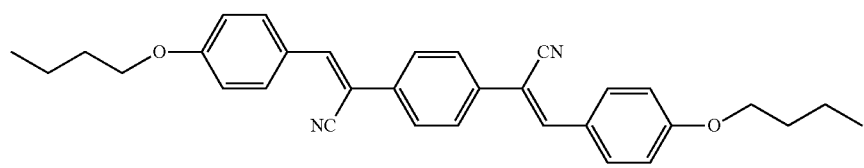

115 116
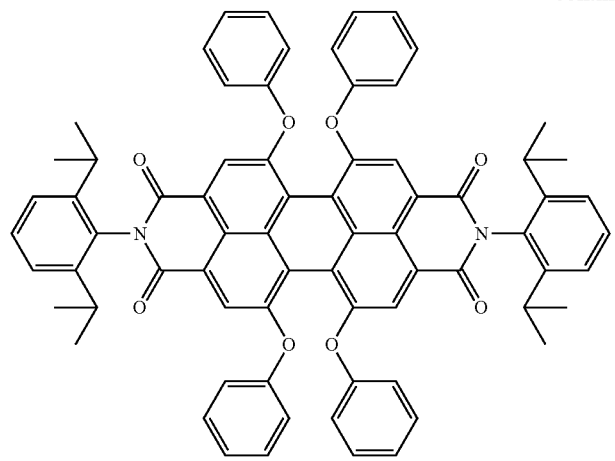
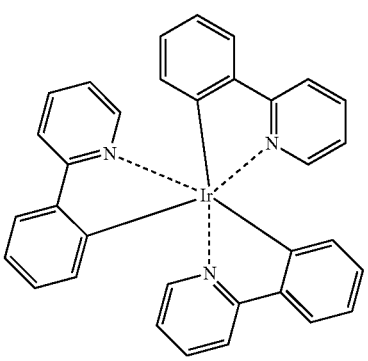
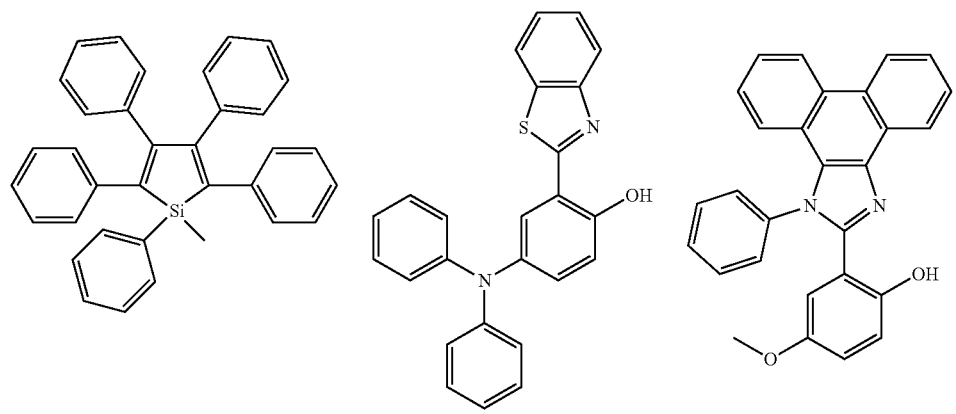
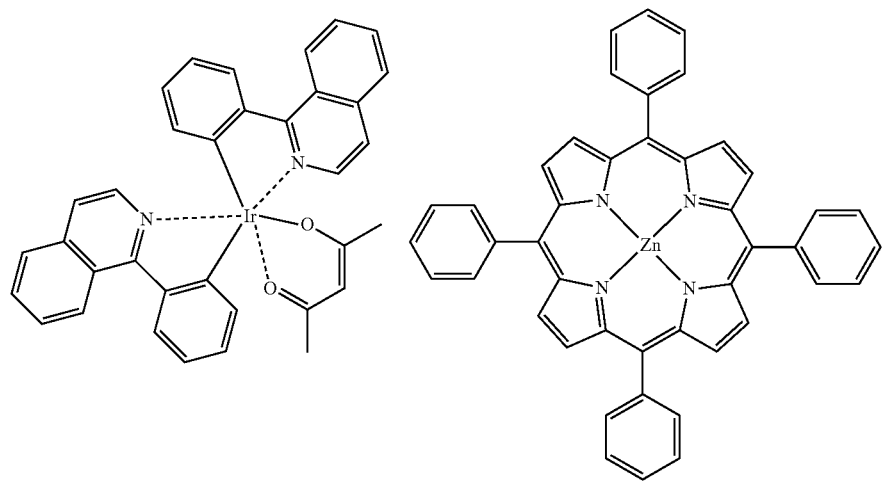

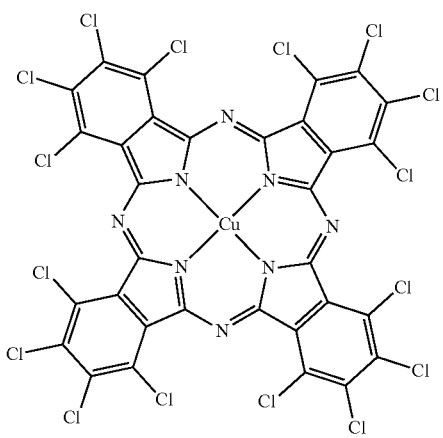

The color conversion composition according to the present invention preferably contains a light-emitting material (hereinafter referred to as "light-emitting material (a)") emitting a light having a peak wavelength observed in a region of 500 nm to 580 nm by using an excitation light having a wavelength in a range of 430 nm to 500 nm. Hereinafter, a light having a peak wavelength observed in a region of 500 nm to 580 nm is referred to as "green light". In general, the higher the excitation light energy is, the easier the material is decomposed, but a green light with a good color purity can be obtained without decomposing the light-emitting material in the color conversion composition because an excitation light in a wavelength range of 430 nm to 500 nm has a relatively low excitation energy.

The color conversion composition according to the present invention preferably contains (a) a light-emitting material that emits a light having a peak wavelength of 500 nm to 580 nm by using an excitation light having a wavelength in a range of 430 nm to 500 nm, and (b) a light-emitting material (hereinafter referred to as "light-emitting material (b)") that emits a light having a peak wavelength observed in a region of 580 nm to 750 nm when excited by any one or both of an excitation light having a wavelength in a range of 430 nm to 500 nm, and the light emitted from the light-emitting material (a). Hereinafter, a light having a peak wavelength observed in a region of 580 nm to 750 nm is referred to as "red light".

The excitation light having the wavelength in the range of 430 nm to 500 nm is partially transmitted through the color conversion film according to the present invention, and therefore when using a blue LED having a sharp emission peak, a white light that exhibits a sharp emission spectrum for each color, blue, green, and red, and has a good color purity can be obtained. As a result, a broader color gamut with a more vivid color can be efficiently generated especially in displays. Additionally, in lighting applications, particularly luminescent properties in green and red regions are improved compared to currently prevailing white LEDs obtained by combining a blue LED and a yellow fluorophore, and therefore a color-rendering property is improved, resulting in a preferable white light source.

Preferable examples of the light-emitting material (a) include, but are not particularly limited to: a coumarin derivative such as coumarin 6, coumarin 7, and coumarin 153; a cyanine derivative such as indocyanine green; a fluorescein derivative such as fluorescein, fluorescein isothiocyanate, and carboxyfluorescein diacetate; a phthalocyanine derivative such as phthalocyanine green; a perylene derivative such as diisobutyl-4,10-dicyanoperylene-3,9-dicarboxylate; as well as, a pyromethene derivative; a stilbene derivative; an oxazine derivative; a naphthalimide derivative; a pyrazine derivative; a benzimidazole derivative; a benzoxazole derivative; a benzothiazole derivative; an imidazopyridine derivative; an azole derivative; a compound or its derivative having a condensed aryl ring, such as anthracene; an aromatic amine derivative; an organometallic complex compound; and the like.

Among these compounds, the pyromethene derivative is a particularly suitable compound because of a high fluorescent quantum yield and good durability, and above all, the compound represented by general formula (3) is preferable because of a light with a high color purity.

Preferable examples of the light-emitting material (b) include, but are not limited to: a cyanine derivative such as 4-dicyanomethylene-2-methyl-6-(p-dimethylaminostyryl)-4H-pyran; a rhodamine derivative such as rhodamine B, rhodamine 6G, rhodamine 101, and sulforhodamine 101; a pyridine derivative such as 1-ethyl-2-(4-(p-dimethylaminophenyl)-1,3-butadienyl)-pyridinium-perchlorate; a perylene derivative such as N,N'-bis(2,6-diisopropylphenyl)-1,6,7,12-tetraphenoxyperylene-3,4:9,10-bisdicarboximide; as well as a porphyrin derivative; a pyromethene derivative; an oxazine derivative; a pyrazine derivative; a compound or its derivative having a condensed aryl ring, such as naphthacene and dibenzodiindenoperylene; an organometallic complex compound; and the like.

Among these compounds, the pyromethene derivative is a particularly suitable compound because of a high fluorescent quantum yield and good durability, and above all, the compound represented by general formula (3) is preferable because of a light with a high color purity.

A content of the component (A) in the color conversion composition according to the present invention is normally $1.0 \times 10^{-4}$ to 30 parts by weight, more preferably $1.0 \times 10^{-3}$ to 10 parts by weight, particularly preferably $1.0 \times 10^{-2}$ to 5 parts by weight with respect to 100 parts by weight of the component (B), depending on a molar absorption coefficient, a fluorescent quantum yield and an excitation wavelength absorption intensity of the compound, as well as a thickness and a transmittance of a film to be produced.

Furthermore, when the color conversion composition contains both the light-emitting material (a) emitting a green light and the light-emitting material (b) emitting a red light, the green light is partially converted into a red light, therefore it is preferable that a relationship between a content $w_a$ of the light-emitting material (a) and a content $w_b$ of the light-emitting material (b) satisfies $w_a w_b$, and a content ratio of each material is wa:wb=1000:1 to 1:1, more preferably 500:1 to 2:1, particularly preferably 200:1 to 3:1. Note that $w_a$ and $w_b$ are represented by percent by weight with respect to the weight of the component (B).

<(B) Component: Resin>

A resin as the component (B) has a partial structure represented by general formula (1) and a partial structure represented by general formula (2) in its own molecular structure.

[Formula 35]

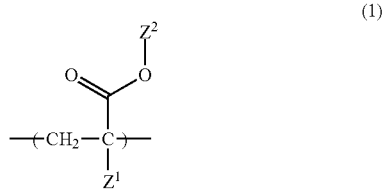

(1)

In general formula (1), $Z^1$ and $Z^2$ may be the same or different, and are hydrogen atom, or an organic group having 1 to 20 carbon atoms.

[Formula 36]

(2)

In general formula (2), $Y^1$ to $Y^4$ may be the same or different, and are hydrogen atom, or an organic group having 1 to 20 carbon atoms, and at least one of $Y^1$ to $Y^4$ is a group including an alicyclic hydrocarbon structure.

Although the light-emitting material contained in the color conversion composition according to the present invention is excited by light, deterioration progresses when the excited light-emitting materials are close to each other, because the excited luminescent material has high reactivity. Therefore, for improving the durability of the light-emitting material contained in the color conversion composition according to the present invention, it is preferable that the light-emitting material is sufficiently dispersed without aggregating in the resin.

For sufficiently dispersing the light-emitting material in the resin, it is preferable that the resin has both partial structures having high and low compatibilities with the light-emitting material. A more preferable form of the resin is a copolymer randomly containing the partial structure having the high compatibility and the partial structure having the low compatibility.

The light-emitting material of the component (A) contained in the color conversion composition according to the present invention characteristically has a sufficient compatibility with the partial structure represented by general formula (1) in the resin of the component (B), but has an insufficient compatibility with the partial structure represented by general formula (2). For this reason, when the resin of the component (B) has both the partial structure represented by general formula (1) and the partial structure represented by general formula (2), the light-emitting material of the component (A) can be sufficiently dispersed in the resin of the component (B), achieving a high durability. Incidentally, this effect is more enhanced when the light-emitting material of the component (A) is an organic light-emitting material, and this effect is further enhanced when the component (A) contains the compound represented by general formula (3).

The light-emitting material contained in the color conversion composition according to the present invention may be decomposed and deteriorated by radical oxidation due to radicals derived from functional groups and moisture-absorbing water contained in the resin molecules. For this reason, the resin is preferably a resin excellent in heat resistance. From the viewpoint of enhancing the heat resistance of the resin, in the partial structure represented by general formula (1) in the resin of the component (B), $Z^1$ is preferably hydrogen atom or a methyl group, more preferably the methyl group.

From the viewpoint of enhancing the heat resistance of the resin, $Z^2$ is preferably hydrogen atom, an alkyl group, a cycloalkyl group, a heterocyclic group, an alkenyl group, a cycloalkenyl group, an alkynyl group, a hydroxyl group, a thiol group, an alkoxy group, an alkylthio group, an aryl ether group, an aryl thioether group, an aryl group, or a heteroaryl group. In addition, these groups may be further substituted with the aforementioned substituents.

The term "unsubstituted" in the case of "substituted or unsubstituted" means that a hydrogen atom or a deuterium atom is substituted.

The same applies to the term "unsubstituted" in the case of "substituted or unsubstituted" in a compound or its partial structure described below.

The alkyl group refers to e.g. a saturated aliphatic hydrocarbon group such as a methyl group, an ethyl group, an n-propyl group, an isopropyl group, an n-butyl group, a sec-butyl group, and a tert-butyl group, which may or may not have a substituent. In the substituted case, additional substituents are not particularly limited, examples of the additional substituents may include an alkyl group, a halogen, an aryl group, a heteroaryl group, and the like, and the same applies to the following description. The number of carbon atoms in the alkyl group is not particularly limited, but is preferably in a range of 1 to 20, more preferably 1 to 8 from the view point of availability and cost.

The cycloalkyl group refers to e.g. a saturated alicyclic hydrocarbon group such as a cyclopropyl group, a cyclohexyl group, a norbornyl group, and an adamantyl group, which may or may not have a substituent. The number of carbon atoms in the alkyl group moiety is not particularly limited, but is preferably in a range of 3 to 20.

Above all, $Z^2$ is more preferably a methyl group from the viewpoint of availability and cost.

In addition, from the viewpoint of enhancing the heat resistance of the resin, in the partial structure represented by general formula (2) in the resin of the component (B), $Y^1$ to $Y^4$ are preferably hydrogen, an alkyl group, a cycloalkyl group, a heterocyclic group, an alkenyl group, a cycloalkenyl group, an alkynyl group, a hydroxyl group, a thiol group, an alkoxy group, an alkylthio group, an aryl ether group, an aryl thioether group, an aryl group, or a heteroaryl group. In addition, these groups may be further substituted with the aforementioned substituents.

Provided that, at least one of $Y^1$ to $Y^4$ is a group containing an alicyclic hydrocarbon structure. Examples of the alicyclic hydrocarbon structure include a substituted or unsubstituted saturated cyclic hydrocarbon (cycloalkyl) structure, an unsaturated cyclic hydrocarbon (cycloalkenyl) structure, and the like. Above all, the saturated cyclic hydrocarbon (cycloalkyl) structure is preferable from the viewpoint of durability.

The number of carbon atoms constituting the alicyclic hydrocarbon structure is not particularly limited, but is normally in a range of 4 to 30, preferably 5 to 20, more preferably 5 to 15.

When the number of carbon atoms constituting the alicyclic hydrocarbon structure is within these ranges, high durability can be obtained while ensuring compatibility with the light-emitting material.

Specific examples of the saturated cyclic hydrocarbon (cycloalkyl) structure include a structure obtained by hydrogenating an aromatic ring moiety in a polymer of an aromatic vinyl-based monomer, such as styrene, α-methylstyrene, β-methylstyrene, p-hydroxystyrene, p-methylstyrene, p-ethylstyrene, p-isopropylstyrene, p-divinylbenzene, alkoxystyrene, chlorostyrene, stilbene, 1-vinylnaphthalene, diphenylethylene, triphenylethylene, tetraphenylethylene, and 4-vinylbiphenyl. Also a vinyl monomer having a saturated cyclic hydrocarbon structure, such as vinylcyclohexane can be used as a raw material.

In the present invention, if at least one of $Y^1$ to $Y^4$ is a group containing an alicyclic hydrocarbon structure, it is not limited in combination thereof, but at least one of $Y^1$ to $Y^4$ is preferably a substituted or unsubstituted cyclohexyl group from the viewpoint of availability and cost. More preferably, one group of $Y^1$ to $Y^4$ is a substituted or unsubstituted cyclohexyl group, and the other three groups are hydrogen atoms.

A content of repeating units of the partial structure represented by general formula (1) in the resin of the component (B) contained in the color conversion composition according to the present invention is not particularly limited, but is preferably 30 wt % or more, more preferably 50 wt % or more, even more preferably 60 wt % or more, particularly preferably 70 wt % or more with respect to the total content of the resin of the component (B). When the proportion of the repeating units of the partial structure represented by general formula (1) is within the above range, compatibility with the light-emitting material can be ensured, and higher durability can be obtained.

A content of repeating units of the partial structure represented by general formula (1) in the resin of the component (B) contained in the color conversion composition according to the present invention is preferably 95 wt % or less, more preferably 90 wt % or less, even more preferably 85 wt % or less with respect to the total content of the resin of the component (B). When the proportion of the repeating units of the partial structure represented by general formula (1) is within the above range, excellent crack resistance can be obtained by forming the color conversion composition into a film.

A content of repeating units of the partial structure represented by general formula (2) in the resin of the component (B) contained in the color conversion composition according to the present invention is not particularly limited, but is preferably 5 wt % or more, more preferably 10 wt % or more, particularly preferably 15 wt % or more with respect to the total content of the resin of the component (B). When the content of the repeating units of the partial structure represented by general formula (2) is within the above range, dispersibility of the light-emitting material can be ensured, and higher durability can be obtained.

A content of repeating units of the partial structure represented by general formula (2) in the resin of the component (B) contained in the color conversion composition according to the present invention is preferably 70 wt % or less, more preferably 50 wt % or less, even more preferably 30 wt % or less with respect to the total content of the resin of the component (B). When the proportion of the repeating units of the partial structure represented by general formula (2) is within the above range, compatibility with the light-emitting material can be ensured, and excellent emission intensity can be obtained by forming the color conversion composition into a film.

A weight average molecular weight (Mw) of the resin of the component (B) is 5,000 or higher, preferably 15,000 or higher, more preferably 20,000 or higher, and furthermore 500,000 or lower, preferably 100,000 or lower, more preferably 50,000 or lower. When the weight average molecular weight is within the above range, a color conversion composition having good compatibility with the light-emitting material and higher durability can be obtained.

In the present invention, the weight average molecular weight is a value measured by a gel permeation chromatography method (GPC method). Specifically, the value is obtained in terms of polystyrene by filtering a sample through a membrane filter having a pore size of 0.45 μm, and then subjecting the sample to GPC (HLC-82A manufactured by Tosoh Corporation) (developing solvent: toluene, developing speed: 1.0 ml/min, column: TSKgel G2000HXL manufactured by Tosoh Corporation).

A glass transition temperature (Tg) of the resin of the component (B) is preferably 50 to 200° C., more preferably 100 to 160° C. When the glass transition temperature is within the above range, higher durability can be acquired in the color conversion film formed from this composition.

The glass transition point can be measured using a commercially available measuring instrument [e.g. a differential scanning calorimeter (trade name: DSC6220, temperature rising rate: 0.5° C./min) manufactured by Seiko Instruments & Electronics Ltd.].

The method for synthesizing these resins is not particularly limited, a known method, e.g. a method of copolymerizing each raw material monomer in the presence of a polymerization initiator can be used as appropriate, or alternatively a commercially available product can also be used. Examples of commercially available products equivalent to the resin of the component (B) include, but are not limited to, Optimas 7500, Optimas 6000 manufactured by MITSUBISHI GAS CHEMICAL COMPANY, INC., and the like.

(Thermoplastic Resin)

The color conversion composition according to the present invention preferably further contains a thermoplastic resin (C) different from the resin of the component (B). As specific examples of the thermoplastic resin (C), known resin can be used, such as: a photocurable resist material having a reactive vinyl group, based on acryl, methacryl, polyvinyl cinnamate, polyimide, ring rubber, or the like; an epoxy resin; a silicone resin (including a cured (crosslinked) organopolysiloxane such as a silicone rubber and a silicone gel); an urea resin; a fluororesin; a polycarbonate resin; an acrylic resin; a methacrylic resin; a polyimide resin; a polyethylene terephthalate resin; a polypropylene resin; a polystyrene resin; an urethane resin; a melamine resin; a polyvinyl resin; a polyamide resin; a phenol resin; a polyvinyl alcohol resin; a cellulose resin; an aliphatic ester resin; an aromatic ester resin; an aliphatic polyolefin resin; an aromatic polyolefin resin; a polystyrene resin; and a polymer of a vinyl aromatic monomer such as styrene and α-methylstyrene, and a hydride of an aromatic ring moiety of the polymer. In addition, a copolymer resin of these resins may be used, or two or more kinds of resins may be mixed. Above all, the acrylic resin, the methacrylic resin, the polystyrene resin, or the polymer of the vinyl aromatic monomer such as styrene and α-methylstyrene, and the hydride of the aromatic ring moiety of the polymer is preferable.

A content of the thermoplastic resin (C) is preferably 1 part by weight to 2000 parts by weight, more preferably 5 parts by weight to 500 parts by weight, particularly preferably 10 parts by weight to 50 parts by weight with respect to 100 parts by weight of the component (B). When the content of the thermoplastic resin (C) is within the above range, color reproducibility can be improved by controlling a peak wavelength and/or a half-value width of the light-emitting material.

<Other Additives>

In addition to the component (A) and the component (B), a filler; an antioxidant; a processing and heat stabilizer; a light resistance stabilizer such as a UV absorber; a dispersant and a leveling agent for stabilizing a coating film; a plasticizer; a crosslinking agent such as an epoxy compound; a curing agent such as amine, acid anhydride and imidazole; a pigment; an adhesive auxiliary agent such as a silane coupling agent as a modifier for a film surface; and the like can be added to the color conversion composition according to the present invention.

Examples of the filler include, but are not limited to, a fine particle such as fumed silica, glass powder and quartz powder; titanium oxide; zirconia oxide; barium titanate; zinc oxide; and a silicone fine particle. In addition, these fillers may be used alone or in combination.

Examples of the antioxidant may include, but are not limited to, phenolic antioxidants such as 2,6-di-tert-butyl-p-cresol and 2,6-di-tert-butyl-4-ethylphenol. These antioxidants may be used alone or in combination.

Examples of the processing and heat stabilizer include, but are not limited to, phosphorus-based stabilizers such as tributyl phosphite, tricyclohexyl phosphite, triethylphosphine, and diphenylbutylphosphine. These stabilizers may be used alone or in combination.

Examples of the light resistance stabilizer include, but are particularly not limited to, benzotriazoles such as 2-(5-methyl-2-hydroxyphenyl)benzotriazole, and 2-[2-hydroxy-3,5-bis(α,α-dimethylbenzyl)phenyl]-2H-benzotriazole. In addition, these light resistance stabilizers may be used alone or in combination.

A content of these additives in the color conversion composition according to the present invention is normally $1.0 \times 10^{-3}$ parts by weight to 30 parts by weight, more preferably $1.0 \times 10^{-2}$ parts by weight to 15 parts by weight, particularly preferably $1.0 \times 10^{-1}$ parts by weight to 10 parts by weight with respect to 100 parts by weight of the component (B), depending on a molar absorption coefficient, a fluorescent quantum yield and an excitation wavelength absorption intensity of the compound, as well as a thickness and a transmittance of a film to be produced.

<Solvent>

The color conversion composition according to the present invention may contain a solvent. The solvent is not particularly limited as long as a viscosity of the resin in a fluid state can be adjusted and the solvent does not excessively affect a light and durability of the light-emitting substance. Examples of the solvent include water, 2-propanol, ethanol, toluene, methylethylketone, methylisobutylketone, cyclohexanone, hexane, acetone, ethyl acetate, butyl acetate, terpineol, texanol, methylcellosolve, ethylcellosolve, butylcarbitol, butylcarbitol acetate, 1-methoxy-2-propanol, propylene glycol monomethyl ether acetate, and the like, and two or more kinds of these solvents can be mixed for use. Among these solvents, particularly toluene is preferably used because it does not affect on deterioration of the compound represented by general formula (3) and there is little residual solvent after drying.

<Method for Producing the Color Conversion Composition>

Hereinafter, an example of a method for producing the color conversion composition according to the present invention will be explained. Predetermined amounts of the aforementioned light-emitting material, resin, solvent and the like are mixed. The aforementioned components are mixed in a predetermined composition, and then homogeneously mixed and dispersed using a stirring/kneading machine such as a homogenizer, a rotation/revolution type stirrer, a three-roll roller, a ball mill, a planetary ball mill, and a bead mill, to obtain a color conversion composition. After or during mixing and dispersion, defoaming is preferably performed under vacuum or reduced pressure. In addition, a specific component may be previously mixed, or a processing such as aging may be performed. The solvent can be removed by an evaporator to obtain a desired solid content concentration.

<Method for Producing the Color Conversion Film>

In the present invention, the configuration of the color conversion film is not limited as long as the color conversion film includes a layer obtained by drying or curing the color conversion composition. Examples of a typical structure of the color conversion film include a laminate of a base layer 10 and a color conversion layer 11 obtained by curing the color conversion composition as illustrated in FIG. 1, or a laminate in which the color conversion layer 11 is sandwiched between a plurality of base layers 10 as illustrated in FIG. 2. The color conversion film may further have a barrier film 12 as illustrated in FIG. 3 for preventing deterioration due to oxygen, moisture or heat of the color conversion layer.

A thickness of the color conversion film is not particularly limited, but preferably the total of all layers is 1 to 5000 μm. If the thickness is less than 1 μm, a problem that toughness of the film is reduced is caused. If the thickness exceeds 5000 μm, cracks are easily caused and the color conversion film is difficult to form. The thickness is more preferably 10 to 1000 μm, even more preferably 15 to 500 μm, particularly preferably 30 to 300 μm.

The film thickness of the color conversion film according to the present invention refers to a film thickness (average film thickness) measured based on JIS K7130 (1999), Plastics-Film and sheeting-Determination of thickness by mechanical scanning, Method A.

(Base Layer)

As the base layer, known metal, film, glass, ceramic, paper, and the like can be used without particular limitation. Specific examples of the base layer include: a metal plate or foil of aluminum (including aluminum alloy), zinc, copper, iron or the like; a plastic film of cellulose acetate, polyethylene terephthalate (PET), polyethylene, polyester, polyamide, polyimide, polyphenylene sulfide, polystyrene, polypropylene, polycarbonate, polyvinyl acetal, aramid, silicone, polyolefin, a copolymer of tetrafluoroethylene and ethylene which is a thermoplastic fluororesin (ETFE), or the like; a plastic film made of an α-polyolefin resin, a polycaprolactone resin, an acrylic resin, a silicone resin, and a copolymer resin of each of the resins with ethylene; paper obtained by laminating the plastic, or paper coated with the plastic; paper on which the metal is laminated or vapor-deposited; a plastic film on which the metal is laminated or vapor-deposited; and the like. Furthermore, when the base material is a metal plate, the surface may be subjected to plating treatment with chromium, nickel or the like, or to ceramic treatment.

Above all, the glass and the resin film are preferably used because of good producibility of the color conversion film and good formability of the color conversion film. In addition, a film having a high strength for preventing possibility of breakage or the like in handling the film-like base is preferable. In terms of required properties and economic efficiency for the bases, the resin films are preferable, and above all, a plastic film selected from a group consisting of PET, polyphenylene sulfide, polycarbonate, and polypropylene is preferable in terms of economic efficiency and handleability. In addition, when the color conversion film is dried or when the color conversion film is pressure-formed with an extruder at a high temperature of 200° C. or higher, the polyimide film is preferable in terms of heat resistance. The surface of the base layer may be previously release-processed in terms of ease of film peeling.

A thickness of the base layer is not particularly limited, but the lower limit is preferably 5 µm or more, more preferably 25 µm or more, even more preferably 38 µm or more. In addition, the upper limit is preferably 5000 µm or less, more preferably 3000 µm or less.

(Color Conversion Layer)

Next, an example of a method for producing the color conversion layer of the color conversion film according to the present invention will be explained. The color conversion composition produced by the aforementioned method is applied on a base, and dried. For the application, a reverse roll coater, a blade coater, a slit die coater, a direct gravure coater, an offset gravure coater, a kiss coater, a natural roll coater, an air knife coater, a roll blade coater, a two-stream coater, a rod coater, a wire bar coater, an applicator, a dip coater, a curtain coater, a spin coater, a knife coater, or the like can be used. For obtaining film thickness uniformity for the color conversion layer, it is preferable to apply the color conversion composition using the slit die coater or the dip coater.

The color conversion layer can be dried using a general heating device such as a hot air dryer and an infrared dryer. The color conversion layer can be heated using a general heating device such as a hot air dryer and an infrared dryer. In this case, the heating is carried out typically under a condition at 40° C. to 250° C. for 1 minute to 5 hours, preferably at 60° C. to 200° C. for 2 minutes to 4 hours. Also, stepwise heating and curing such as step curing can be possible.

After producing the color conversion layer, the base can be changed as necessary. In this case, examples of a simple method include, but are not limited to, a method of replacing the base using a hot plate, a method using a vacuum laminator or a dry film laminator, and the like.

A thickness of the color conversion layer is not particularly limited, but is preferably 1 to 1000 µm, more preferably 10 to 1000 µm. If the thickness is less than 1 µm, a problem that toughness of the film is reduced is caused. If the thickness exceeds 1000 µm, cracks are easily caused and the color conversion film is difficult to form. The thickness is more preferably 10 to 100 µm, even more preferably 15 to 100 µm, particularly preferably 30 to 100 µm.

(Barrier Film)

The barrier film is appropriately used in the case of improving a gas barrier property for the color conversion layer, and examples of the barrier film include films made of: an inorganic oxide such as silicon oxide, aluminum oxide, titanium oxide, tantalum oxide, zinc oxide, tin oxide, indium oxide, yttrium oxide, and magnesium oxide; an inorganic nitride such as silicon nitride, aluminum nitride, titanium nitride, and silicon carbonitride, or a mixture of these nitrides; or a metal oxide thin film or a metal nitride thin film obtained by adding another element to these oxides or nitrides; or various resins such as polyvinylidene chloride, an acrylic resin, a silicone-based resin, a melamine-based resin, an urethane-based resin, a fluorine-based resin, and a polyvinyl alcohol-based resin like a saponified vinyl acetate. In addition, examples of a film having a barrier function against moisture include films made of various resins such as polyethylene, polypropylene, nylon, polyvinylidene chloride, a copolymer of vinylidene chloride and vinyl chloride or vinylidene chloride and acrylonitrile, a fluorine-based resin, and a polyvinyl alcohol-based resin like a saponified vinyl acetate.

The barrier film may be formed on both sides of the color conversion layer 11 as illustrated in FIG. 3, or may be formed only on one side.

In addition, an auxiliary layer having a light diffusion layer, an antireflection function, an antiglare function, an antireflection antiglare function, a hard coating function (friction resistance function), an antistatic function, an antifouling function, an electromagnetic wave shielding function, an infrared cutting function, an ultraviolet cutting function, a polarization function, or a toning function may be further formed, depending on functions required for the color conversion film.

<Excitation Light>

Regarding types of the excitation light, any excitation light can be used as long as the excitation light emits a light in a wavelength region that can be absorbed by the mixed light-emitting substance such as the compound represented by general formula (3). Any excitation light, e.g. a hot cathode tube and cold cathode tube, a fluorescent light source such as an inorganic EL, an organic electroluminescence element light source, an LED light source, an incandescent light source, sunlight, or the like can be used in principle, but above all, the LED is a suitable excitation light. For display and lighting applications, a blue LED having an excitation light at 430 to 500 nm is a more suitable excitation light in terms of increasing a color purity of blue light. When the wavelength range of the excitation light is longer than this range of 430 to 500 nm, white light cannot be formed due to lack of blue light. Also, the wavelength range of the excitation light shorter than this range of 430 to 500 nm is not preferable because the light-emitting substance such as the compound represented by general formula (3) or the organic compound such as a resin is readily photodegraded.

The excitation light may have one type of emission peak or two or more types of emission peaks, but an excitation light having one type of emission peak is preferable for increasing the color purity. Also, a plurality of excitation light sources having different types of emission peaks can be arbitrarily combined for use.

<Light Source Unit>

The light source unit according to the present invention has a configuration including at least a light source, and a color conversion composition or a color conversion film. When including the color conversion composition, the arrangement manner of the light source and the color conversion composition is not particularly limited, and the light source unit may have a configuration that the color conversion composition is directly applied to the light source, or a configuration that the color conversion composition is applied on a film, grass or the like that is separated from the light source. When including the color conversion film, the arrangement manner of the light source and the color conversion film is not particularly limited, and the light source unit may have a configuration that the light source and the color conversion film are in close contact, or may have a remote phosphor format that the light source and the color conversion film are separated form each other. In addition, the light source unit may have a configuration further including a color filter for the purpose of increasing the color purity.

As described above, the excitation light in the range of 430 to 500 nm has a relatively low excitation energy, and can prevent decomposition of the light-emitting substance such as the compound represented by general formula (3), and therefore the light source is preferably a light-emitting diode having a maximum emission wavelength in a range of 430 to 500 nm.

The light source unit according to the present invention is useful for various light sources such as a space lighting and backlight, and specifically can be used for applications such as displays, lightings, interiors, signs, and signboards, and in particular, can be preferably used for the display and lighting applications.

EXAMPLES

Hereinafter, the present invention will be explained with reference to Examples, but the present invention is not limited to these examples.

In the following Examples and Comparative Examples, compounds G-1 and R-1 are as presented below.

[Formula 37]

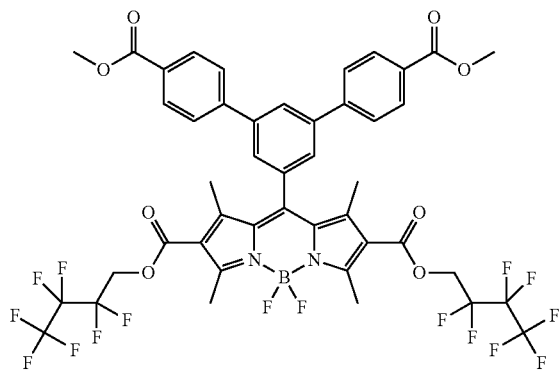

G-1

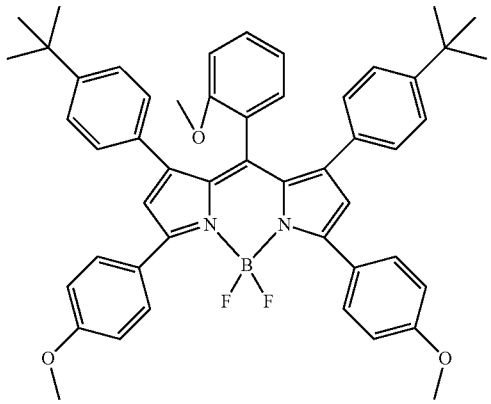

R-1

<Measurement of Color Conversion Properties>

A blue LED was turned on by applying a current of 100 mA to a light-emitting device equipped with each color conversion film and a blue LED (manufactured by USHIO EPITEX INC.; model number SMBB450H-1100, emission peak wavelength: 450 nm). An emission spectrum, an emission intensity at a peak wavelength, and chromaticity were measured using a spectral radiance meter (CS-1000, manufactured by KONICA MINOLTA, INC.), Note that a distance between each color conversion film and the blue LED element was 3 cm.

<Light Durability Test>

A blue LED was turned on by applying a current of 100 mA to a light-emitting device equipped with each color conversion film and the blue LED (manufactured by USHIO EPITEX INC.; model number SMBB450H-1100, emission peak wavelength: 450 nm). An initial brightness was measured using the spectral radiance meter (CS-1000, manufactured by KONICA MINOLTA, INC.), Note that the distance between each color conversion film and the blue LED element was 3 cm. Subsequently, a durability of the color conversion film was evaluated by continuously emitting a light from a blue LED element at 50° C. and observing a time for decreasing a brightness by 10% from an initial brightness.

<Color Reproduction Range Measurement>

A liquid crystal monitor (SW2700PT) manufactured by BenQ Corporation was disassembled, and a color conversion sheet housed in the monitor was replaced with a color conversion sheet prepared in Examples and Comparative Examples described later, and then the monitor was assembled to its former state. At this time, a backlight unit had a configuration of "reflection film/light guide plate/diffusion sheet/color conversion sheet/prism sheet/reflective polarizing film". When single colors of blue, green and red were displayed on the obtained monitor, each color coordinate in a color space (x, y) was measured using a spectral radiance meter (CS-1000, manufactured by KONICA MINOLTA, INC.). An area of a color gamut was calculated from the obtained three-point color coordinate, and an area ratio to the color gamut area of the DCI-P3 standard was calculated. An area ratio was preferably 100% or higher, more preferably 110% or higher.

<1H-NMR Measurement>

$^1$H-NMR of the compound was measured in a deuterated chloroform solution using superconducting FTNMR EX-270 (manufactured by JEOL Ltd.).

Light-Emitting Material

Synthesis Example 1

Method for Synthesizing Compound G-1

Ethyl 2,4-dimethylpyrrole-3-carboxylate (100 g), methanol (522 mL) and an aqueous solution prepared by dissolving potassium hydroxide (166 g) in water (261 mL) were put into a flask, and refluxed for 4 hours. Then, methanol was distilled off by distillation, and a temperature inside the flask was decreased to 10° C. or lower using an ice bath. In the ice bath, 247 mL of concentrated hydrochloric acid was dripped into the mixture to adjust a pH to 1. The precipitated brown solid was filtered, and washed with water to obtain 2,4-dimethyl-pyrrole-3-carboxylic acid (74 g) as a pale brown solid.

2,4-dimethyl-pyrrole-3-carboxylic acid (30.3 g), 2,2,3,3,4,4,4-heptafluoro-1-butanol (56.5 g), DCC (44.9 g), DMAP (2.13 g) and ethyl acetate (725 mL) were put into a flask, and refluxed for 2 hours. The temperature inside the flask was decreased to 10° C. or lower using an ice bath, then the mixture was filtered, 500 mL of water was added to the filtrate, which was stirred for 10 minutes, and then an organic layer was separated. Furthermore, the organic layer was washed with 500 mL of water twice, dried with magnesium sulfate and filtered, and then the solvent was distilled off. The obtained solid was dissolved in 500 mL of toluene and purified by silica gel chromatography to obtain 39.0 g of intermediate A.

3,5-bis(4-methoxycarbonylphenyl)benzaldehyde (1.0 g) and the intermediate A (3.6 g) were put into a flask, to which dichloromethane (28 mL) and trifluoroacetic acid (1 drop) were added, and stirred in a nitrogen atmosphere for 15 hours. 2,3-dichloro-5,6-dicyano-1,4-benzoquinone (2.5 g) was added to the mixture, and further stirred for 1 hour. After completion of the reaction, boron trifluoride-diethyl ether complex (2.1 mL) and diisopropylethylamine (3.2 mL) were added to the mixture, stirred for 4 hours, to which subsequently water (100 mL) was further added and stirred, and an organic layer was separated. Furthermore, this organic layer was dried with magnesium sulfate and filtered, and then the solvent was distilled off. The obtained reaction product was purified by silica gel chromatography to obtain 1.1 g of compound G-1.

$^1$H-NMR (CDCl$_3$, ppm): 8.16 (d, 4H), 8.07 (s, 1H), 7.73 (d, 4H), 7.60 (s, 2H), 4.72 (t, 4H), 3.96 (s, 6H), 2.87 (s, 6H), 1.83 (s, 6H).

G-2: Coumarin 6 manufactured by Sigma-Aldrich Co. LLC was used.

G-3: Quantum dots (product number: 753777) manufactured by Sigma-Aldrich Co. LLC were used.

Synthesis Example 2

Method for Synthesizing Compound R-1

A mixed solution containing 300 mg of 4-(4-t-butylphenyl)-2-(4-methoxyphenyl)pyrrole, 201 mg of 2-methoxybenzoyl chloride and 10 ml of toluene was heated in a nitrogen stream at 120° C. for 6 hours. The mixed solution was cooled to room temperature, and then evaporated. The mixed solution was washed with 20 ml of ethanol, and then vacuum-dried to obtain 260 mg of 2-(2-methoxybenzoyl)-3-(4-t-butylphenyl)-5-(4-methoxyphenyl)pyrrole.

Subsequently, a mixed solution containing 260 mg of 2-(2-methoxybenzoyl)-3-(4-t-butylphenyl)-5-(4-methoxyphenyl)pyrrole, 180 mg of 4-(4-t-butylphenyl)-2-(4-methoxyphenyl)pyrrole, 206 mg of methanesulfonic anhydride, and 10 ml of degassed toluene was heated in a nitrogen stream at 125° C. for 7 hours. The mixed solution was cooled to room temperature, then 20 ml of water was introduced into the mixed solution, and an organic layer was extracted with 30 ml of dichloromethane. The organic layer was washed with 20 ml of water twice, evaporated, and vacuum-dried.

Subsequently, to the obtained mixed solution of the pyromethene body and 10 ml of toluene, 305 mg of diisopropylethylamine and 670 mg of boron trifluoride-diethyl ether complex were added in a nitrogen stream, and stirred at room temperature for 3 hours. To the mixed solution, 20 ml of water was introduced, and an organic layer was extracted with 30 ml of dichloromethane. The organic layer was washed with 20 ml of water twice, dried with magnesium sulfate, and evaporated. The organic layer was purified by silica gel column chromatography, and then vacuum-dried to obtain 0.27 g of reddish-purple powder. A result of $^1$H-NMR analysis of the obtained powder is as follows, and it was confirmed that the reddish-purple powder obtained above was R-1.

$^1$H-NMR (CDCl$_3$, ppm): 1.19 (s, 18H), 3.42 (s, 3H), 3.85 (s, 6H), 5.72 (d, 1H), 6.20 (t, 1H), 6.42-6.97 (m, 16H), 7.89 (d, 4H).

R-2: "Lumogen" (registered trademark) F Red 300 manufactured by BASF SE was used as an organic light-emitting material other than the compound represented by general formula (3).

R-3: Quantum dots (product number: 753882) manufactured by Sigma-Aldrich Co. LLC were used.

<Resin>

Synthesis of Resin A

To 100 parts by weight of a monomer composition composed of 29.5 wt % of methyl methacrylate and 70.5 wt % of styrene as monomer components and 0.005 wt % of t-amylperoxy 2-ethylhexanoate as a polymerization initiator, 400 parts by weight of diethylene glycol diethyl ether as a solvent was added, the mixture was continuously fed to a 10 liter mixing tank equipped with a helical ribbon at a rate of 1 kg/hour, and continuously polymerized at a polymerization temperature of 150° C. with an average retention period of 2.5 hours.

The polymerization liquid was extracted from a bottom of a polymerization tank such that a liquid level of the polymerization tank was even, the liquid was introduced into an extruder equipped with a vent port while maintaining a temperature at 150° C., and the resin was extruded while devolatilizing volatile components.

The obtained resin was dissolved in dioxane to prepare a 10 wt % dioxane solution. A 1000 mL autoclave device was charged with 500 parts by weight of a 10 wt % dioxane solution and 1 part by weight of 10 wt % Pd/C (manufactured by Wako Pure Chemical Industries, Ltd.), which was preserved under a hydrogen pressure of 10 MPa at 200° C. for 15 hours to hydrogenate an aromatic ring derived from styrene. After removing the Pd/C with a filter, the obtained resin solution was purified by precipitation in methanol to obtain a resin A.

As a result of calculating contents of a partial structure represented by general formula (1) and a partial structure represented by general formula (2) in the resin A by $^1$H-NMR measurement, the resin A was proven to contain 30.0 wt % of the partial structure represented by general formula (1) and 70.0 wt % of the partial structure represented by general formula (2). In addition, it was found that among the partial structures $Y^1$ to $Y^4$ represented by general formula (2), one structure was an unsubstituted cyclohexyl group, and the other three structures were hydrogen atoms.

Synthesis of Resin B

A resin B was synthesized by the same manipulation as for the resin A except for using a monomer composition composed of 49.0 wt % of methyl methacrylate and 51.0 wt % of styrene as monomer components, and 0.005 wt % of t-amylperoxy 2-ethylhexanoate as a polymerization initiator.

As a result of calculating contents of a partial structure represented by general formula (1) and a partial structure represented by general formula (2) in the resin B by $^1$H-NMR measurement, the resin B was proven to contain 50.0 wt % of the partial structure represented by general formula (1) and 50.0 wt % of the partial structure represented by general formula (2). In addition, it was found that among the partial structures $Y^1$ to $Y^4$ represented by general formula (2), one structure was an unsubstituted cyclohexyl group, and the other three structures were hydrogen atoms.

Synthesis of Resin C

A resin C was synthesized by the same manipulation as for the resin A except for using a monomer composition composed of 59.0 wt % of methyl methacrylate and 41.0 wt % of styrene as monomer components, and 0.005 wt % of t-amylperoxy 2-ethylhexanoate as a polymerization initiator.

As a result of calculating contents of a partial structure represented by general formula (1) and a partial structure represented by general formula (2) in the resin C by $^1$H-NMR measurement, the resin C was proven to contain 60.0 wt % of the partial structure represented by general formula (1) and 40.0 wt % of the partial structure represented by general formula (2). In addition, it was found that among the partial structures $Y^1$ to $Y^4$ represented by general formula (2), one structure was an unsubstituted cyclohexyl group, and the other three structures were hydrogen atoms.

Synthesis of Resin D

A resin D was synthesized by the same manipulation as for the resin A except for using a monomer composition composed of 74.5 wt % of methyl methacrylate and 24.5 wt % of styrene as monomer components, and 0.005 wt % of t-amylperoxy 2-ethylhexanoate as a polymerization initiator.

As a result of calculating contents of a partial structure represented by general formula (1) and a partial structure represented by general formula (2) in the resin D by $^1$H-NMR measurement, the resin D was proven to contain 75.0 wt % of the partial structure represented by general formula (1) and 25.0 wt % of the partial structure represented by general formula (2). In addition, it was found that among the partial structures $Y^1$ to $Y^4$ represented by general formula (2), one structure was an unsubstituted cyclohexyl group, and the other three structures were hydrogen atom.

Synthesis of Resin E

A resin E was synthesized by the same manipulation as for the resin A except for using a monomer composition composed of 84.0 wt % of methyl methacrylate and 16.0 wt % of styrene as monomer components, and 0.005 wt % of t-amylperoxy 2-ethylhexanoate as a polymerization initiator.

As a result of calculating contents of a partial structure represented by general formula (1) and a partial structure represented by general formula (2) in the resin E by $^1$H-NMR measurement, the resin E was proven to contain 85.0 wt % of the partial structure represented by general formula (1) and 15.0 wt % of the partial structure represented by general formula (2). In addition, it was found that among the partial structures $Y^1$ to $Y^4$ represented by general formula (2), one structure was an unsubstituted cyclohexyl group, and the other three structures were hydrogen atom.

Synthesis of Resin F

A resin F was synthesized by the same manipulation as for the resin A except for using a monomer composition composed of 94.5 wt % of methyl methacrylate and 5.5 wt % of styrene as monomer components, and 0.005 wt % of t-amylperoxy 2-ethylhexanoate as a polymerization initiator.

As a result of calculating contents of a partial structure represented by general formula (1) and a partial structure represented by general formula (2) in the resin F by $^1$H-NMR measurement, the resin F was proven to contain 95.0 wt % of the partial structure represented by general formula (1) and 5.0 wt % of the partial structure represented by general formula (2). In addition, it was found that among the partial structures $Y^1$ to $Y^4$ represented by general formula (2), one structure was an unsubstituted cyclohexyl group, and the other three structures were hydrogen atom.

Resin G: Optimas 6000 (PMMA-hydrogenated styrene copolymer manufactured by MITSUBISHI GAS CHEMICAL COMPANY, INC.) was used.

As a result of calculating contents of a partial structure represented by general formula (1) and a partial structure represented by general formula (2) in the resin G by $^1$H-NMR measurement, the resin G was proven to contain 61.0 wt % of the partial structure represented by general formula (1) and 39.0 wt % of the partial structure represented by general formula (2). In addition, it was found that among the partial structures $Y^1$ to $Y^4$ represented by general formula (2), one structure was an unsubstituted cyclohexyl group, and the other three structures were hydrogen atom.

Resin H: Optimas 7500 (PMMA-hydrogenated styrene copolymer manufactured by MITSUBISHI GAS CHEMICAL COMPANY, INC.) was used.

As a result of calculating contents of a partial structure represented by general formula (1) and a partial structure represented by general formula (2) in the resin H by $^1$H-NMR measurement, the resin H was proven to contain 77.0 wt % of the partial structure represented by general formula (1) and 23.0 wt % of the partial structure represented by general formula (2). In addition, it was found that among the partial structures $Y^1$ to $Y^4$ represented by general formula (2), one structure was an unsubstituted cyclohexyl group, and the other three structures were hydrogen atom.

Synthesis of Resin I

A resin I was synthesized by the same manipulation as for the resin A except for using a monomer composition composed of 75.0 wt % of methyl methacrylate and 25.0 wt % of styrene as monomer components, and 0.005 wt % of t-amylperoxy 2-ethylhexanoate as a polymerization initiator.

As a result of calculating contents of a partial structure represented by general formula (1) and a partial structure represented by general formula (2) in the resin I by $^1$H-NMR measurement, the resin I was proven to contain 75.7 wt % of the partial structure represented by general formula (1) and 24.3 wt % of the partial structure represented by general formula (2).

In addition, it was found that among the partial structures $Y^1$ to $Y^4$ represented by general formula (2), one structure was an unsubstituted cyclohexyl group, and the other three structures were hydrogen atom.

Resin J: BR-85 (PMMA manufactured by Mitsubishi Chemical Corporation) was used.

Synthesis of Resin K

A resin K was synthesized by the same manipulation as for the resin A except for using a monomer composition composed of 100.0 wt % of styrene as a monomer component, and 0.005 wt % of t-amylperoxy 2-ethylhexanoate as a polymerization initiator.

From $^1$H-NMR measurement, the resin K was proven to contain 100 wt % of the structure represented by the general formula (2). In addition, it was found that among the partial structures $Y^1$ to $Y^4$ represented by general formula (2), one structure was an unsubstituted cyclohexyl group, and the other three structures were hydrogen atom.

Resin L: SEPTON V9827 (hydrogenated styrene-ethylene-butylene-styrene copolymer manufactured by KURARAY CO., LTD.) was used. The resin L has a partial structure represented by general formula (2), and among $Y^1$ to $Y^4$, one group is an unsubstituted cyclohexyl group, and the other three groups are hydrogen atoms, but the resin L does not include the partial structure represented by general formula (1).

Synthesis of Resin M

A resin M was synthesized by the same manipulation as for the resin A except for using a monomer composition composed of 74.5 wt % of ethyl methacrylate and 24.5 wt % of styrene as monomer components, and 0.005 wt % of t-amylperoxy 2-ethylhexanoate as a polymerization initiator.

As a result of calculating contents of a partial structure represented by general formula (1) and a partial structure represented by general formula (2) in the resin M by $^1$H-NMR measurement, the resin M was proven to contain 75.0 wt % of the partial structure represented by general formula (1) and 25.0 wt % of the partial structure represented by general formula (2). In addition, it was found that among the partial structures $Y^1$ to $Y^4$ represented by general formula (2), one structure was an unsubstituted cyclohexyl group, and the other three structures were hydrogen atom.

Synthesis of Resin N

A resin N was synthesized by the same manipulation as for the resin A except for using a monomer composition composed of 74.5 wt % of methyl methacrylate and 24.5 wt % of 1-vinylnaphthalene as monomer components, and 0.005 wt % of t-amylperoxy 2-ethylhexanoate as a polymerization initiator.

As a result of calculating contents of a partial structure represented by general formula (1) and a partial structure represented by general formula (2) in the resin N by $^1$H-NMR measurement, the resin N was proven to contain 75.0 wt % of the partial structure represented by general formula (1) and 25.0 wt % of the partial structure represented by general formula (2). In addition, it was found that among the partial structures $Y^1$ to $Y^4$ represented by general formula (2), one structure was an unsubstituted decahydronaphthyl group, and the other three structures were hydrogen atoms.

Examples 1 to 9

To 100 parts by weight of resin, 0.40 parts by weight of compound G-1, 0.01 parts by weight of compound R-1 and 300 parts by weight of toluene as a solvent were added, and then the mixture was stirred and deformed using a planetary stirring/defoaming device "MAZERUSTAR KK-400" (manufactured by KURABO INDUSTRIES LTD.) at 1000 rpm for 20 minutes to obtain a color conversion composition as a resin solution for producing a color conversion layer. Table 2 presents resins used when preparing resin solutions for producing color conversion layers in each Example.

"Vylon630" (polyester resin manufactured by TOYOBO CO., LTD.) was used as a resin, and, to 100 parts by weight of this polyester resin, 300 parts by weight of toluene as a solvent was added in the same manner as described above, and then the mixture was stirred and deformed using a planetary stirring/defoaming device "MAZERUSTAR KK-400" (manufactured by KURABO INDUSTRIES LTD.) at 300 rpm for 20 minutes to obtain a resin composition.

Subsequently, the color conversion composition was applied on "Lumirror" U48 (manufactured by Toray Industries, Inc., thickness: 50 μm) using a slit die coater, and heated and dried at 120° C. for 20 minutes to form a color conversion layer having an average film thickness of 20 μm.

In the same manner as described above, the aforementioned resin composition as an adhesive composition was applied on a PET base layer side of a light diffusion film "Chemical Mat" 125PW (manufactured by Kimoto Co., Ltd., thickness: 138 μm) using the slit die coater, and heated and dried at 120° C. for 20 minutes to form an adhesive layer having an average film thickness of 15 μm.

Subsequently, the aforementioned two units are laminated by heating such that the color conversion layer and the adhesive layer are directly laminated, to produce a color conversion film having a configuration of "base layer/color conversion layer/adhesive layer/base layer/light diffusion layer".

Blue light was color-converted using the color conversion film produced in each Example. As a result, when extracting only a green light-emitting region, a green light having a peak wavelength of 529 nm and a peak wavelength emission spectrum half-value width of 27 nm was obtained. When extracting only a red light-emitting region, a red light having a peak wavelength of 622 nm and a peak wavelength emission spectrum half-value width of 54 nm was obtained.

The color conversion properties were measured by the aforementioned method to calculate a relative value of an emission intensity at a peak wavelength of the green light in each Example with respect to 1.00 of green emission intensity in Comparative Example 1 described later, and a relative value of an emission intensity at a peak wavelength of the red light in each Example with respect to 1.00 of red emission intensity in Comparative Example 1 described later. In addition, a light durability test was conducted in the aforementioned method. The results are presented in Table 2.

The color conversion sheet housed in the liquid crystal monitor (SW2700PT) manufactured by BenQ Corporation was replaced with a color conversion sheet prepared in each Example, and then the monitor was assembled to its former state. When single colors of blue, green and red were displayed on the obtained monitor, each color coordinate in a color space (x, y) was measured using a spectral radiance meter (CS-1000, manufactured by KONICA MINOLTA, INC.). An area of a color gamut was calculated from the obtained three-point color coordinate, and an area ratio to the color gamut area of the DCI-P3 standard was calculated. The results are presented in Table 2.

Example 10

A color conversion film was produced by the same manipulation as in Example 4 except for using G-2 and R-2 as the light-emitting materials when preparing the color conversion composition for producing the color conversion layer.

Blue light was color-converted using the produced color conversion film. As a result, when extracting only a green light-emitting region, a green light having a peak wavelength of 535 nm and a peak wavelength emission spectrum half-value width of 80 nm was obtained. When extracting only a red light-emitting region, a red light having a peak wavelength of 615 nm and a peak wavelength emission spectrum half-value width of 55 nm was obtained.

The color conversion properties were measured by the aforementioned method to calculate a relative value of an emission intensity at a peak wavelength of the green light in each Example with respect to 1.00 of green emission intensity in Comparative Example 1 described later, and a relative value of an emission intensity at a peak wavelength of the red light in each Example with respect to 1.00 of red emission intensity in Comparative Example 1 described later. In addition, a light durability test and a color reproducibility measurement were conducted in the aforementioned methods. The results are presented in Table 3.

Example 11

A color conversion film was produced by the same manipulation as in Example 4 except for using G-3 and R-3 as the light-emitting materials when preparing the color conversion composition for producing the color conversion layer.

Blue light was color-converted using the produced color conversion film. As a result, when extracting only a green light-emitting region, a green light having a peak wavelength of 535 nm and a peak wavelength emission spectrum half-value width of 35 nm was obtained. When extracting only a red light-emitting region, a red light having a peak wavelength of 630 nm and a peak wavelength emission spectrum half-value width of 40 nm was obtained.

The color conversion properties were measured by the aforementioned method to calculate a relative value of an emission intensity at a peak wavelength of the green light in each Example with respect to 1.00 of green emission intensity in Comparative Example 1 described later, and a relative value of an emission intensity at a peak wavelength of the red light in each Example with respect to 1.00 of red emission intensity in Comparative Example 1 described later. In addition, a light durability test and a color reproducibility measurement were conducted in the aforementioned methods. The results are presented in Table 3.

Example 12

A color conversion film was produced by the same manipulation as in Example 4 except for using the resin M as the resin when preparing the color conversion composition for producing the color conversion layer.

Blue light was color-converted using the produced color conversion film. As a result, when extracting only a green light-emitting region, a green light having a peak wavelength of 529 nm and a peak wavelength emission spectrum half-value width of 27 nm was obtained. When extracting only a red light-emitting region, a red light having a peak wavelength of 622 nm and a peak wavelength emission spectrum half-value width of 54 nm was obtained.

The color conversion properties were measured by the aforementioned method to calculate a relative value of an emission intensity at a peak wavelength of the green light in each Example with respect to 1.00 of green emission intensity in Comparative Example 1 described later, and a relative value of an emission intensity at a peak wavelength of the red light in each Example with respect to 1.00 of red emission intensity in Comparative Example 1 described later. In addition, a light durability test and a color reproducibility measurement were conducted in the aforementioned methods. The results are presented in Table 3.

Example 13

A color conversion film was produced by the same manipulation as in Example 4 except for using the resin N as the resin when preparing the color conversion composition for producing the color conversion layer.

Blue light was color-converted using the produced color conversion film. As a result, when extracting only a green light-emitting region, a green light having a peak wavelength of 529 nm and a peak wavelength emission spectrum half-value width of 27 nm was obtained. When extracting only a red light-emitting region, a red light having a peak wavelength of 622 nm and a peak wavelength emission spectrum half-value width of 54 nm was obtained.

The color conversion properties were measured by the aforementioned method to calculate a relative value of an emission intensity at a peak wavelength of the green light in each Example with respect to 1.00 of green emission intensity in Comparative Example 1 described later, and a relative value of an emission intensity at a peak wavelength of the red light in each Example with respect to 1.00 of red emission intensity in Comparative Example 1 described later. In addition, a light durability test and a color reproducibility measurement were conducted in the aforementioned methods. The results are presented in Table 3.

It was found that, compared to the durability of the color conversion film obtained in Comparative Example 1, the color conversion films in Examples 1 to 13 had high durability, and in particular, the color conversion films produced in Examples 3 to 5 and Examples 7 and 8 had especially high durability.

Comparative Examples 1 and 2

A color conversion film was produced by the same manipulation as in Example 1 except for using the resin presented in Table 2 as the resin when preparing the color conversion composition for producing the color conversion layer.

Blue light was color-converted using the obtained color conversion film. As a result, when extracting only a green light-emitting region, a green light having a peak wavelength of 529 nm and a peak wavelength emission spectrum half-value width of 27 nm was obtained. When extracting only a red light-emitting region, a red light having a peak wavelength of 622 nm and a peak wavelength emission spectrum half-value width of 54 nm was obtained.

The color conversion properties were measured by the aforementioned method to calculate a relative value of an emission intensity at a peak wavelength of the green light in each Example with respect to 1.00 of green emission intensity in Comparative Example 1 described later, and a relative value of an emission intensity at a peak wavelength of the red light in each Example with respect to 1.00 of red emission intensity in Comparative Example 1 described later. The results are as presented in Table 2.

It was found that the green and red light emission intensities were very low due to poor compatibility between the resin and the light-emitting material and aggregation of the light-emitting material.

Furthermore, as a result of conducting the light durability test in the aforementioned method, it was found that a time for decreasing the brightness by 10% from the initial brightness was 10 hours, and the durability was very poor.

Comparative Example 3

A color conversion film was produced by the same manipulation as in Example 1 except for mixing and using the resin J and resin L as the resins at a ratio of 1:1 when preparing the color conversion composition for producing the color conversion layer.

Blue light was color-converted using the obtained color conversion film. As a result, when extracting only a green light-emitting region, a green light having a peak wavelength of 529 nm and a peak wavelength emission spectrum half-value width of 27 nm was obtained. When extracting only a red light-emitting region, a red light having a peak wavelength of 622 nm and a peak wavelength emission spectrum half-value width of 54 nm was obtained.

The emission intensities at the peak wavelengths of the green and red lights were measured by the aforementioned color conversion property measurement. In addition, a light durability test and a color reproducibility measurement were conducted in the aforementioned methods. The results are presented in Table 3.

Comparative Example 4

A color conversion film was produced by the same manipulation as in Comparative Example 1 except for using G-2 and R-2 as the light-emitting materials when preparing the color conversion composition for producing the color conversion layer.

Blue light was color-converted using the obtained color conversion film. As a result, when extracting only a green light-emitting region, a green light having a peak wavelength of 535 nm and a peak wavelength emission spectrum half-value width of 80 nm was obtained. When extracting only a red light-emitting region, a red light having a peak wavelength of 615 nm and a peak wavelength emission spectrum half-value width of 55 nm was obtained.

The emission intensities at the peak wavelengths of the green and red lights were measured by the aforementioned color conversion property measurement. In addition, a light durability test and a color reproducibility measurement were conducted in the aforementioned methods. The results are presented in Table 3.

When comparing among Examples 1 to 13, Comparative Example 1, and Comparative Examples 2 to 4, a time for decreasing the brightness by 10% was significantly improved in Examples 1 to 13. That means, it was found that when the resin for use had both the structure represented by general formula (1) and the structure represented by general formula (2) in its own molecule, the durability was improved. In addition, when comparing between Examples 10 and 11, it was found that when the light-emitting material was an organic light-emitting material, the durability was further significantly improved. That means, it was found that Example 10 had a durability superior to that of Example 11 in which the light-emitting material was quantum dots (inorganic material). Furthermore, from the results of Examples 4 and 10, it was found that even if the light-emitting material was an organic material, the durability was more excellent by the structure represented by general formula (3).

TABLE 2

| | | Example 1 | Example 2 | Example 3 | Example 4 | Example 5 | Example 6 | Example 7 | Example 8 | Example 9 | Comparative Example 1 | Comparative Example 2 |
|---|---|---|---|---|---|---|---|---|---|---|---|---|
| Color conversion composition | Resin | Resin A | Resin B | Resin C | Resin D | Resin E | Resin F | Resin G | Resin H | Resin I | Resin K | Resin L |
| | Green light-emitting material | G-1 | G-1 | G-1 | G-1 | G-1 | G-1 | G-1 | G-1 | G-1 | G-1 | G-1 |
| | Red light-emitting material | R-1 | R-1 | R-1 | R-1 | R-1 | R-1 | R-1 | R-1 | R-1 | R-1 | R-1 |
| Evaluation of color conversion property | Green emission intensity | 5.20 | 5.30 | 5.30 | 5.30 | 5.30 | 5.25 | 5.30 | 5.30 | 5.20 | 1.00 | 1.00 |
| | Red emission intensity | 10.4 | 10.6 | 10.6 | 10.6 | 10.6 | 10.5 | 10.6 | 10.6 | 10.4 | 1.00 | 1.00 |
| Time for decreasing brightness by 10% (h) | | 150 | 250 | 300 | 300 | 300 | 250 | 300 | 300 | 200 | 10 | 10 |
| Color reproduction range | | 110% | 110% | 110% | 110% | 110% | 110% | 110% | 110% | 110% | 80% | 80% |

TABLE 3

| | | Example 10 | Example 11 | Example 12 | Example 13 | Comparative Example 3 | Comparative Example 4 |
|---|---|---|---|---|---|---|---|
| Color conversion composition | Resin | Resin D | Resin D | Resin M | Resin N | Resin J + Resin L | Resin J |
| | Green light-emitting material | G-2 | G-3 | G-1 | G-1 | G-1 | G-2 |
| | Red light-emitting material | R-2 | R-3 | R-1 | R-1 | R-1 | R-2 |
| Evaluation of color conversion property | Green emission intensity | 4.00 | 4.00 | 5.20 | 5.20 | 4.50 | 4.00 |
| | Red emission intensity | 8.00 | 8.00 | 10.4 | 10.4 | 9.00 | 8.00 |
| Time for decreasing brightness by 10% (h) | | 200 | 150 | 200 | 250 | 50 | 100 |
| Color reproduction range | | 90% | 100% | 110% | 110% | 90% | 75% |

DESCRIPTION OF REFERENCE SIGNS

1: Color conversion film
10: Base layer
11: Color conversion layer
12: Barrier film

The invention claimed is:

1. A color conversion composition for converting an incident light into a light having a wavelength longer than of the incident light, which contains the following components (A) and (B):

Component (A): at least one light-emitting material

Component (B): a resin having a partial structure represented by general formula (1) and a partial structure represented by general formula (2) in a molecular structure;

[Formula 1]

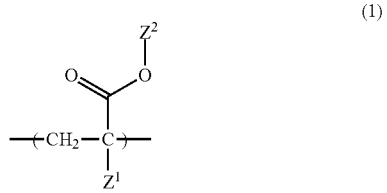

(1)

where $Z^1$ and $Z^2$ may be the same or different, and are hydrogen atom, or an organic group having 1 to 20 carbon atoms;

[Formula 2]

(2)

where $Y^1$ to $Y^4$ may be the same or different, and are hydrogen atom, or an organic group having 1 to 20 carbon atoms, and at least one of $Y^1$ to $Y^4$ is a substituted or unsubstituted alicyclic hydrocarbon group.

2. The color conversion composition according to claim 1, wherein at least one of $Y^1$ to $Y^4$ in general formula (2) is a substituted or unsubstituted cyclohexyl group.

3. The color conversion composition according to claim 1, wherein one group of $Y^1$ to $Y^4$ in general formula (2) is a substituted or unsubstituted cyclohexyl group, and the other three groups are hydrogen atoms.

4. The color conversion composition according to claim 1, wherein $Z^1$ in general formula (1) is a methyl group.

5. The color conversion composition according to claim 1, wherein $Z^2$ in general formula (1) is a methyl group.

6. The color conversion composition according to claim 1, wherein the light-emitting material is an organic light-emitting material.

7. The color conversion composition according to claim 1, wherein the component (A) contains a compound represented by general formula (3):

[Formula 3]

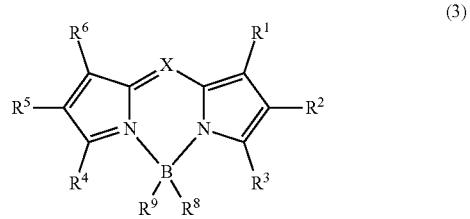

(3)

where X is C—$R^7$ or N, and $R^1$ to $R^9$ may be the same or different, and are selected from hydrogen atom, an alkyl group, a cycloalkyl group, a heterocyclic group, an alkenyl group, a cycloalkenyl group, an alkynyl group, a hydroxyl group, a thiol group, an alkoxy group, an alkylthio group, an aryl ether group, an aryl thioether group, an aryl group, a heteroaryl group, a halogen, a cyano group, an aldehyde group, a carbonyl group, a carboxyl group, an oxycarbonyl group, a carbamoyl group, an amino group, a nitro group, a silyl group, a siloxanyl group, a boryl group, a phosphine oxide group, and a condensed ring and an aliphatic ring formed between the compound and an adjacent substituent.

8. The color conversion composition according to claim 7, wherein, X in general formula (3) is C—$R^7$, and $R^7$ is a group represented by general formula (4):

[Formula 4]

(4)

where r is selected from a group consisting of hydrogen atom, an alkyl group, a cycloalkyl group, a heterocyclic group, an alkenyl group, a cycloalkenyl group, an alkynyl group, a hydroxyl group, a thiol group, an alkoxy group, an alkylthio group, an aryl ether group, an aryl thioether group, an aryl group, a heteroaryl group, a halogen, a cyano group, an aldehyde group, a carbonyl group, a carboxyl group, an oxycarbonyl group, a carbamoyl group, an amino group, a nitro group, a silyl group, a siloxanyl group, a boryl group, and a phosphine oxide group, k represents an integer of 1 to 3, and when k represents 2 or larger, each r may be the same or different.

9. The color conversion composition according to claim 7, wherein $R^1$, $R^3$, $R^4$ and $R^6$ in general formula (3) may be the same or different, and are a substituted or unsubstituted phenyl group.

10. The color conversion composition according to claim 7, wherein $R^1$, $R^3$, $R^4$ and $R^6$ in general formula (3) may be the same or different, and are a substituted or unsubstituted alkyl group.

11. The color conversion composition according to claim 1, wherein the component (A) contains a light-emitting material which emits a light having a peak wavelength observed in a region of 500 nm to 580 nm by using an excitation light having a wavelength in a range of 400 nm to 500 nm.

12. The color conversion composition according to claim 1, wherein the component (A) contains the following light-emitting materials (a) and (b):
- (a) light-emitting material which emits a light having a peak wavelength observed in a region of 500 nm to 580 nm by using an excitation light having a wavelength in a range of 400 nm to 500 nm
- (b) light-emitting material which emits a light having a peak wavelength observed in a region of 580 nm to 750 nm when excited by any one or both of an excitation light having a wavelength in a range of 400 nm to 500 nm, and the light emitted from the light-emitting material (a).

13. The color conversion composition according to claim 11, wherein the light-emitting material which emits the light having the peak wavelength at 500 nm to 580 nm by using the excitation light having the wavelength in the range of 400 nm to 500 nm is the compound represented by general formula (3).

14. The color conversion composition according to claim 12, wherein the light-emitting material (b) is the compound represented by general formula (3).

15. A color conversion film comprising a layer of the color conversion composition according to claim 1, or a cured layer of the color conversion composition.

16. A light source unit comprising a light source and the color conversion film according to claim 15.

17. The light source unit according to claim 16, wherein the light source is a light-emitting diode having a maximum emission wavelength in a range of 400 nm to 500 nm.

18. A display comprising the light source unit according to claim 16.

19. A lighting comprising the light source unit according to claim 16.

* * * * *